(12) United States Patent
Fox et al.

(10) Patent No.: US 9,761,785 B2
(45) Date of Patent: Sep. 12, 2017

(54) STYLO-EPITAXIAL PIEZOELECTRIC AND FERROELECTRIC DEVICES AND METHOD OF MANUFACTURING

(71) Applicant: U.S. Army Research Laboratory ATTN: RDRL-LOC-I, Washington, DC (US)

(72) Inventors: Glen R Fox, Colorado Springs, CO (US); Ronald G. Polcawich, Derwood, MD (US); Daniel M Potrepka, Silver Spring, MD (US); Luz M Sanchez, Laurel, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 255 days.

(21) Appl. No.: 14/219,028

(22) Filed: Mar. 19, 2014

(65) Prior Publication Data
US 2014/0265734 A1 Sep. 18, 2014

Related U.S. Application Data

(63) Continuation-in-part of application No. 13/436,349, filed on Mar. 30, 2012, now abandoned.
(Continued)

(51) Int. Cl.
*H01L 41/08* (2006.01)
*H01L 41/319* (2013.01)
(Continued)

(52) U.S. Cl.
CPC ............ *H01L 41/081* (2013.01); *C30B 29/32* (2013.01); *H01L 41/0815* (2013.01);
(Continued)

(58) Field of Classification Search
CPC .............. H01L 41/081; H01L 41/0815; H01L 41/1876; H01L 41/08; H01L 41/319; B81C 1/00
(Continued)

(56) References Cited

U.S. PATENT DOCUMENTS 6,599,757 B1 7/2003 Murai
6,682,772 B1 1/2004 Fox et al.
(Continued)

OTHER PUBLICATIONS

Muralt, P., "Texture control of PbTiO3 and Pb(Zr,Ti)O3 thin films with TiO2 seeding", Journal of Applied Physics, vol. 83, No. 7 (Apr. 1, 1998) p. 3835.
(Continued)

*Primary Examiner* — Thomas Dougherty
*Assistant Examiner* — Karen B Addison
(74) *Attorney, Agent, or Firm* — Lawrence E. Anderson

(57) ABSTRACT

A ferroelectric device comprising a substrate; a textured layer; a first electrode comprising a thin layer of metallic material having a crystal lattice structure divided into granular regions; a seed layer; the seed layer being epitaxially deposited so as to form a column-like structure on top of the granular regions of the first electrode; at least one ferroelectric material layer exhibiting spontaneous polarization epitaxially deposited on the seed layer; the ferroelectric material layer, the seed layer, and first electrode each having granular regions in which column-like structures produce a high degree of polarization normal to the growth plane and a method of making.

22 Claims, 63 Drawing Sheets

Related U.S. Application Data

(60) Provisional application No. 61/547,990, filed on Oct. 17, 2011, provisional application No. 61/547,879, filed on Oct. 17, 2011.

(51) Int. Cl.
*H01L 41/187* (2006.01)
*H01L 41/316* (2013.01)
*C30B 29/32* (2006.01)
*C30B 23/02* (2006.01)
*C30B 25/18* (2006.01)
*C23C 18/12* (2006.01)

(52) U.S. Cl.
CPC ...... *H01L 41/1875* (2013.01); *H01L 41/1876* (2013.01); *H01L 41/316* (2013.01); *H01L 41/319* (2013.01); *C23C 18/1216* (2013.01); *C23C 18/1291* (2013.01); *C23C 18/1295* (2013.01); *C30B 23/025* (2013.01); *C30B 25/183* (2013.01)

(58) Field of Classification Search
USPC ........ 310/357, 359, 360, 366, 365, 363, 364
See application file for complete search history.

(56) References Cited

U.S. PATENT DOCUMENTS

| | | | |
|---|---|---|---|
| 6,822,302 B2 | 11/2004 | Higuchi et al. | |
| 6,841,817 B2 | 1/2005 | Kurasawa et al. | |
| 6,887,716 B2 | 5/2005 | Fox | |
| 6,889,920 B2 | 5/2005 | Nance et al. | |
| 6,943,485 B2 | 9/2005 | Sumi | |
| 6,969,157 B2 | 11/2005 | Tomozawa et al. | |
| 7,120,978 B2 | 10/2006 | Wasa et al. | |
| 7,153,705 B2 | 12/2006 | Maruyama et al. | |
| 7,166,954 B2 | 1/2007 | Miyazawa et al. | |
| 7,185,540 B2 | 3/2007 | Torii et al. | |
| 7,193,756 B2 | 3/2007 | Murata et al. | |
| 7,196,457 B2 | 3/2007 | Miyazawa et al. | |
| 7,197,799 B2 | 4/2007 | Higuchi et al. | |
| 7,214,977 B2 | 5/2007 | Kijima et al. | |
| 7,215,067 B2 | 5/2007 | Ifuku et al. | |
| 7,229,662 B2 | 6/2007 | Wang et al. | |
| 7,240,409 B2 | 7/2007 | Sumi et al. | |
| 7,247,551 B2 | 7/2007 | Higuchi et al. | |
| 7,247,975 B2 | 7/2007 | Tochi et al. | |
| 7,254,877 B2 | 8/2007 | Murai | |
| 7,262,544 B2 | 8/2007 | Aoki et al. | |
| 7,265,483 B2 | 9/2007 | Takeda et al. | |
| 7,268,472 B2 | 9/2007 | Higuchi et al. | |
| 7,279,823 B2 | 10/2007 | Higuchi et al. | |
| 7,279,825 B2 | 10/2007 | Ifuku et al. | |
| 7,287,840 B2 | 10/2007 | Miyazawa et al. | |
| 7,291,308 B2* | 11/2007 | Wu ........................ | A61B 1/123 422/28 |
| 7,291,520 B2 | 11/2007 | Murai | |
| 7,291,530 B2* | 11/2007 | Nakagawa et al. ........... | 438/238 |
| 7,291,959 B2 | 11/2007 | Miyazawa et al. | |
| 7,291,960 B2 | 11/2007 | Iwashita et al. | |
| 7,298,018 B2 | 11/2007 | Ezhilvalavan et al. | |
| 7,303,828 B2 | 12/2007 | Kijima et al. | |
| 7,309,950 B1 | 12/2007 | Aoki et al. | |
| 7,310,862 B2 | 12/2007 | Higuchi et al. | |
| 7,312,558 B2 | 12/2007 | Fujii et al. | |
| 7,320,163 B2 | 1/2008 | Xin-Shan et al. | |
| 7,328,490 B2 | 2/2008 | Murai et al. | |
| 7,339,219 B2 | 3/2008 | Kondo et al. | |
| 7,343,654 B2 | 3/2008 | Xin-Shan | |
| 7,348,715 B2 | 3/2008 | Torii et al. | |
| 7,350,904 B2 | 4/2008 | Noguchi et al. | |
| 7,368,172 B2 | 5/2008 | Kondo et al. | |
| 7,423,308 B2* | 9/2008 | Kurasawa ........ | H01L 27/11502 257/295 |
| 7,427,515 B2 | 9/2008 | Kondo et al. | |
| 7,446,361 B2 | 11/2008 | Maruyama | |
| 7,478,558 B2 | 1/2009 | Fujii et al. | |
| 7,513,608 B2 | 4/2009 | Aoto et al. | |
| 7,521,845 B2 | 4/2009 | Ifuku et al. | |
| 7,535,157 B2 | 5/2009 | Saito | |
| 7,547,933 B2 | 6/2009 | Takamatsu et al. | |
| 7,562,968 B2 | 7/2009 | Sumi et al. | |
| 7,568,792 B2 | 8/2009 | Takabe et al. | |
| 7,579,041 B2 | 8/2009 | Kuriki et al. | |
| 7,589,450 B2 | 9/2009 | Takabe et al. | |
| 7,608,981 B2 | 10/2009 | Unno et al. | |
| 7,614,128 B2 | 11/2009 | Kamei | |
| 7,618,131 B2 | 11/2009 | Wasa et al. | |
| 7,622,850 B2 | 11/2009 | Iwashita et al. | |
| 7,622,852 B2 | 11/2009 | Ifuku et al. | |
| 7,646,073 B2 | 1/2010 | Hamada | |
| 7,651,199 B2 | 1/2010 | Takabe et al. | |
| 7,652,408 B2 | 1/2010 | Fujii | |
| 7,708,289 B2 | 5/2010 | Jaime, Sr. | |
| 7,712,878 B2 | 5/2010 | Takabe et al. | |
| 7,717,546 B2 | 5/2010 | Noguchi et al. | |
| 7,725,996 B2 | 6/2010 | Li et al. | |
| 7,766,464 B2 | 8/2010 | Noguchi et al. | |
| 7,768,050 B2 | 8/2010 | Rappe et al. | |
| 7,768,178 B2 | 8/2010 | Fujii et al. | |
| 7,785,659 B2 | 8/2010 | Nihei | |
| 7,786,656 B2 | 8/2010 | Sakashita et al. | |
| 7,804,231 B2 | 9/2010 | Ifuku et al. | |
| 7,810,915 B2 | 10/2010 | Takabe et al. | |
| 7,816,842 B2 | 10/2010 | Naono et al. | |
| 7,819,508 B2 | 10/2010 | Kuriki et al. | |
| 7,827,658 B2 | 11/2010 | Li | |
| 7,830,073 B2 | 11/2010 | Sakashita | |
| 7,837,305 B2 | 11/2010 | Hara | |
| 7,956,369 B2 | 6/2011 | Reed et al. | |
| 2010/0006780 A1 | 1/2010 | Metcalfe et al. | |
| 2010/0133959 A1* | 6/2010 | Yamazaki et al. ............ | 310/365 |
| 2010/0231095 A1* | 9/2010 | Kubota .................. | C04B 35/01 310/357 |

OTHER PUBLICATIONS

Nicolas Ledermann, et al. "{1 0 0}-Textured, piezoelectric Pb(Zrx, Ti1-x)O3 thin films for MEMS:integration, deposition and properties," Sensors and Actuators A 105 (2003) 162-170.

Hiboux, H., et al. "Mixed titania-lead oxide seed layers for PZT growth on Pt(111):a study on nucleation, texture and properties," Journal of the European Ceramic Society 24 (2004) 1593-1596.

F. Tyholdt, et al. "Chemically derived seeding layer for {100}-textured PZT thin films," J Electroceram (2007) 19:311-314 DOI 10.1007/s10832-007-9037-2.

Dubois, et al., "Which PZT Thin Films for Piezoelectric Microactuator Applications?" Integrated Ferroelectrics vol. 22 . pp. 535-543 (1998).

Taylor, D., et al., "Piezoelectric properties of rhombohedral Pb(Zr,Ti)O3 thin films with (100), (111), and "random" crystallographic orientation," Appl. Phys. Lett. 76, 1615 (2000); doi: 10.1063/1.126113.

Maeder, T., "Pb(Zr,Ti))3 Thin Films by In-situ Reactive Sputtering on Micromachined Membranes for Micromechanical Applications," British Ceramic Proceedings, Issue 54, 1996, pp. 206-218.

Matsumoto, T., "Development of Pt/MgO(100) Buffer Layers for Orientation Control of Perovskite Oxide Thin Films," Japanese Journal of Applied Physics vol. 47, No. 9, 2008, pp. 7565-7569.

P. Muralt. "Texture Control and Seeded Nucleation of Nanosize Structures of Ferroelectric Thin Films," J. Appl. Phys. 100, 051605 (2006).

Hiboux, S, et al., "Orientation and Composition Dependence of Piezoelectric Dielectric Properties of Sputtered Pb(Zr x, Ti (1-x))O3 Thin Films," Materials Research Society, Met. Res. Soc. Symp. Proc. (2000) p. 499.

Seifert, A. , et al. "Processing Optimization of Solution Derived PbZr(1-x)Ti(x)O3 Thin Films for Piezoelectric Applications," Integrated Ferroelectrics, (2001) vol. 35, pp. 159-166.

(56) References Cited

OTHER PUBLICATIONS

Hiboux, S, et al., Piezoelectric and Dielectric Properties of Sputter Deposited (111), (100) and Random Textured Pb(Zrx, Ti (1-x))3 (PZT) thin films, Ferroelectrics 224 (1999) pp. 315-322.

Muralt, P., et al., "Fabrication and characterization of PZT thin-film vibrators for micromotors," Sensors and Actuators A 48 (1995) p. 157.

Troiler-McKinstrey et al.,"Thin Film Piezoelectrics for MEMS" Journal of Electroceramics, 12, 7-17, (2004).

Sanchez, Luz, el al. "Improving PZT Thin Film Texture Through Improved Pt Metallization and Seed Layers" poster exhibited at University of Maryland ResearchFest poster exhibition, Feb. 18, 2010.

Sanchez, Luz, et al. "Improving PZT Thin Film Texture Through Improved Pt Metallization and Seed Layers" Abstract submitted to University of Maryland Feb. 16, 2010. Available on line; date unknown.

Troiler-McKinstrey et al., "Improved Thin Film Piezoelectrics for Actuator Applications" The Pennsylvania State University, Office of Sponsored Programs, 110 Report Number Technology Center Building, University Park, PA 16802 Final process rept. Apr. 1-Dec. 31, 2007.

Muralt, et al., "Piezoelectric Thin Films for Sensors, Actuators, and Energy Harvesting" : MRS Bulletin vol. 34 Issue: 9 pp. 658-664 DOI:10.1557/mrs2009.177 Published: Sep. 2009.

M.D. Vaudin, et al., "Accuracy and Reproducibility of X-ray Texture Measurements on Thin Films," Mat Res. Soc. Symp. Proc., vol. 721, entitled "Magnetic and Electronic Films—Microstructure, Texture and Application to Data Storage," edited by P.W. DeHaven et al. (Mat. Res. Soc., Warrendale PA, 2002) pp. 17-22.

F.K. Lotgering, "Topotactical reactions with ferrimagnetic oxides having hexagonal crystal structures—I" Philips Research Laboratories, N. V. Philips' Gloeilampenfabrieken, Eindhoven, Netherlands, Journal of Inorganic and Nuclear Chemistry vol. 9, Issue 2, Feb. 1959, pp. 113-123.

K.D. Budd, S.K. Dey, & D.A. Payne. "Sol-Gel Processing of PbTi03, PbZr03, PZT, and PLZT Thin Films." Electrical Ceramics, Br. Ceram. Proc., 107-121, (1985).

Q.Q. Zhang, et al. "Lead zirconate titanate films for d33 mode cantilever actuators,"Sensors and Actuators A 105 (2003) 91-97.

Hiratani, M., "Ultra-thin Titanium oxide Film with a Rutile-type Structure," Appl. Surf. Science 207, pp. 13-19 (2003).

R. Burmistrova et. al., Effect of Lead Content on the Microstructure and Electrical Properties of Sol-Gel PZT Thin Films' Ferroelectrics, vol. 271, Issue 1, 2002.

Fox, G., et al., "Model Relating Thin Film PZT Crystallographic Texture to Ferroelectric Switching Performance,"Materials Research Society, Mat. Res. Soc. Symp. Proc. vol. 721 2 Page. 16.1.1-16.1.6 (2002).

T. Maeder, et al, "Stabilized Pt Electrodes for Ferroelectric Film Deposition Using Ti, Ta, and Zr Adhesion Layers," Japan. J. Appl. Phys., 37, 2007 (1998).

Willliams, G., et al., "Nucleation and Orientation of SOL-GEL PZT Films on PT Electronics," Integrated Ferroelectroinics, vol. 15, pp. 19-28 (1997).

Sanchez, L.M. et al., Improving PZT Thin Film Texture Through Pt Metallization and Seed Layers MRS Proceedings, 1299, mrsf10-1299-s04-09 doi:10.1557/opl.2011.254, approximate publication date Nov. 18, 2010.

Potrepka, et. al., "Pt/TiO2 Growth Templates for Enhances Enhanced PZT Films and MEMS Devices," MRS Proceedings Session S, (mrsf10-1299-s02-04),vol. 1299, (2010).

\* cited by examiner

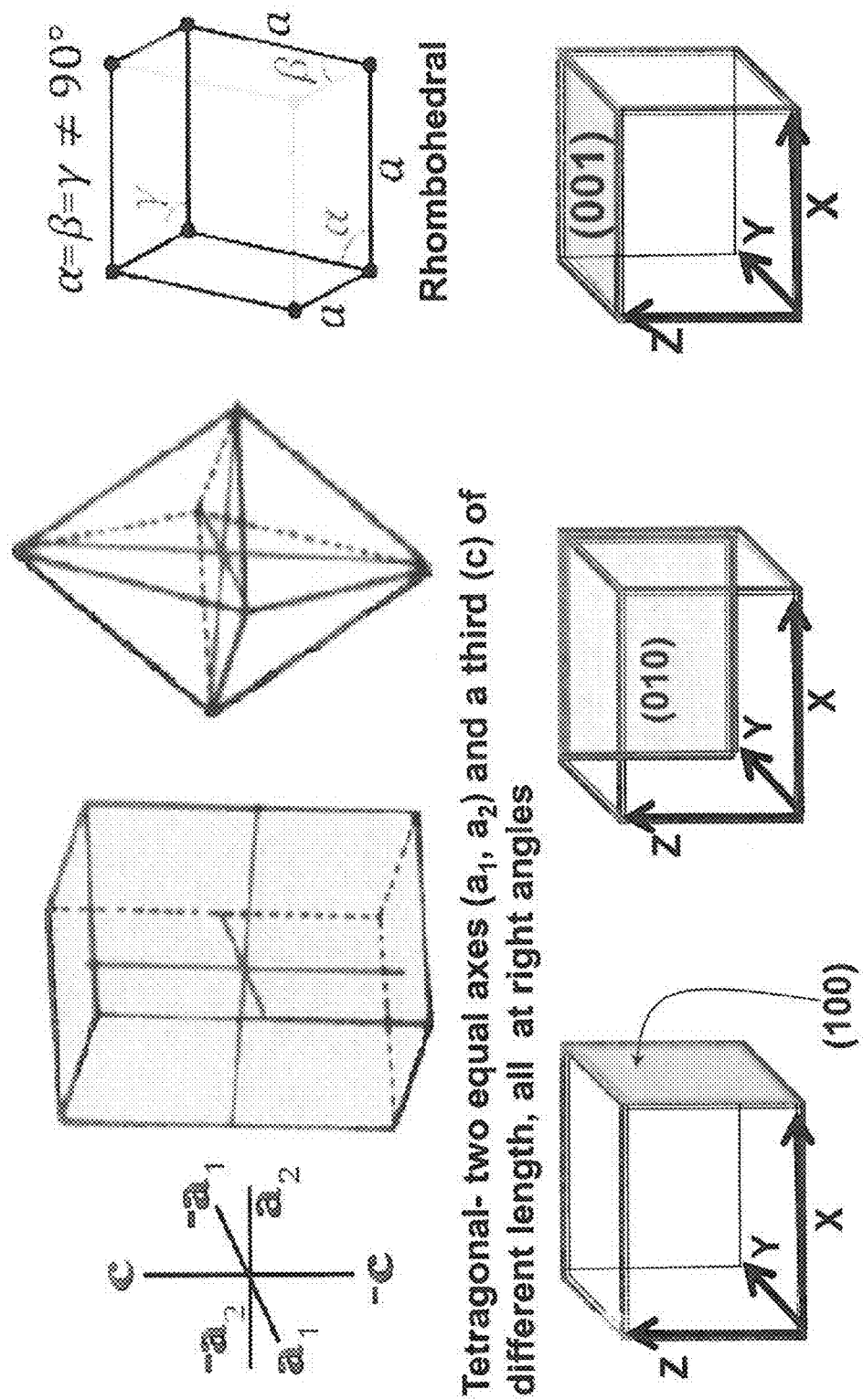
Figure 2  ORIENTATIONS AND CRYSTAL STRUCTURES

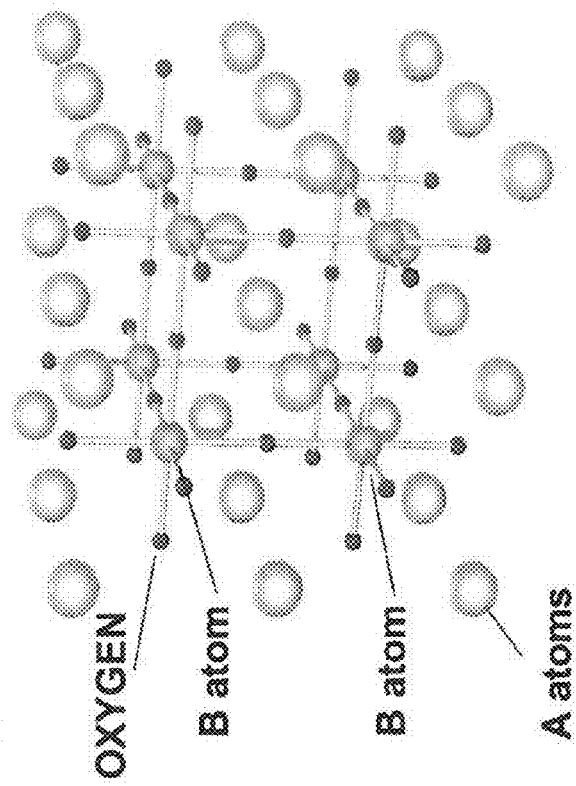
FIG. 4
Perovskite Crystal structure
XIIA2+VIB4+X2-3
with the oxygen in the face centers.
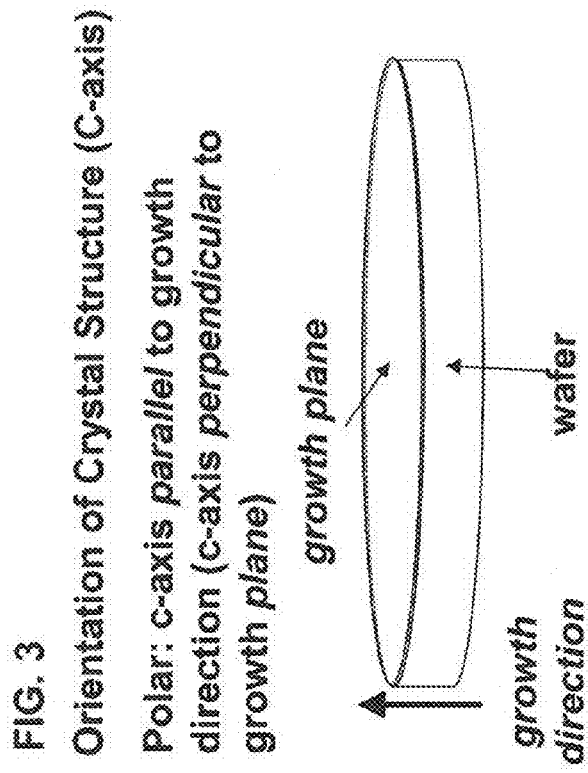
FIG. 3
Orientation of Crystal Structure (C-axis)
Polar: c-axis *parallel* to growth direction (c-axis *perpendicular* to growth *plane*)
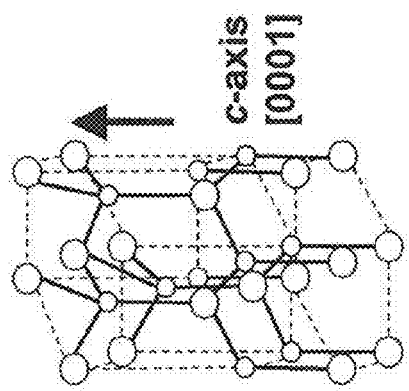

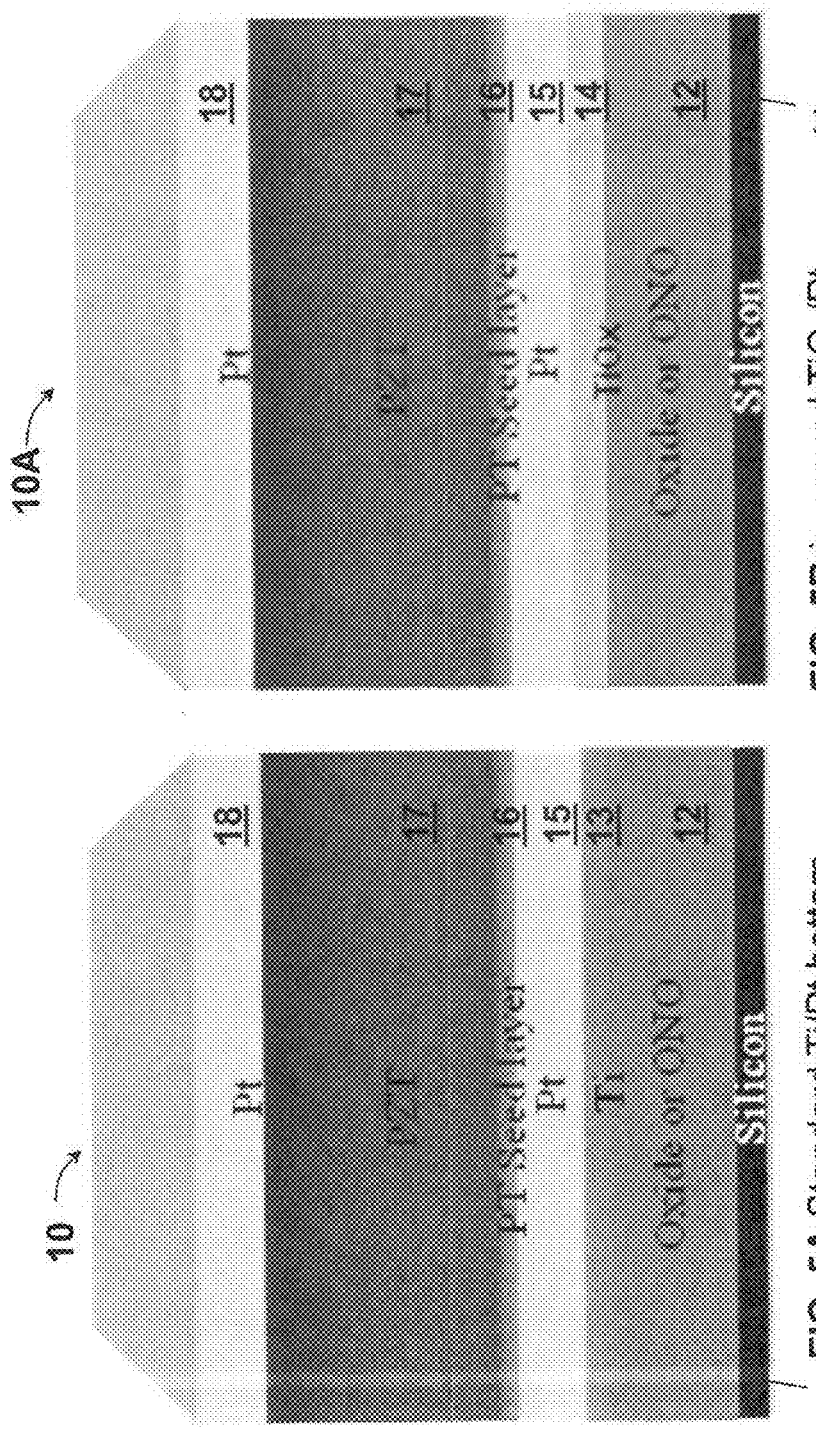
FIG. 5A Standard Ti/Pt bottom electrode
FIG. 5B improved TiO₂/Pt bottom electrode.
Wafer stacks showing the different layers

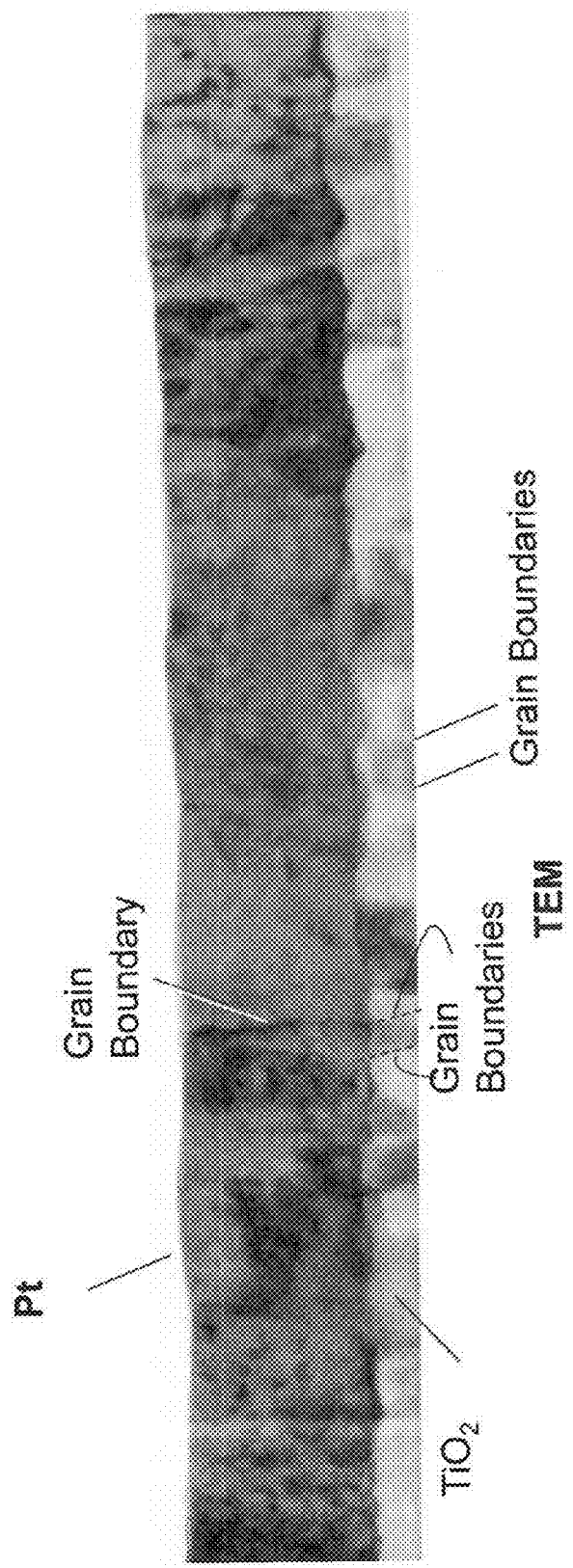

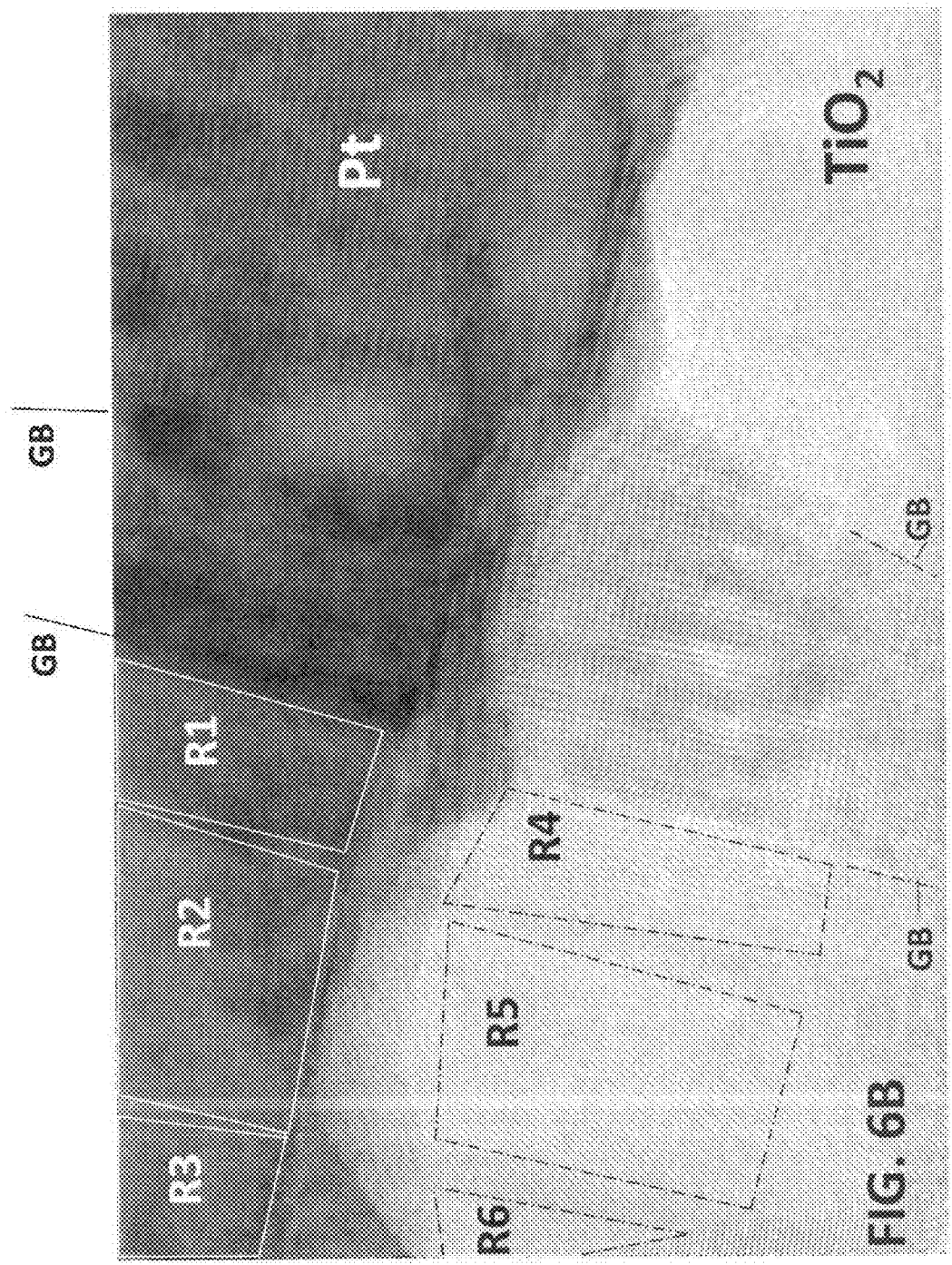

Diffraction Pattern showing orientation of crystal

Indentation at Grain Boundary

Grain / Grain / Grain — PbTiO₃, Pt, PZT layers, PbZrO film, Indentation at Grain Boundary Selected Area Electron Diffraction from one columnar grain of the film

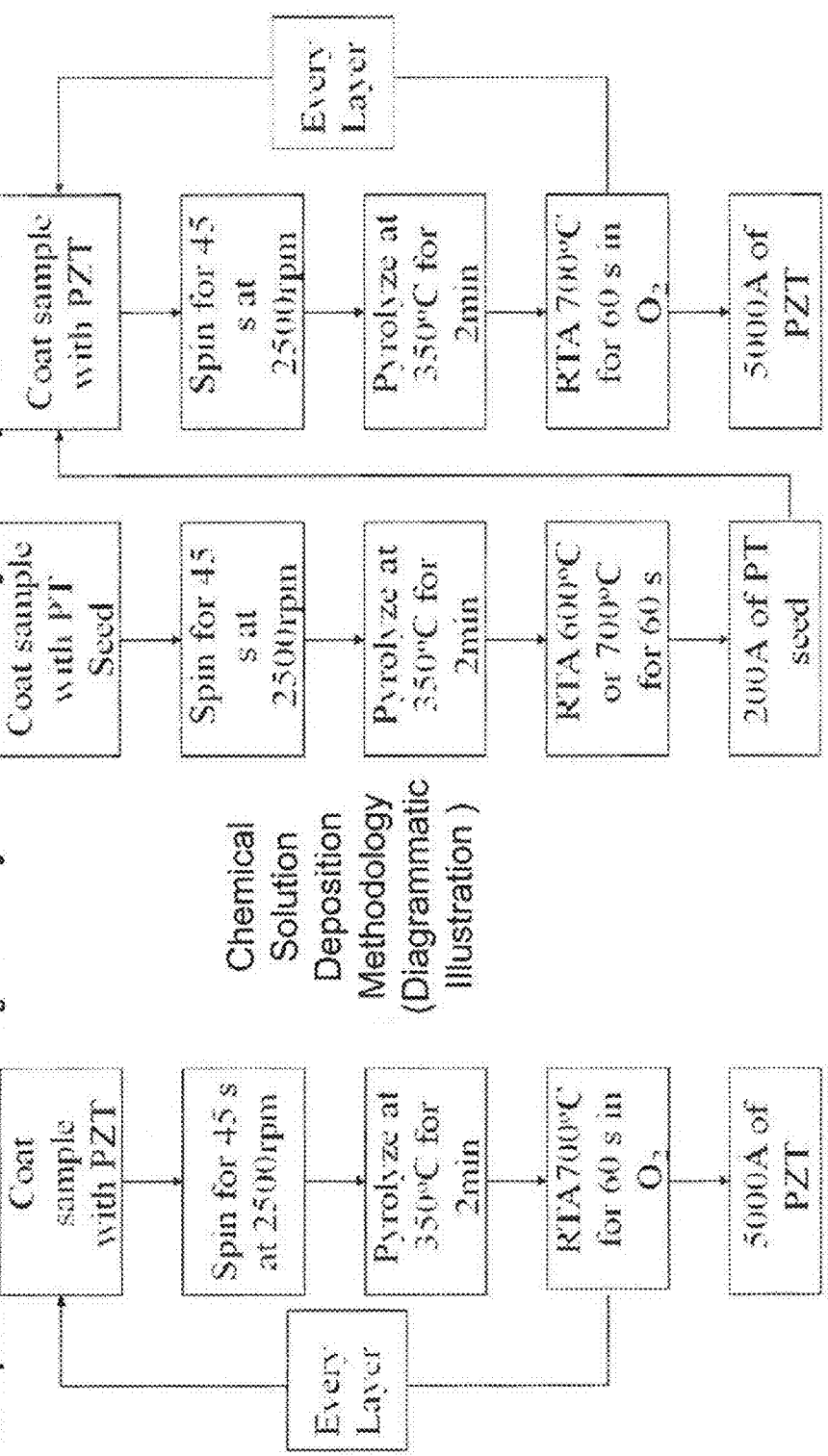
Figure 7A. The chemical solution deposition process for control samples without a PbTiO₃ seed layer
Figure 7B. The chemical solution deposition process for test samples with the PbTiO₃ seed layer.

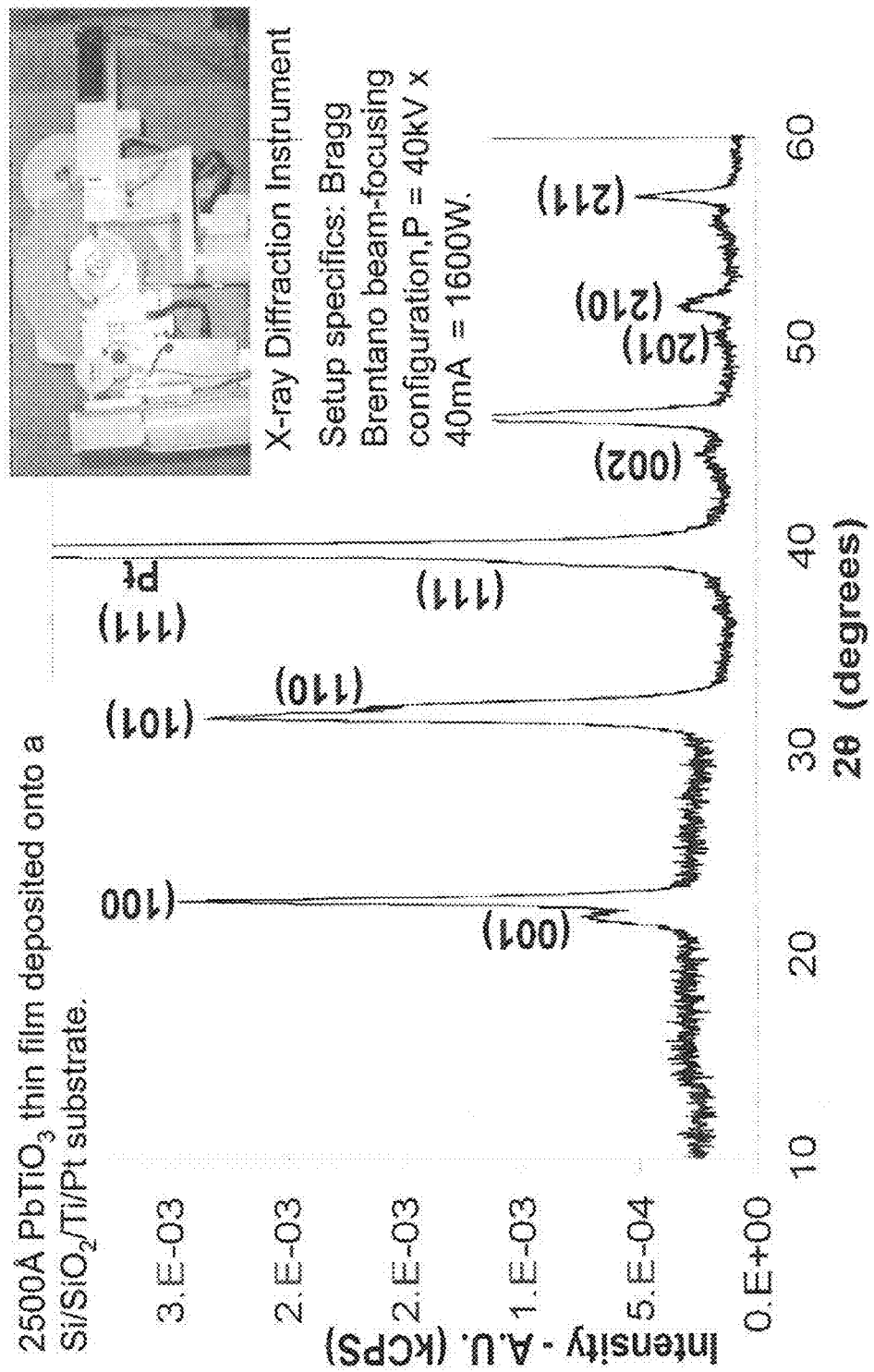
FIG. 8A  X-ray diffraction data

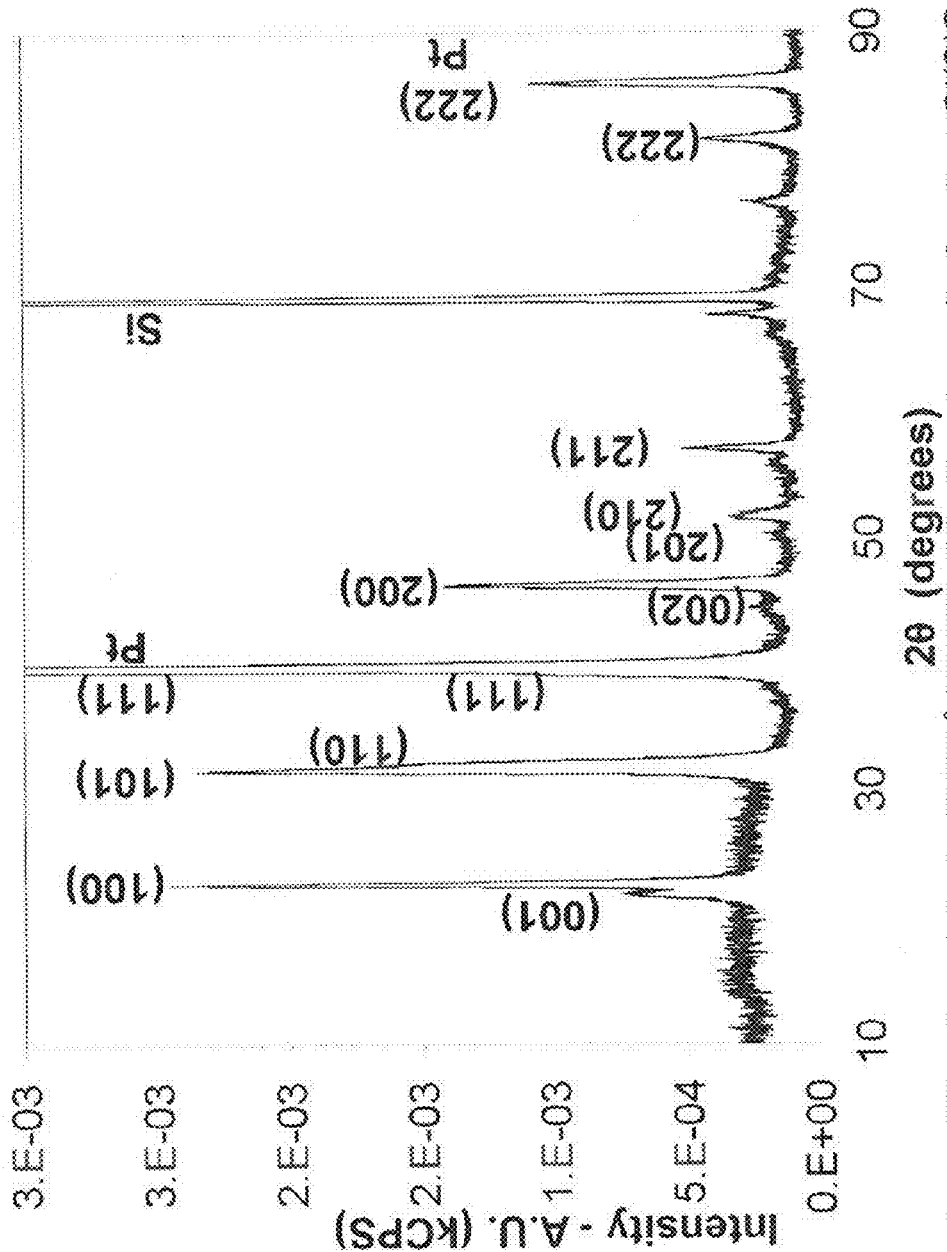
FIG. 8B X-ray diffraction data for 2500Å PbTiO$_3$ thin film deposited onto a Si/SiO$_2$/Ti/Pt substrate. (001) oriented crystals were confirmed.

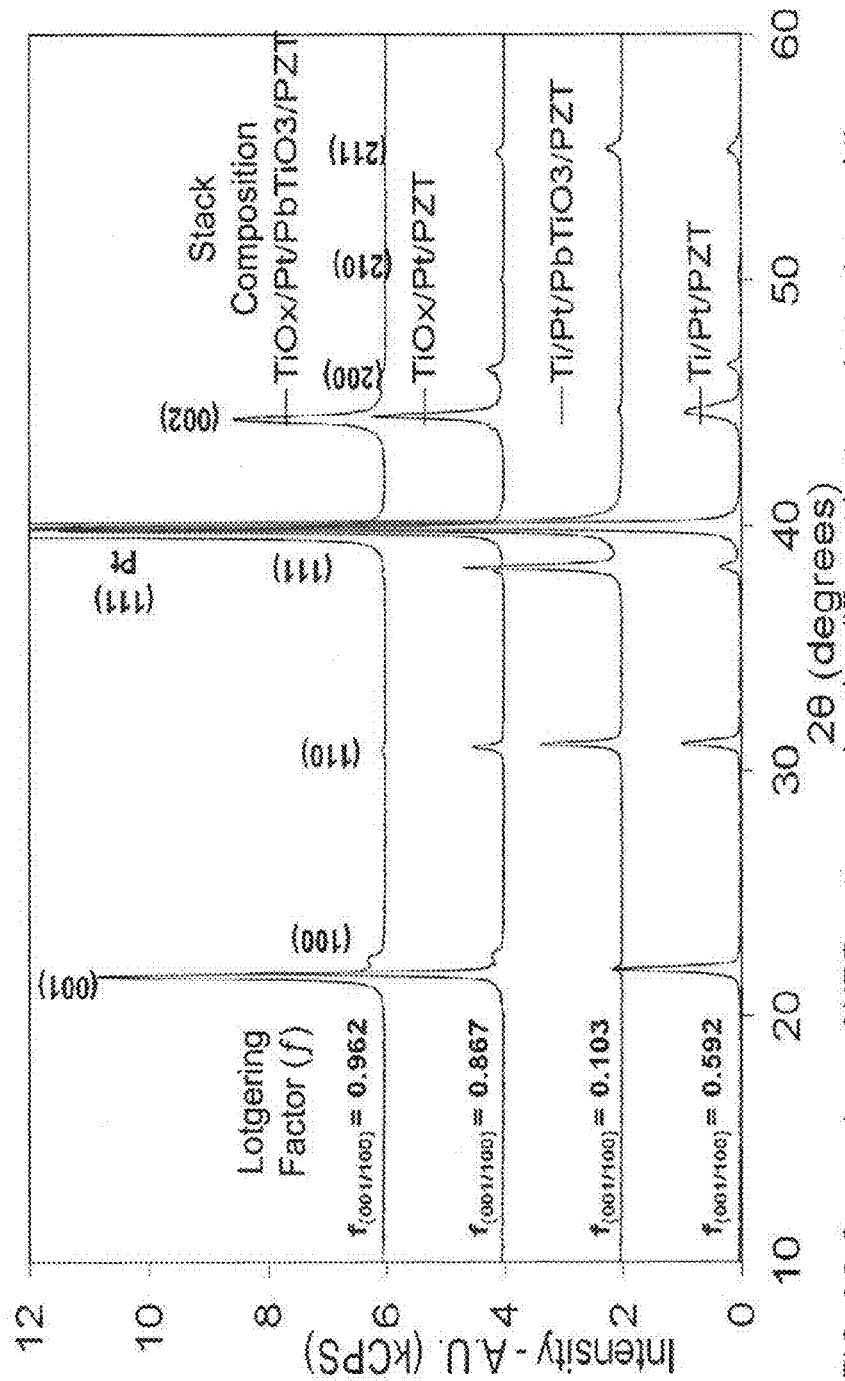
FIG. 9C Comparison of XRD patterns using the different bottom electrodes and the use of $PbTiO_3$. $TiO_2/Pt$ is stylo-epitaxial not just textured.

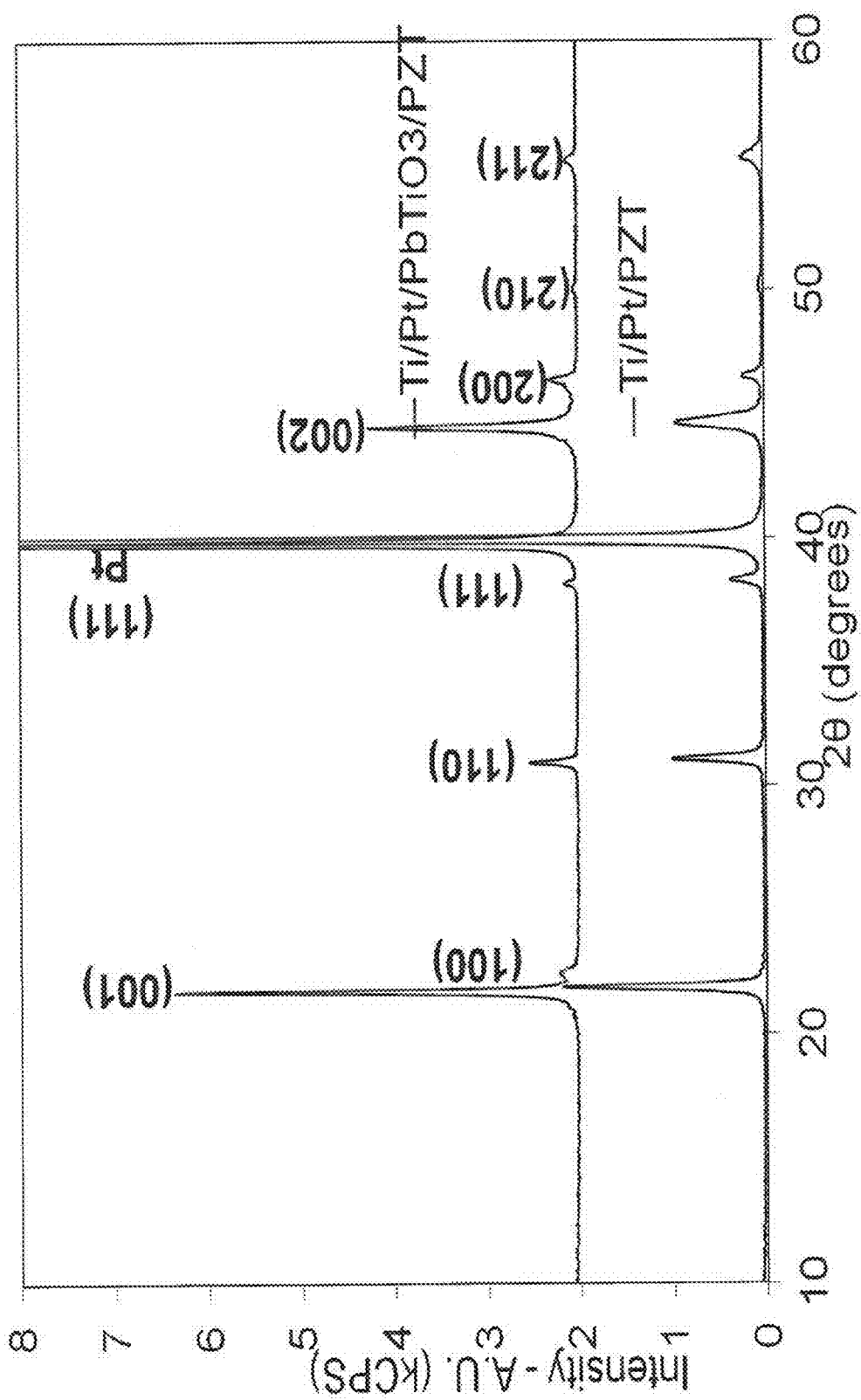
FIG. 10A XRD of samples with and without the PbTiO₃ seed layer.

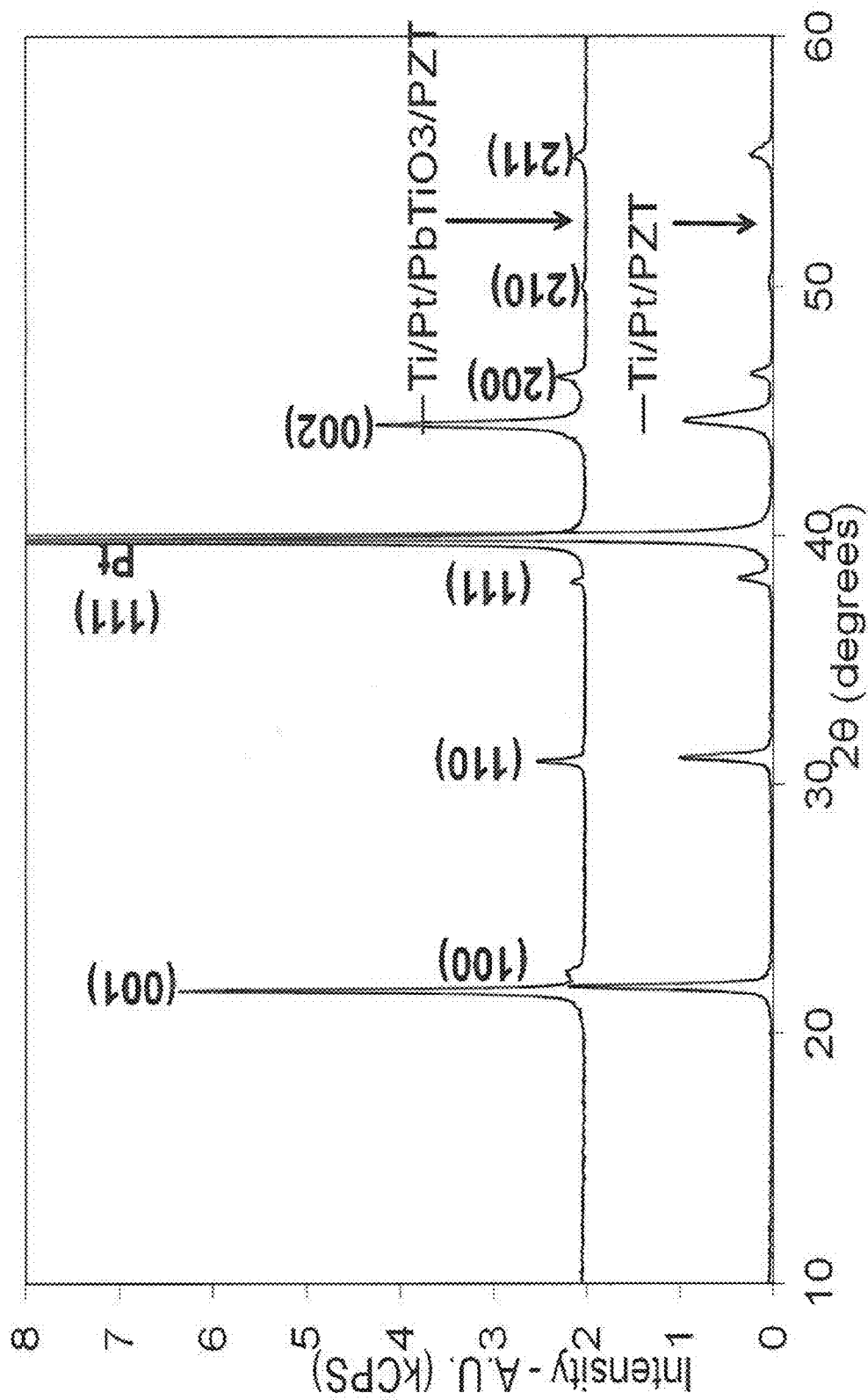
FIG. 10B  XRD of samples with and without the PbTiO$_3$ seed layer.

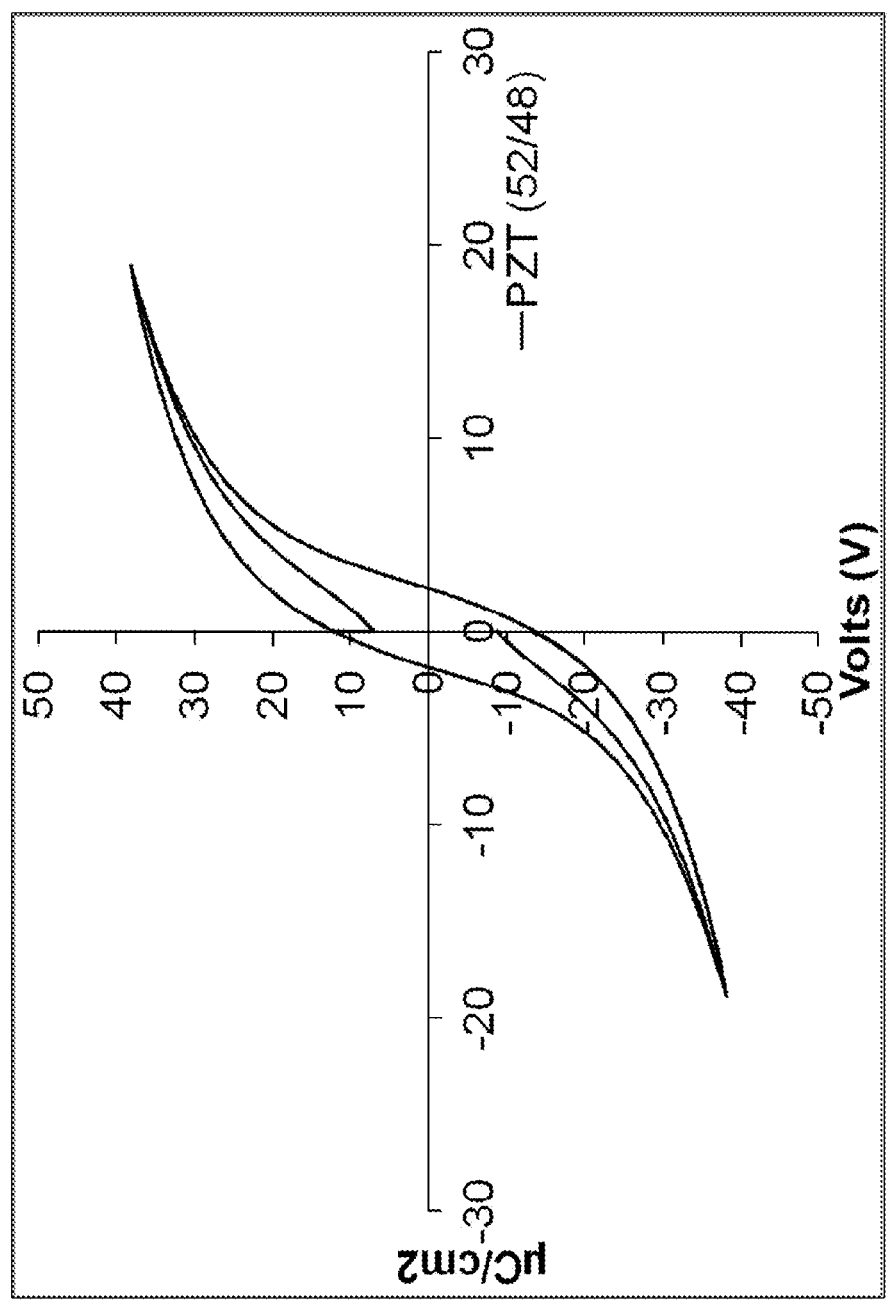
FIG. 11A  Comparison of the control sample without PbTiO₃ to the samples with PbTiO₃ with and without acetic acid, RTA-ed at 600°C.

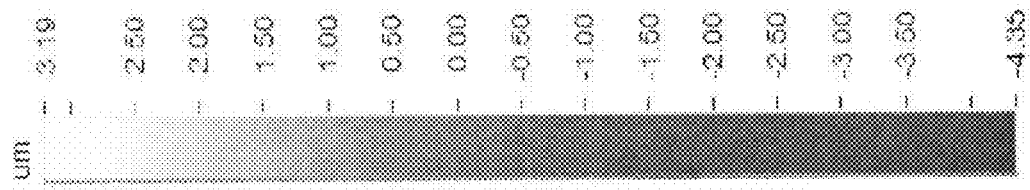
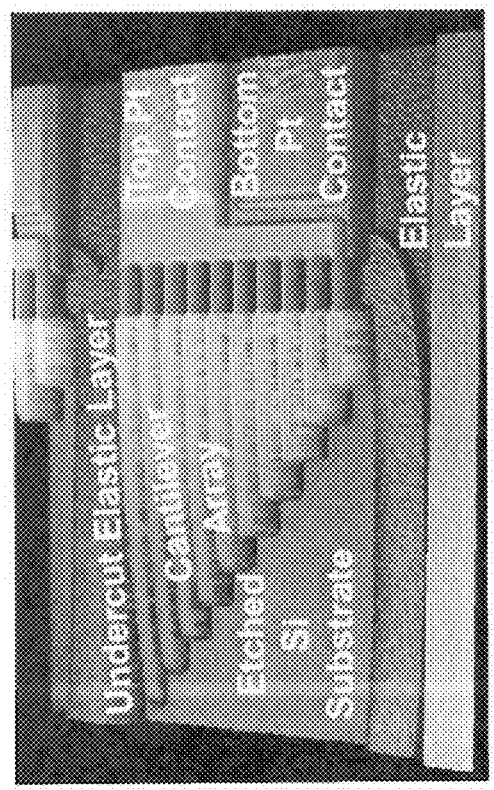
FIG. 12A PZT(45/55) control sample on Ti/Pt electrode
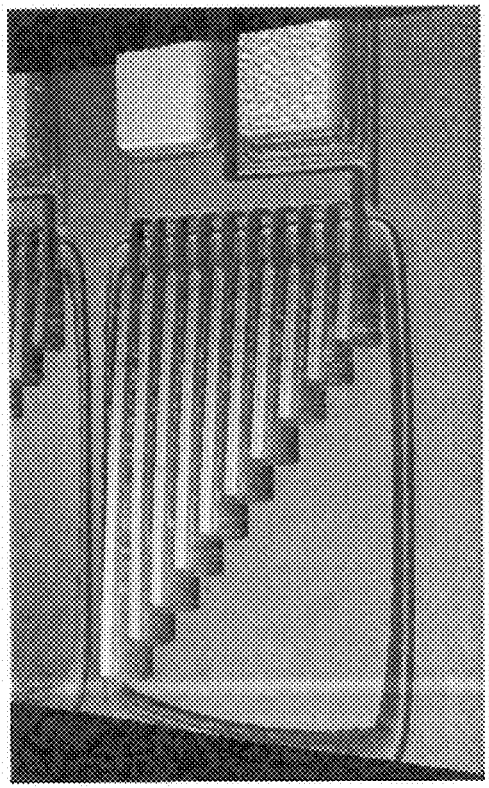
FIG. 12B PZT(52/48) with PT seed on Ti/Pt electrode.

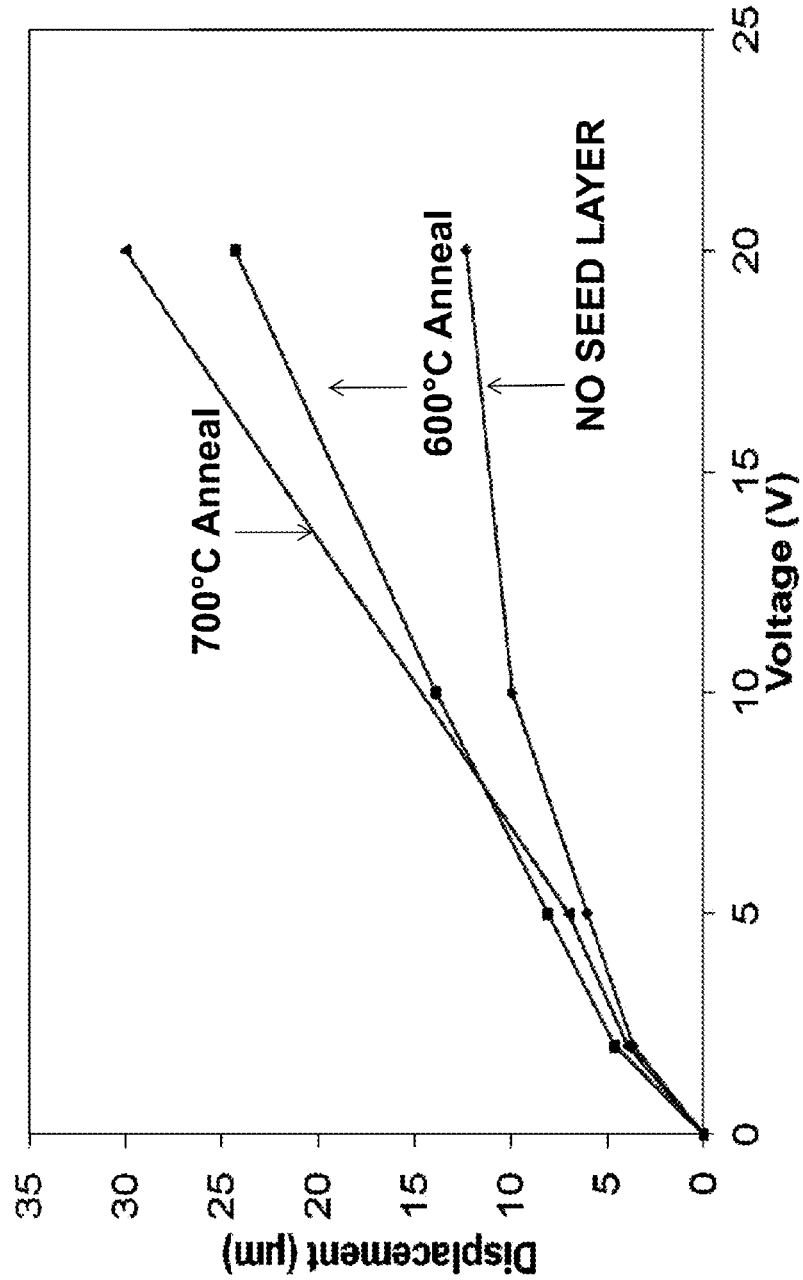
FIG. 13 Cantilever displacements at Varying Seed Layer Annealing Temperature of seed layer. Also shows the effect of the PbTiO$_3$ seed layer on PZT (52/48) compared to without the seed layer in PZT (52/48).

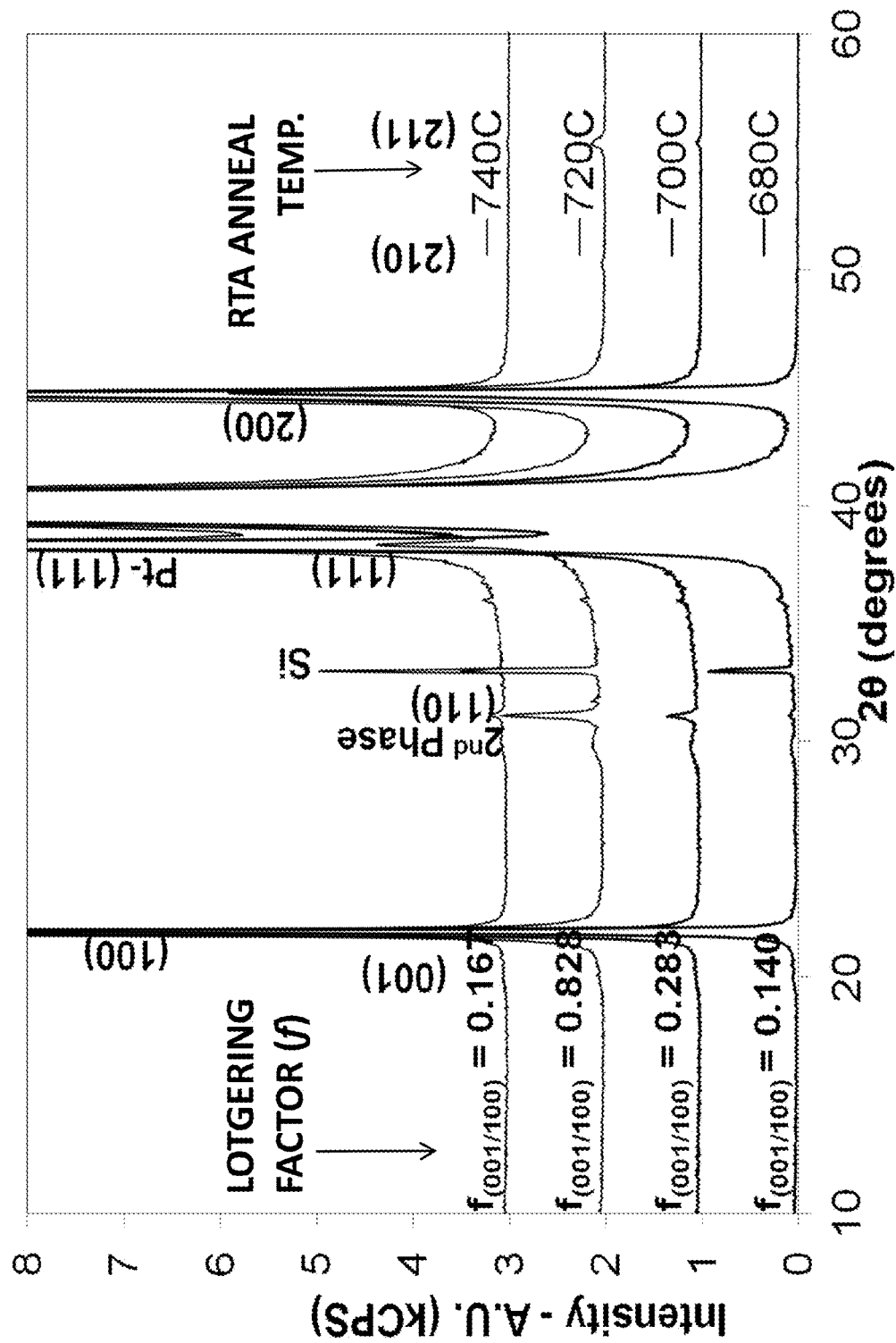
FIG. 14A XRD of Ti/Pt/PZT (52/48) with varying final RTA Temperatures.

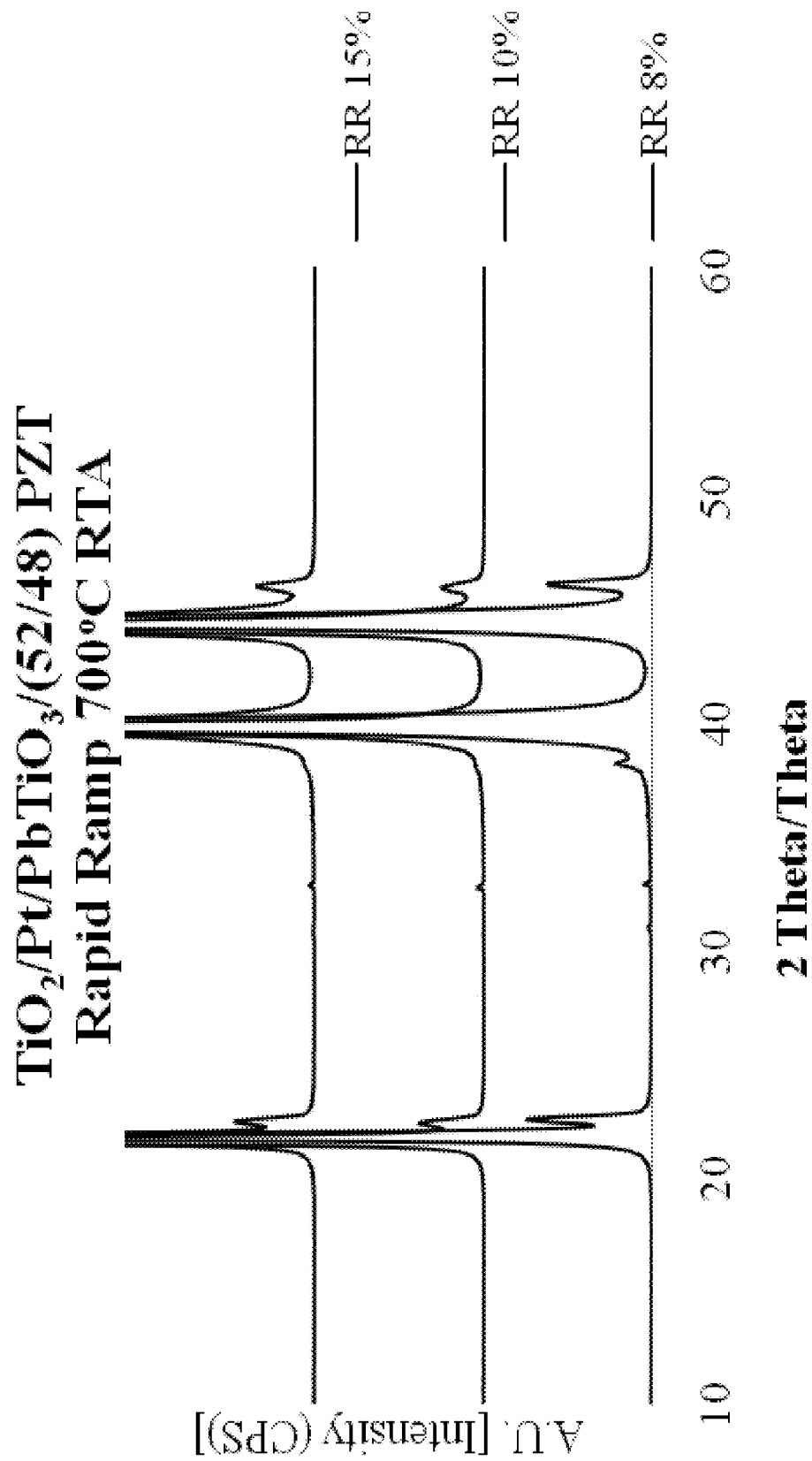
FIG. 14B XRD patterns of PZT (52/48) with PbTiO$_3$ seed layer and the optimized bottom electrode.

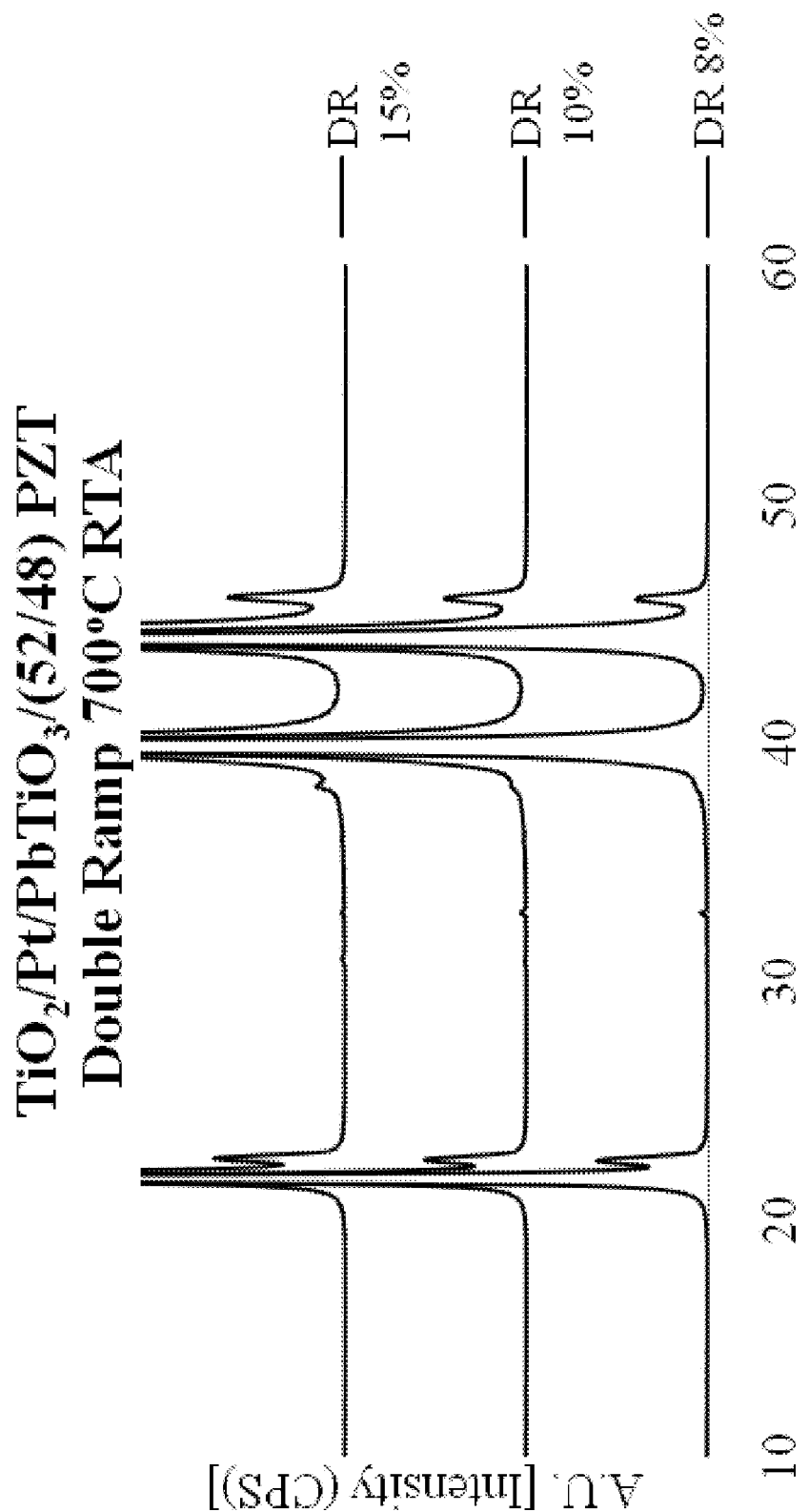
FIG. 14C Double Ramp XRD patterns of PZT (52/48) with PbTiO$_3$ seed layer and the optimized bottom electrode.

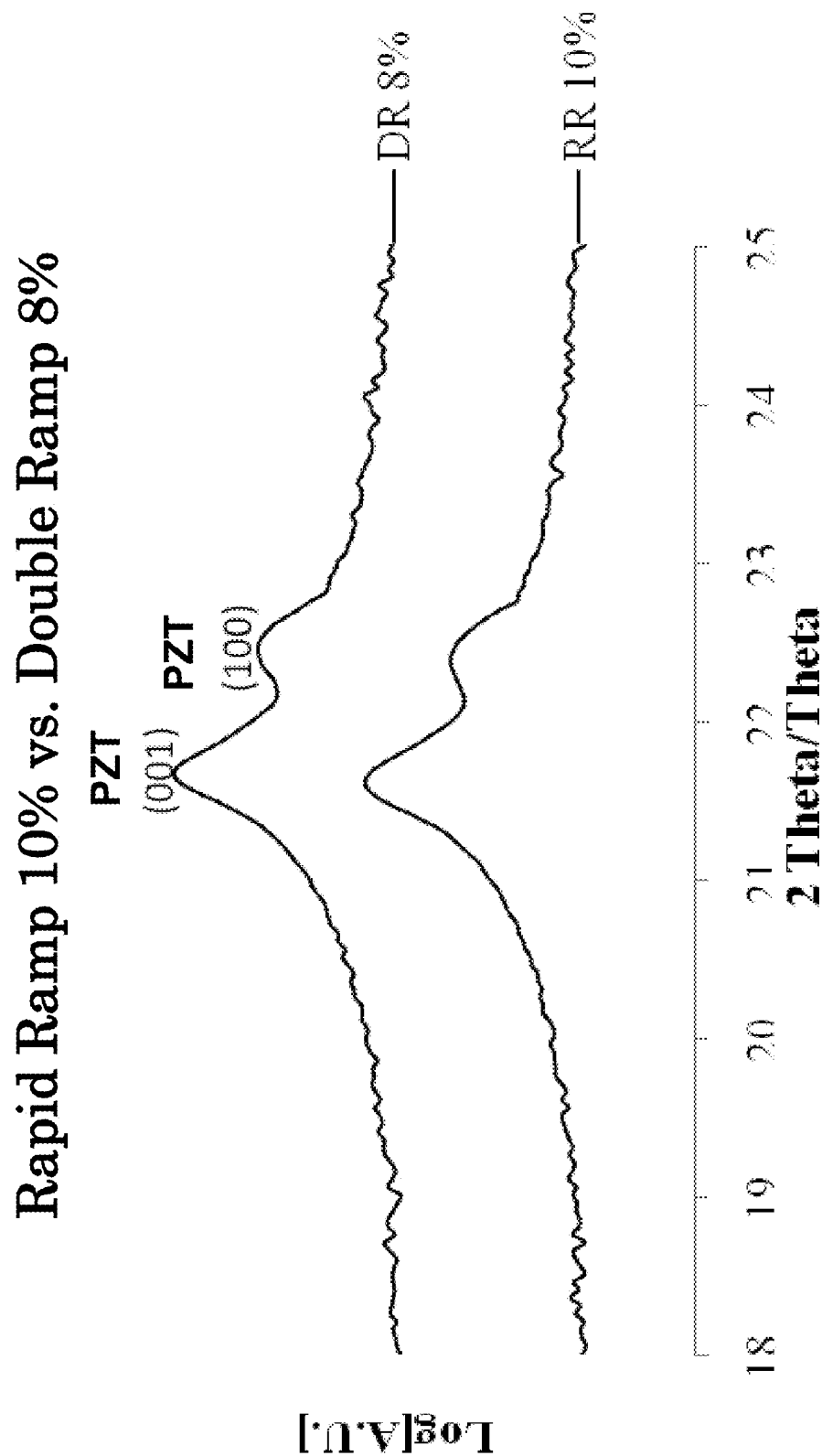
FIG. 14D Comparison of the 10% Pb Excess RR and 8% Pb Excess DR XRD peaks at 001/100 and 110/111 peaks.

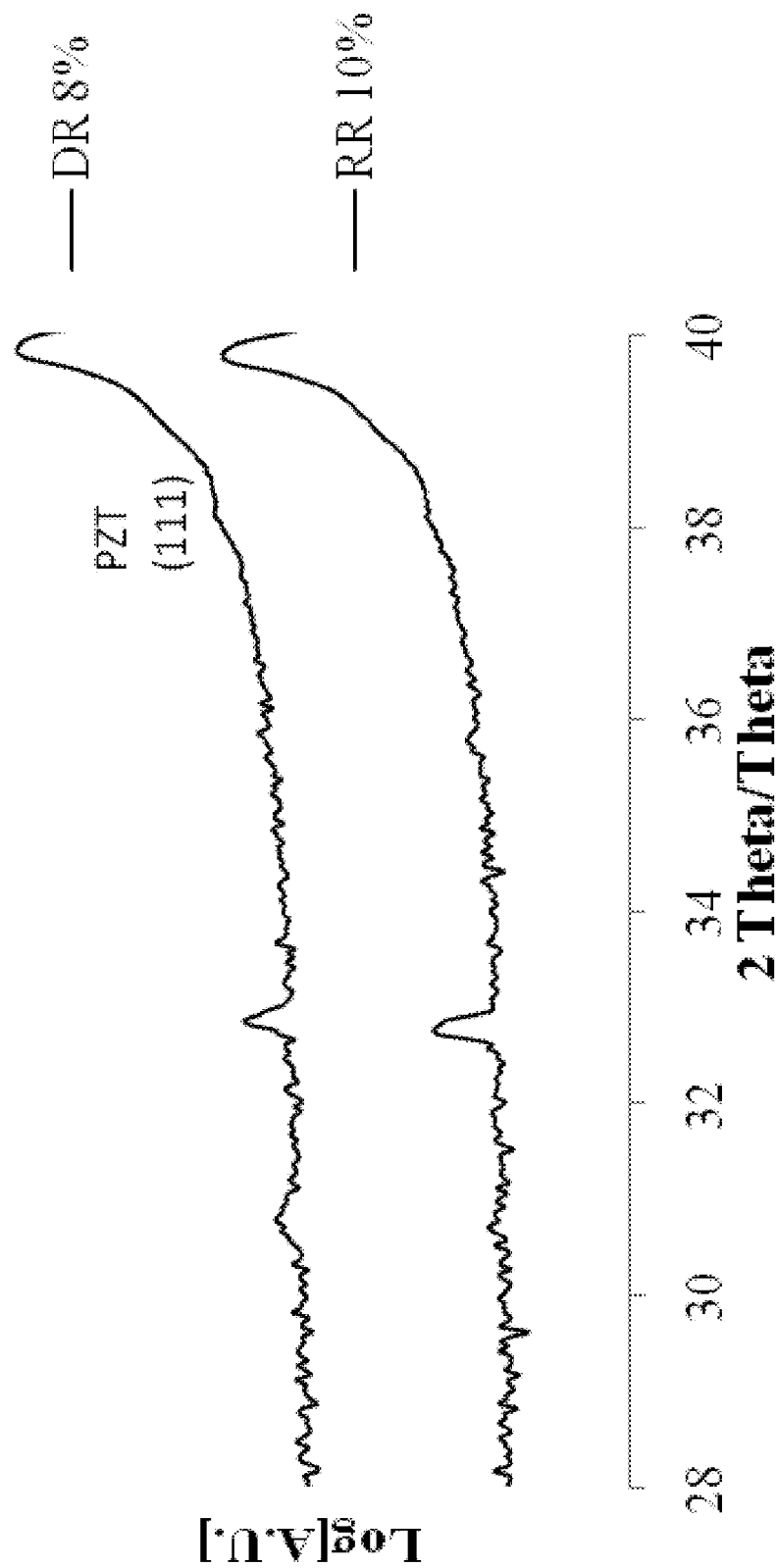
FIG. 14E Comparison of the 10% Pb Excess RR and 8% Pb Excess DR XRD peaks at 001/100 and 110/111 peaks.

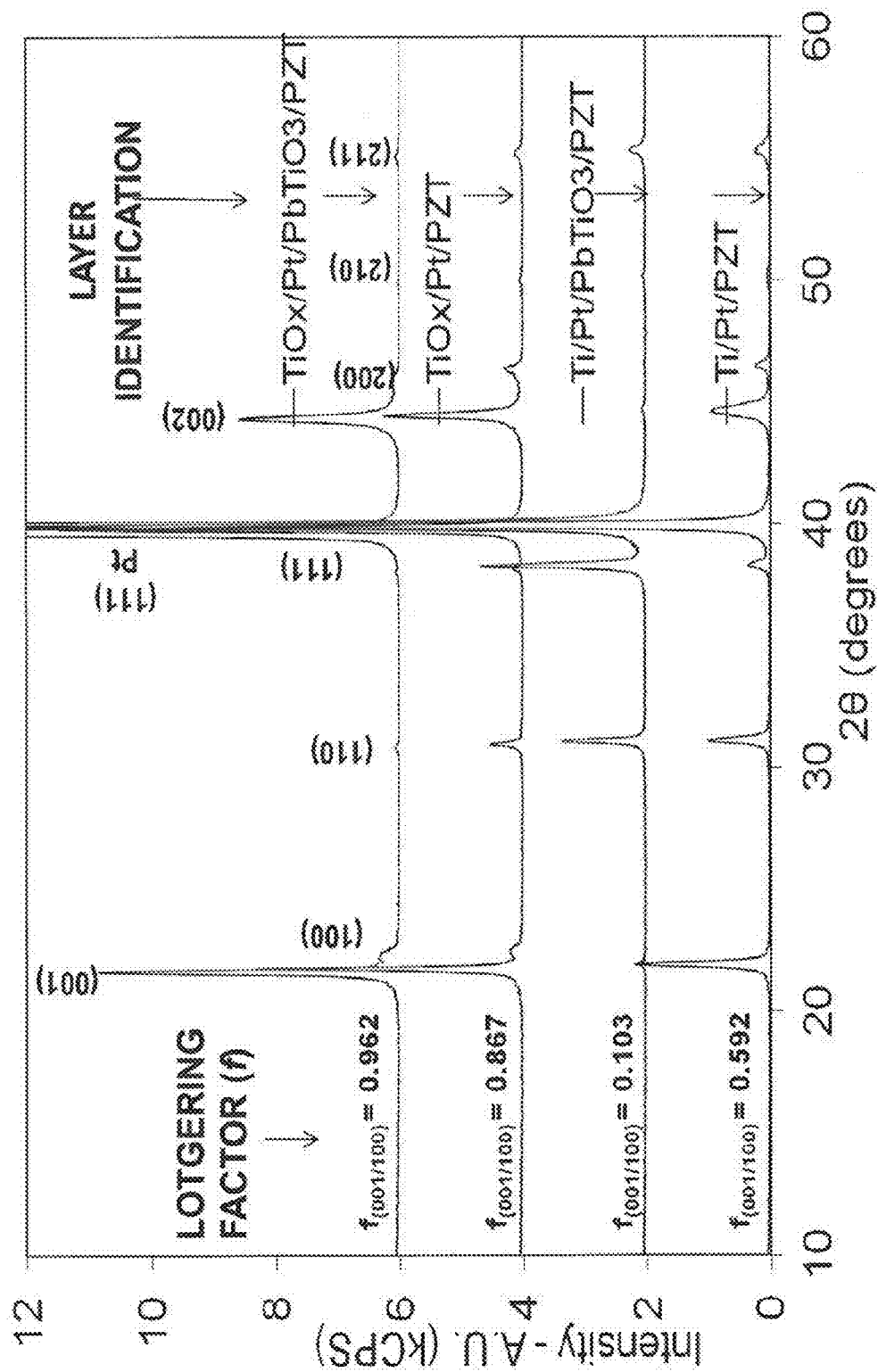
FIG. 15 – TiO$_2$/Pt is stylo-epitaxial.

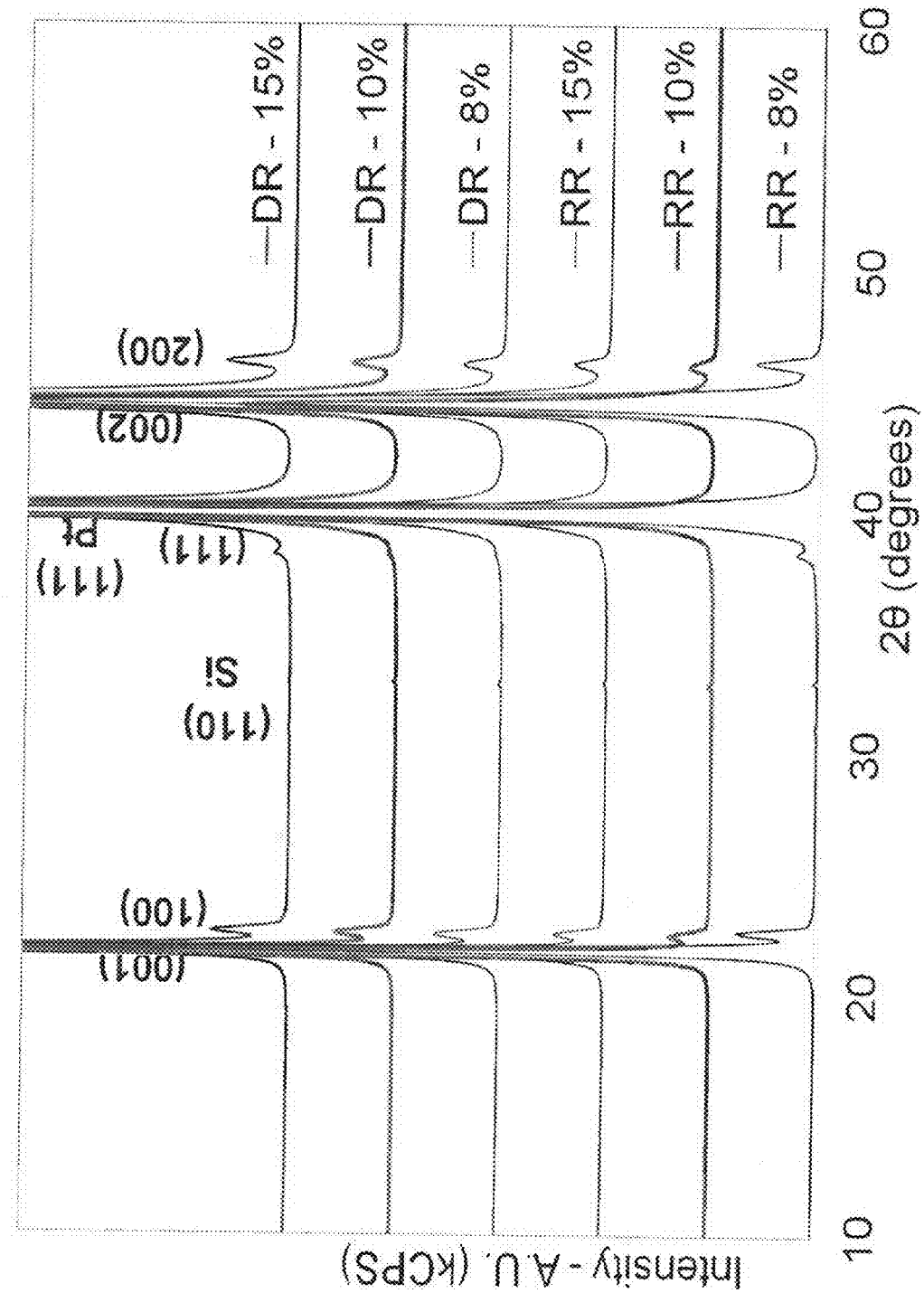
FIG. 16 - TiO$_2$/Pt is stylo-epitaxial.

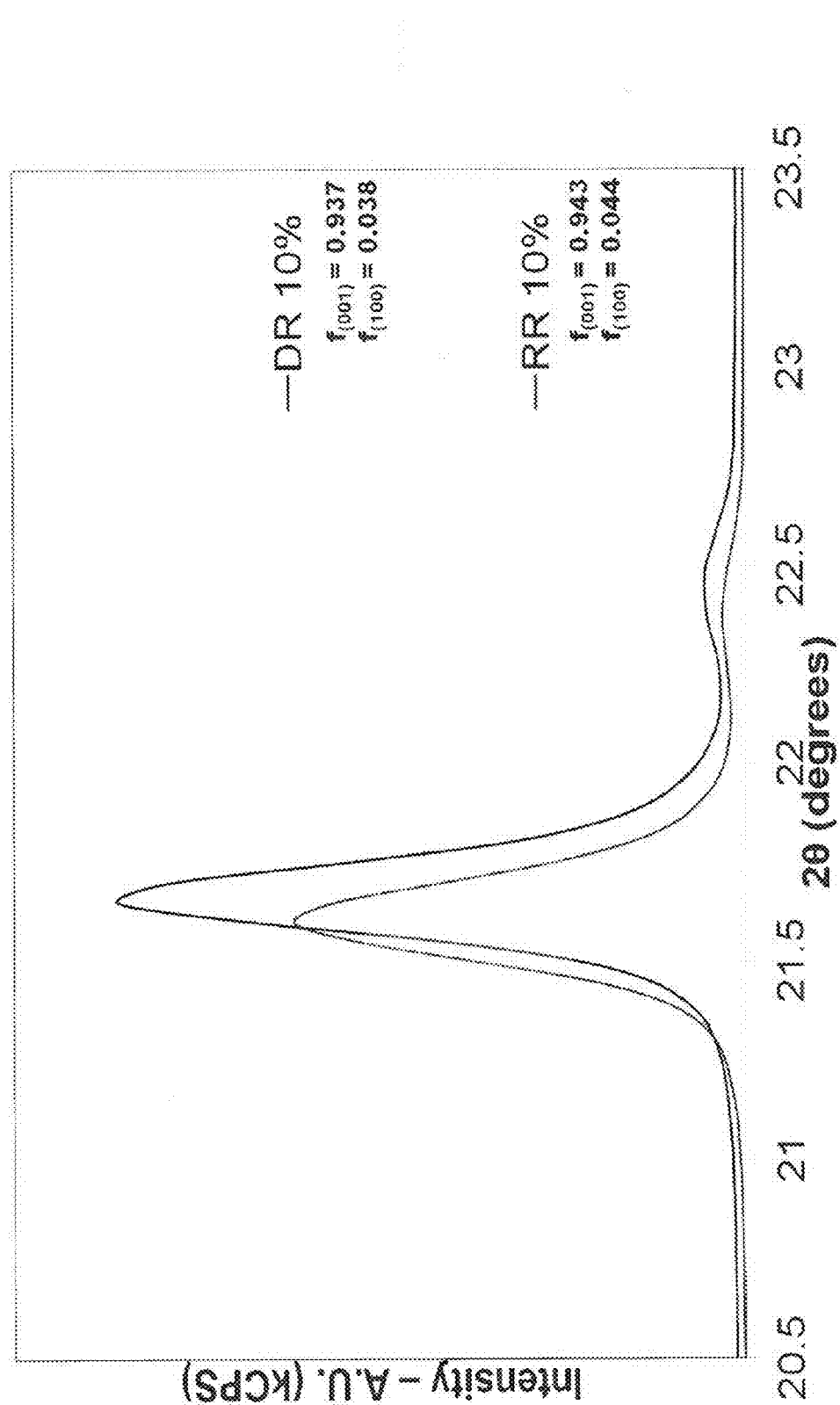
FIG. 17A - TiO$_2$/Pt/PbTiO$_3$/PZT is stylo-epitaxial.

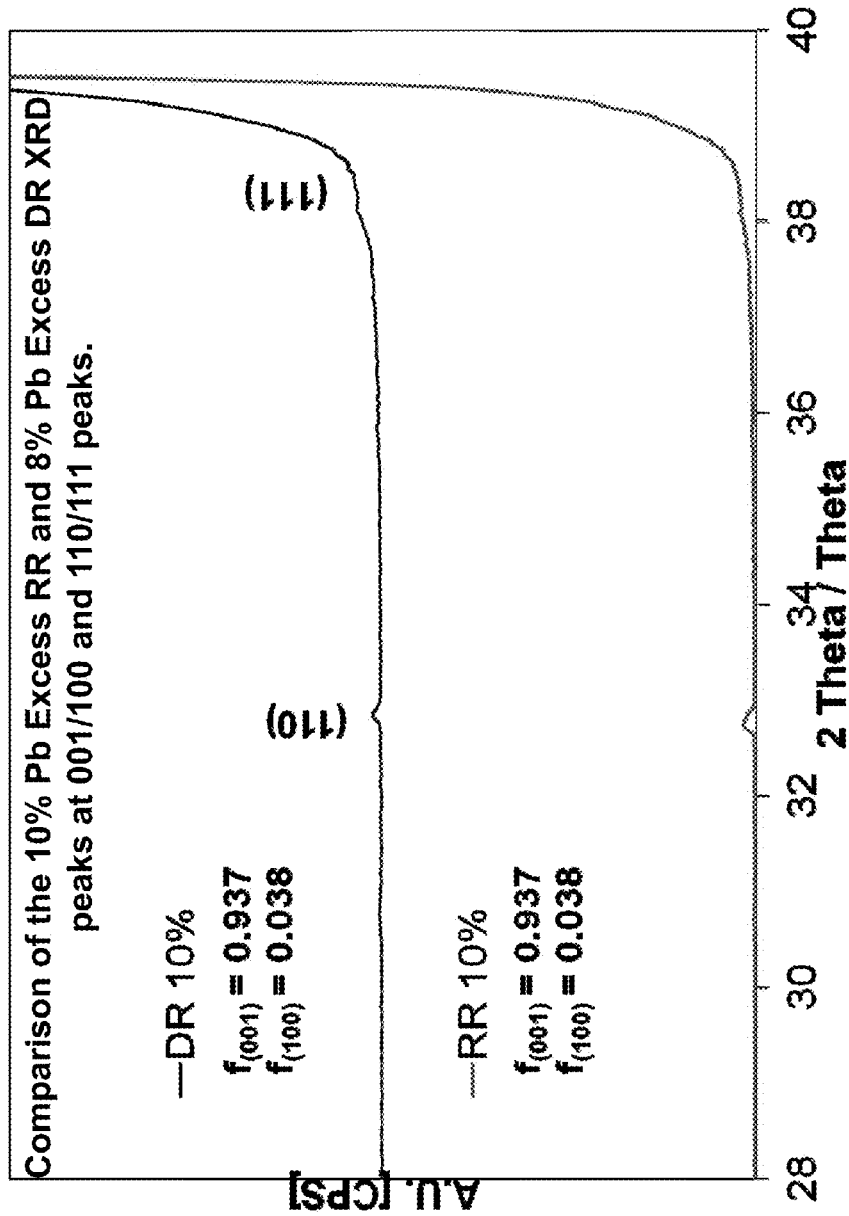
FIG.17B - TiO$_2$/Pt/PbTiO$_3$/PZT is stylo-epitaxial.

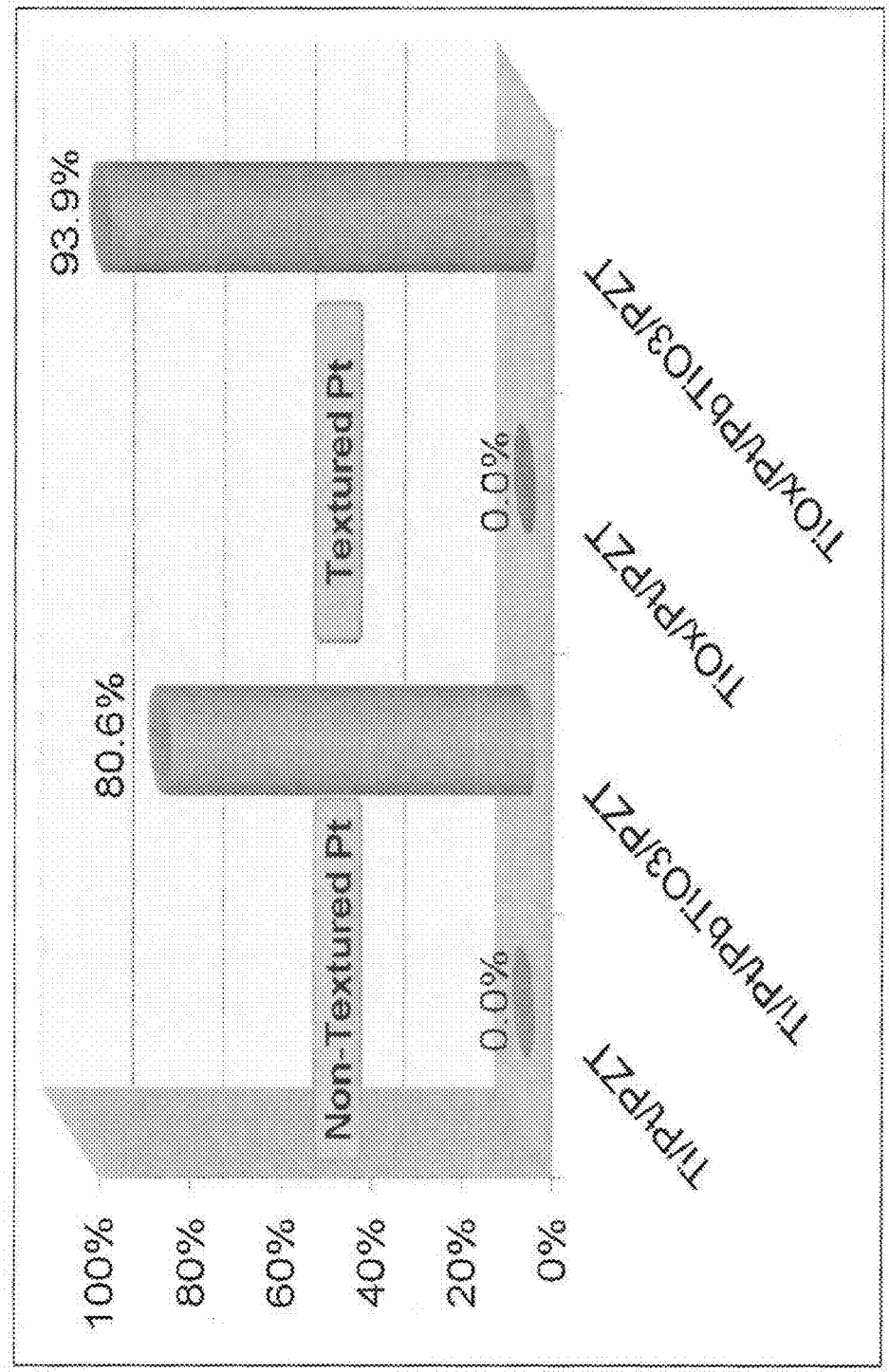
FIG. 18A Lotgering factor comparison of Ti/Pt and TiO₂/Pt bottom electrodes with PbTiO₃ seed layers in the (001) orientation. TiO₂/Pt/PbTiO₃/PZT is stylo-epitaxial.

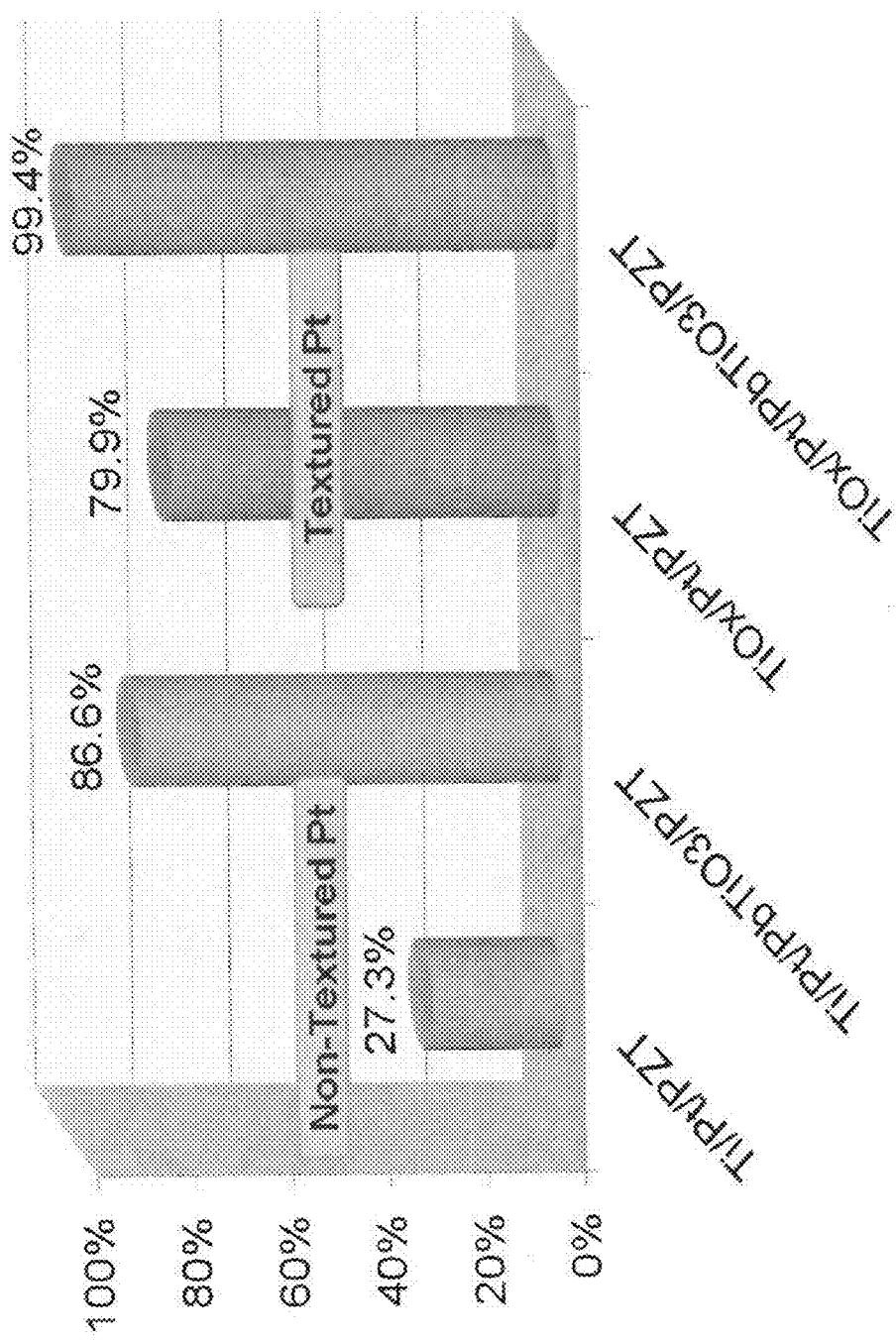
FIG. 18B seed layers in the (001)/(100) orientation. TiO₂/Pt/PbTiO₃/PZT is stylo-epitaxial.
Lotgering factor comparison of Ti/Pt and TiO₂/Pt bottom electrodes without PbTiO₃

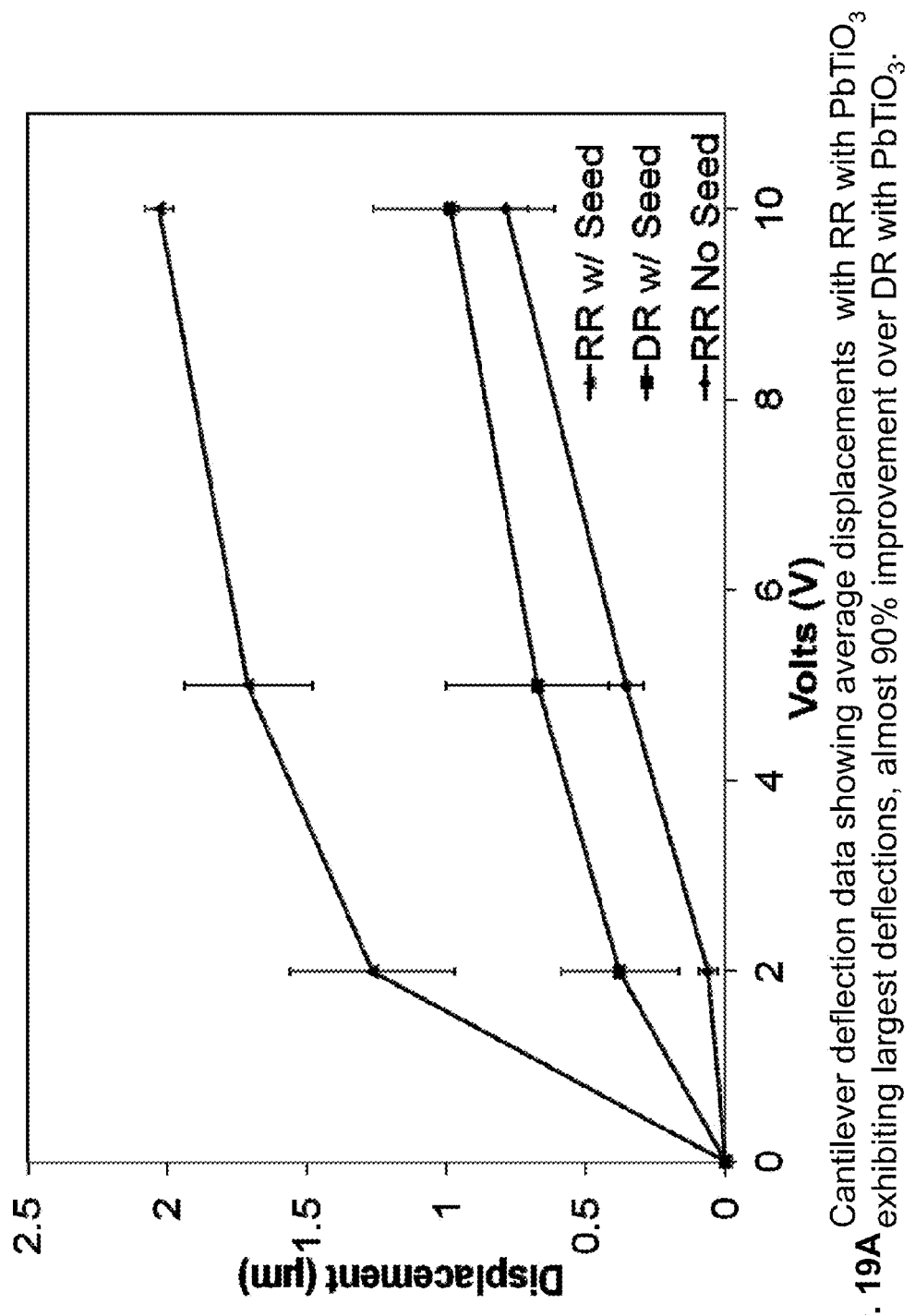
FIG. 19A Cantilever deflection data showing average displacements with RR with PbTiO$_3$ exhibiting largest deflections, almost 90% improvement over DR with PbTiO$_3$.

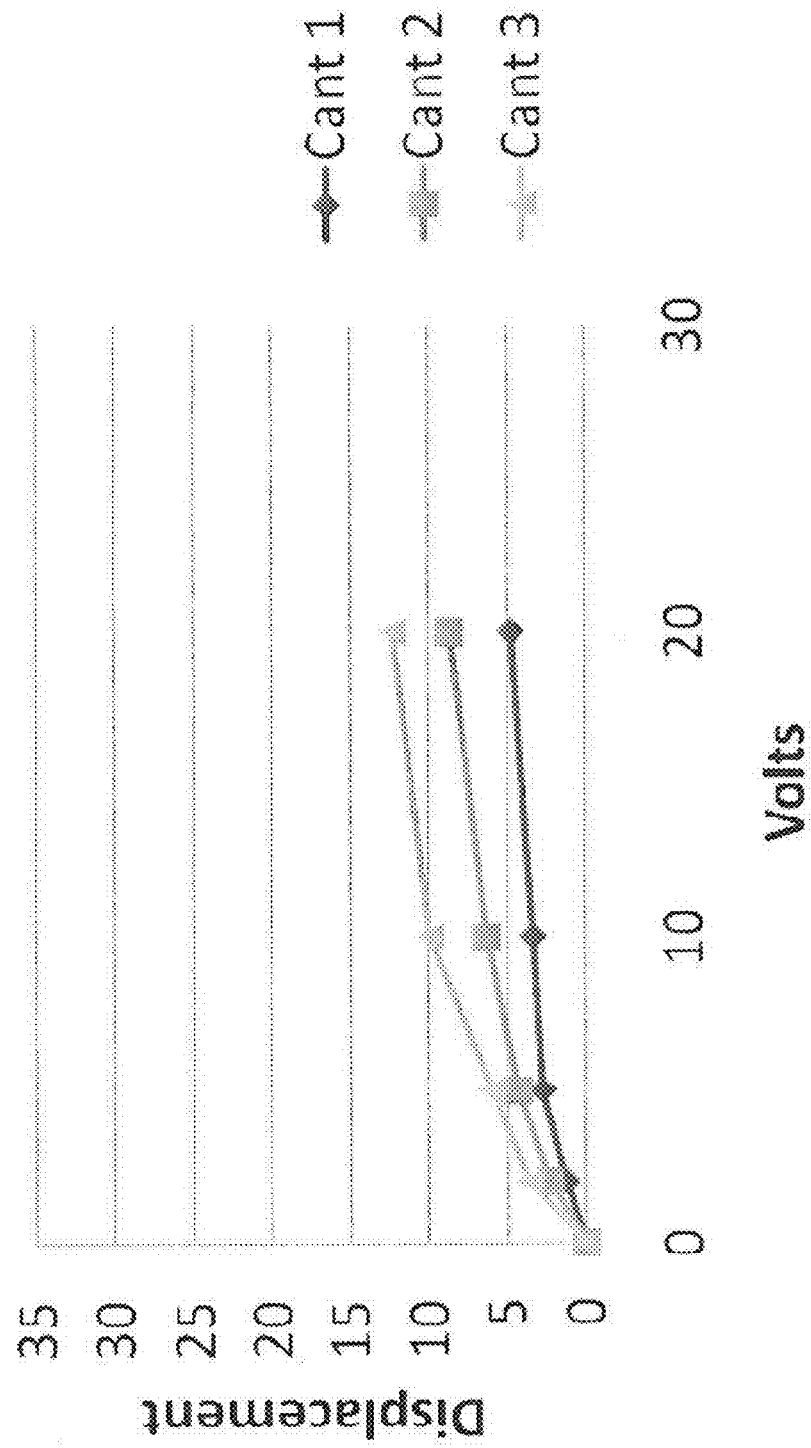
Fig. 19C Cantilever displacements for PZT (52/48)

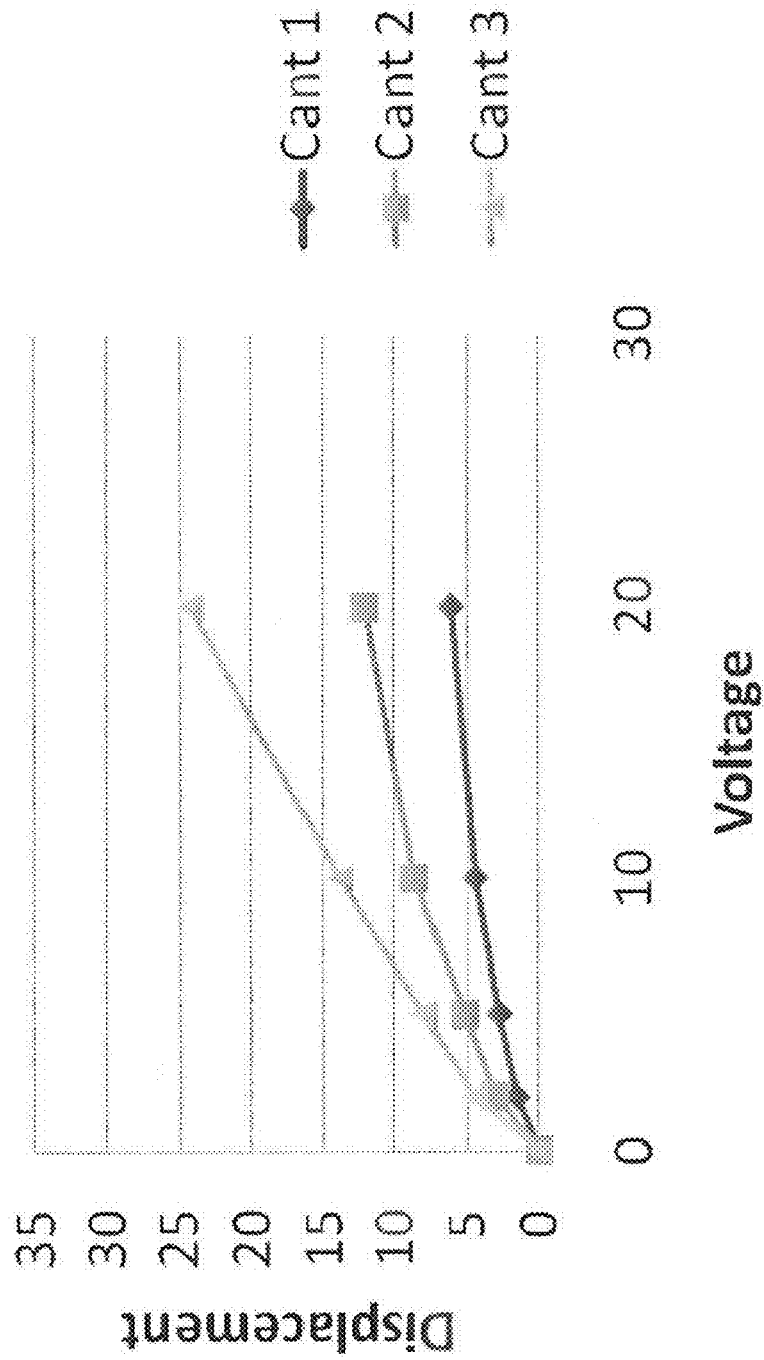
Fig. 19D Cantilever displacements for PZT (52/48) with Seed Layer 600°C RTA

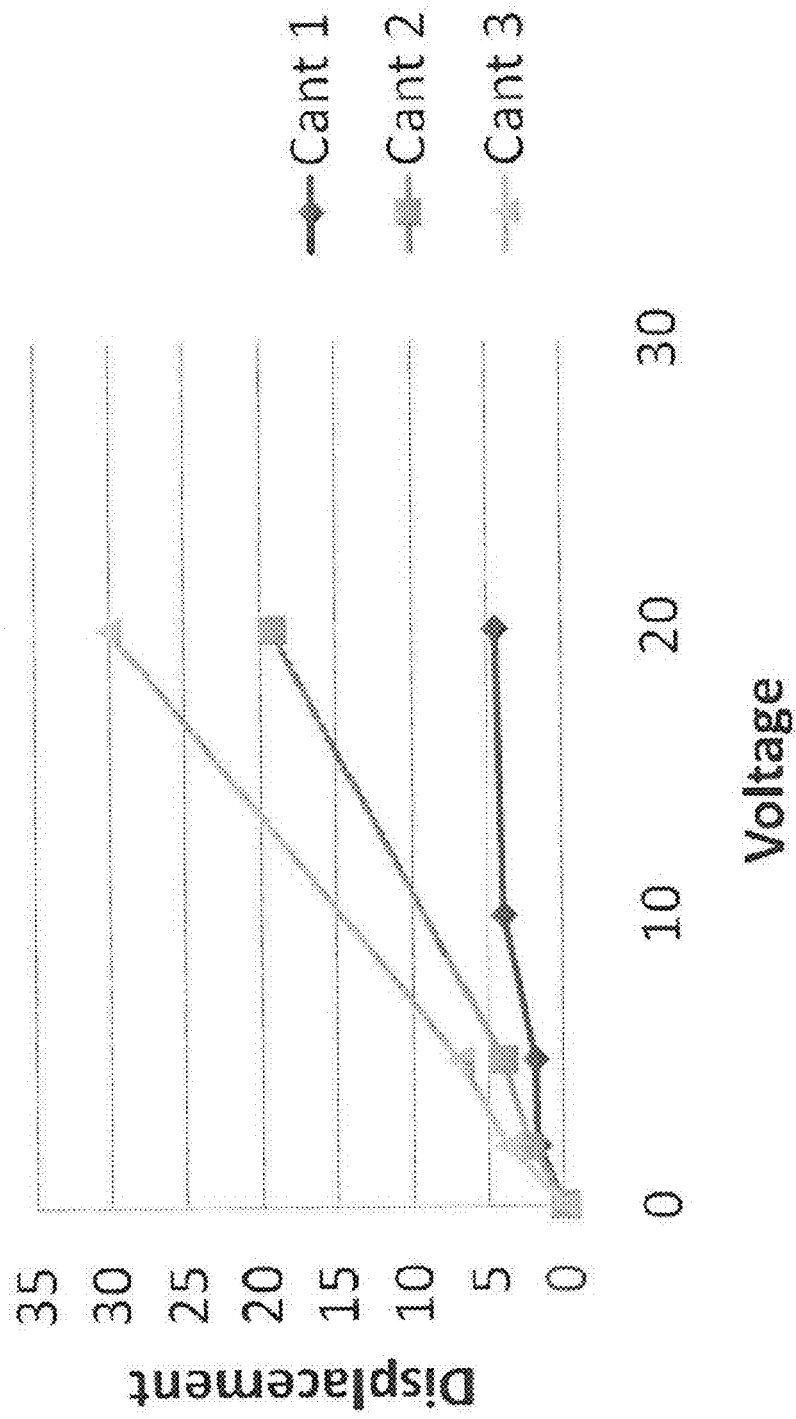
Fig. 19E Cantilever displacements for PZT (52/48) with Seed Layer 700°C RTA

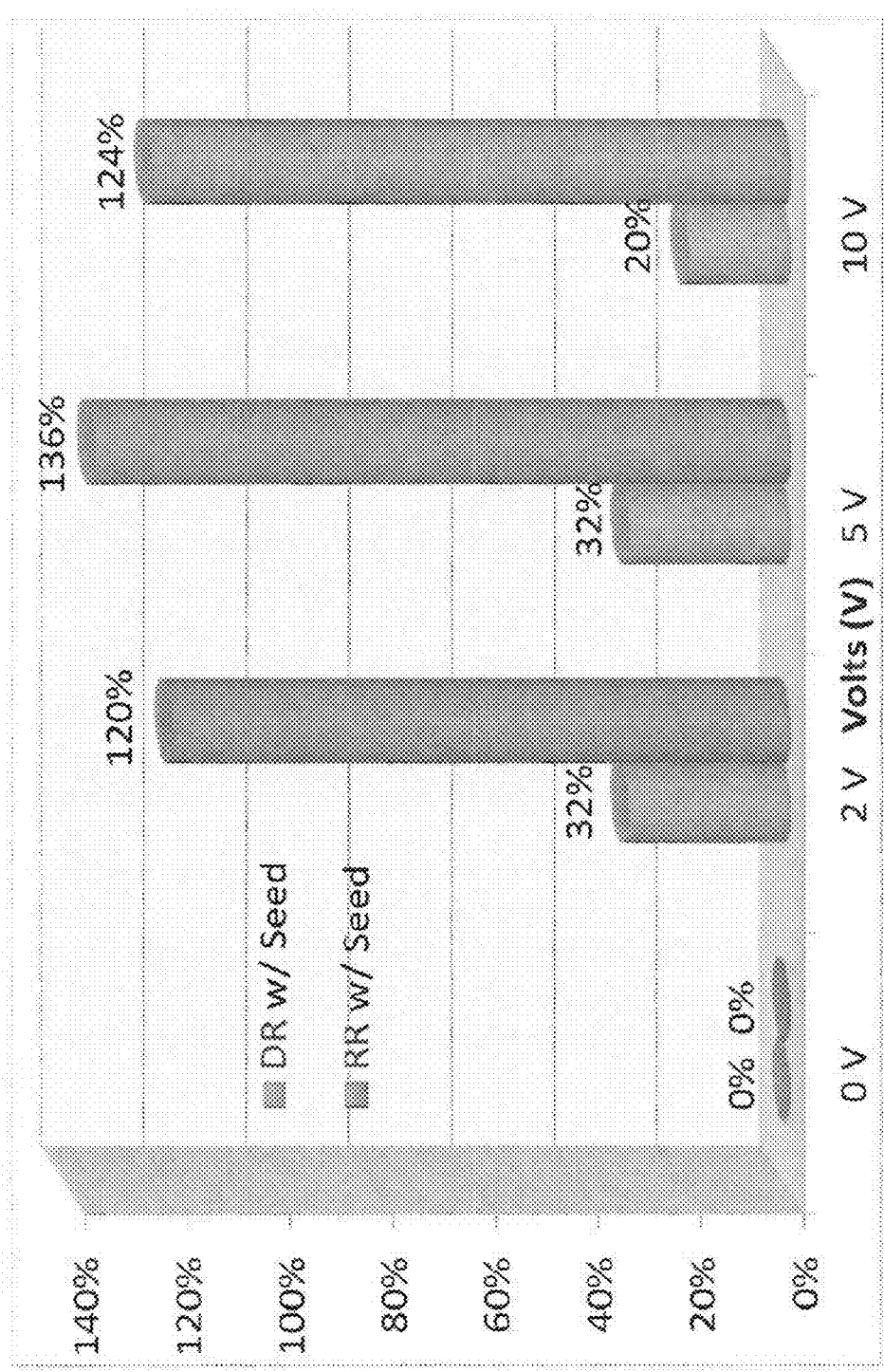
FIG20 Preliminary cantilever deflection data. Compares % increase of cantilever deflection between RR and DR with PbTiO$_3$ compared to RR without PbTiO$_3$.

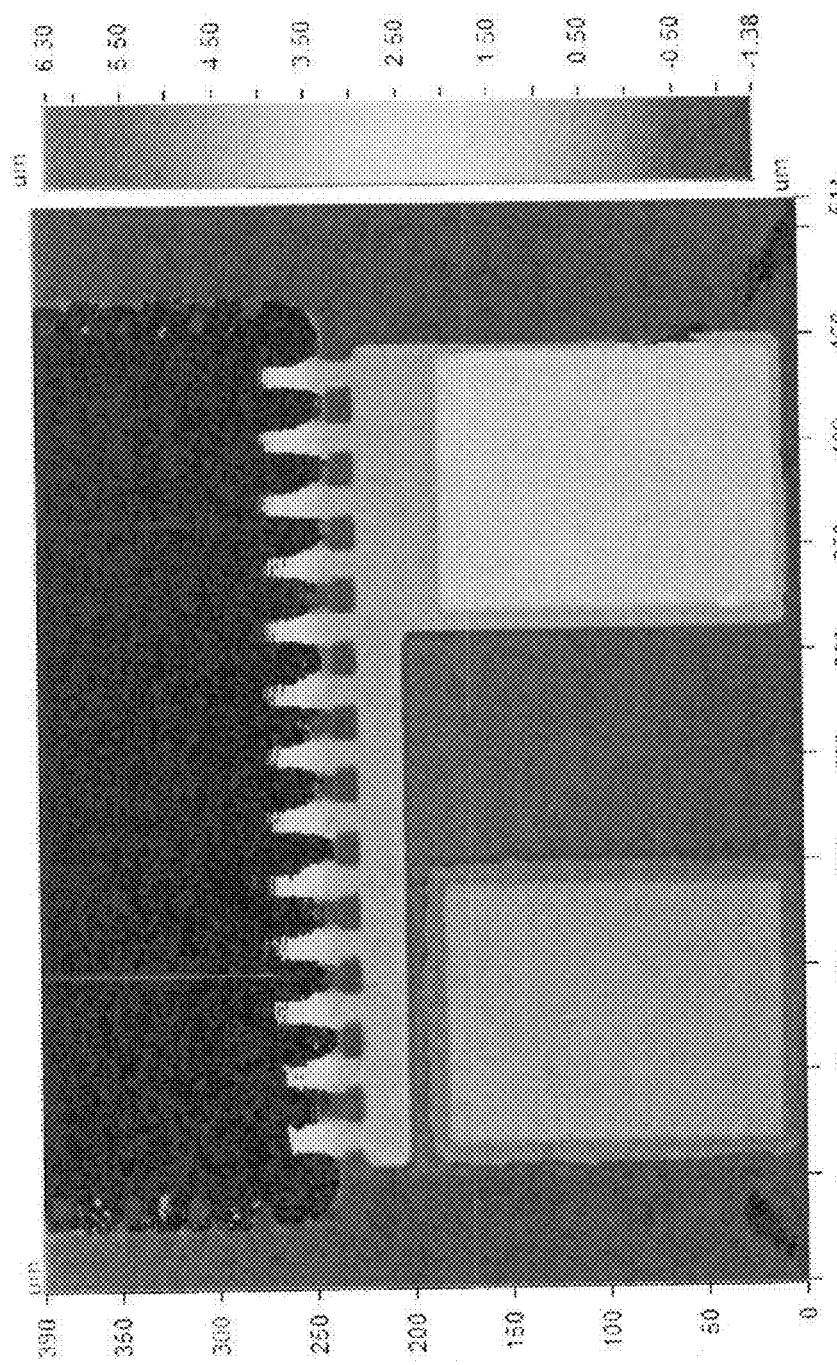
FIG. 21 TOP VIEW Optical Profilometry image of cantilever array demonstrating extreme out of plane static deformations. Although the cantilevers vary in length from 50 to 300µm, the optical profile images show all cantilevers as the same length.

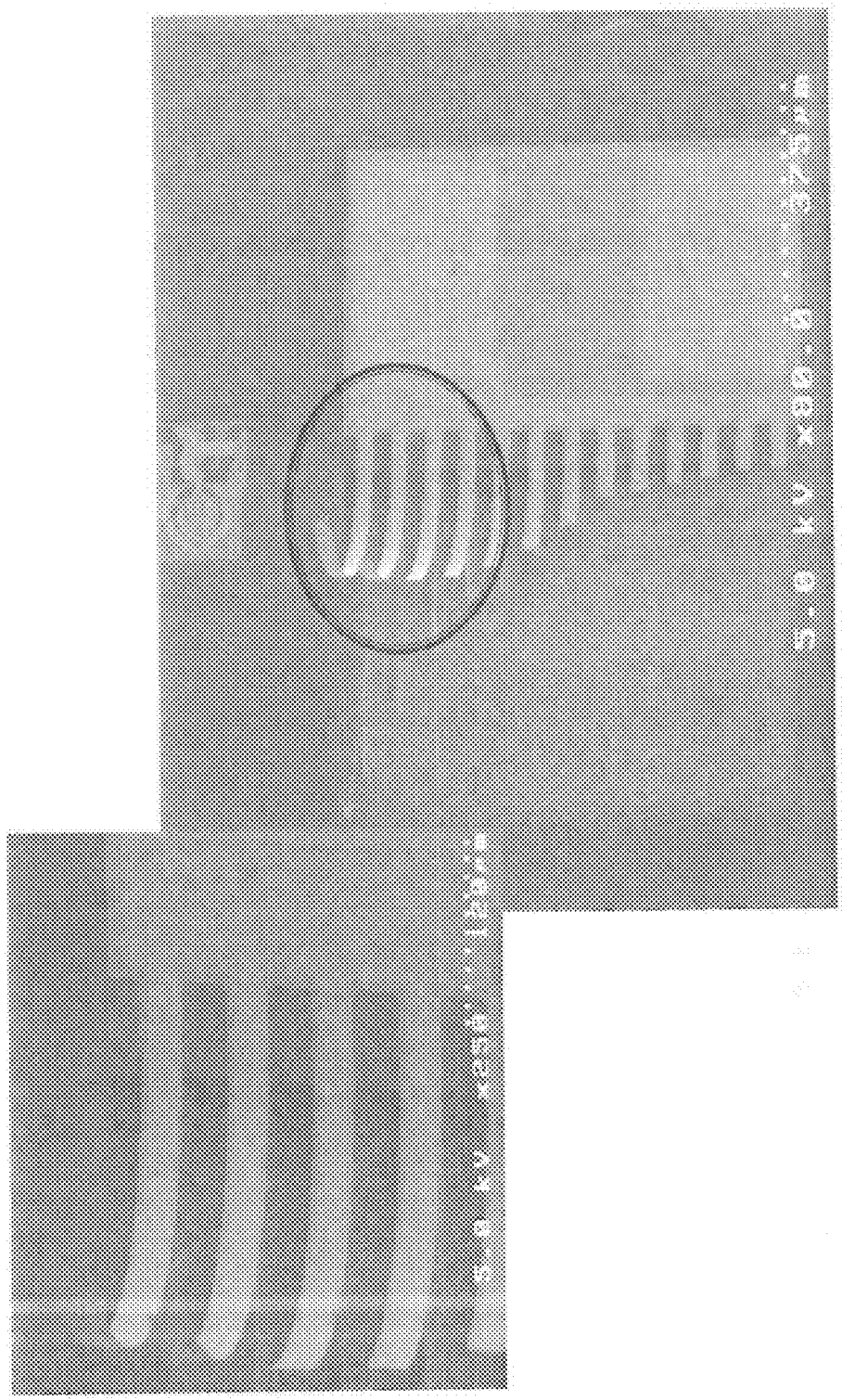
FIG. 22  Scanning Electron Microscopy (SEM) image of cantilever array demonstrating extreme out of plane static deformation.

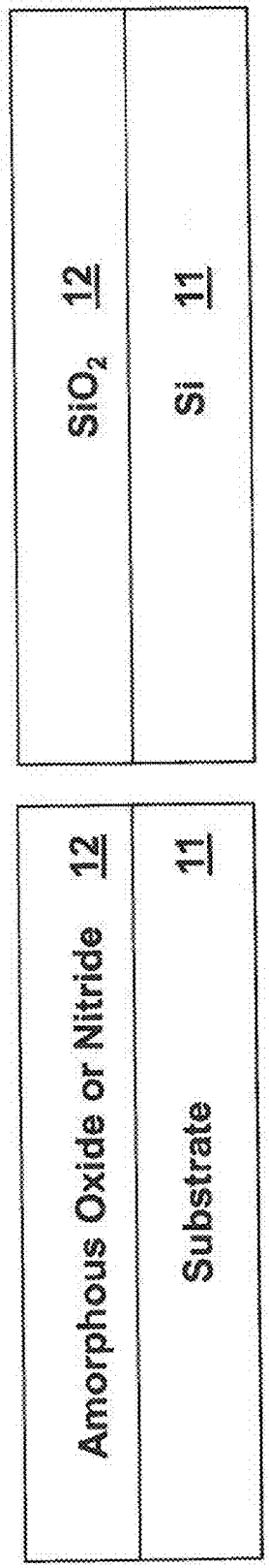
FIG. 23 Substrate With Amorphous Overcoat.

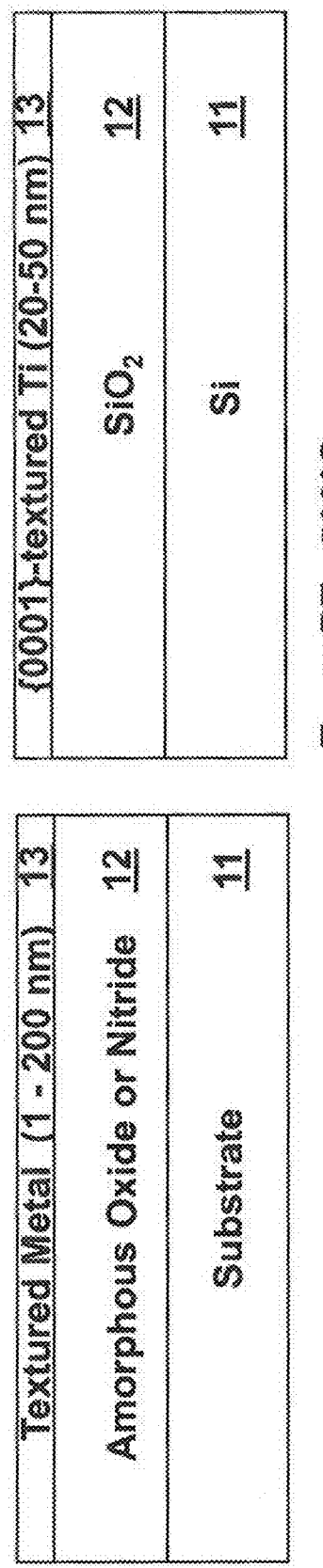
FIG. 24 Textured metal deposition.

Sputter Deposited Ti
- 900 s, 95 s & 190 s conditioning wafers
- Constant tdep wafer set: 40 °C, 19s, 1 kW, 30 sccm Ar
- P & tdep matrix: 40 °C, 6 – 38 s, 0.5 kW or 1 kW, 30 sccm Ar
- 200 – 40 Ohms/sq.
- Hexagonal
- Grey Metallic Color Oriented {0001} Ti Growth
Ti HCP Basal Plane Fig. 26 Thermal oxidation/nitridation to form textured oxide/nitride template.
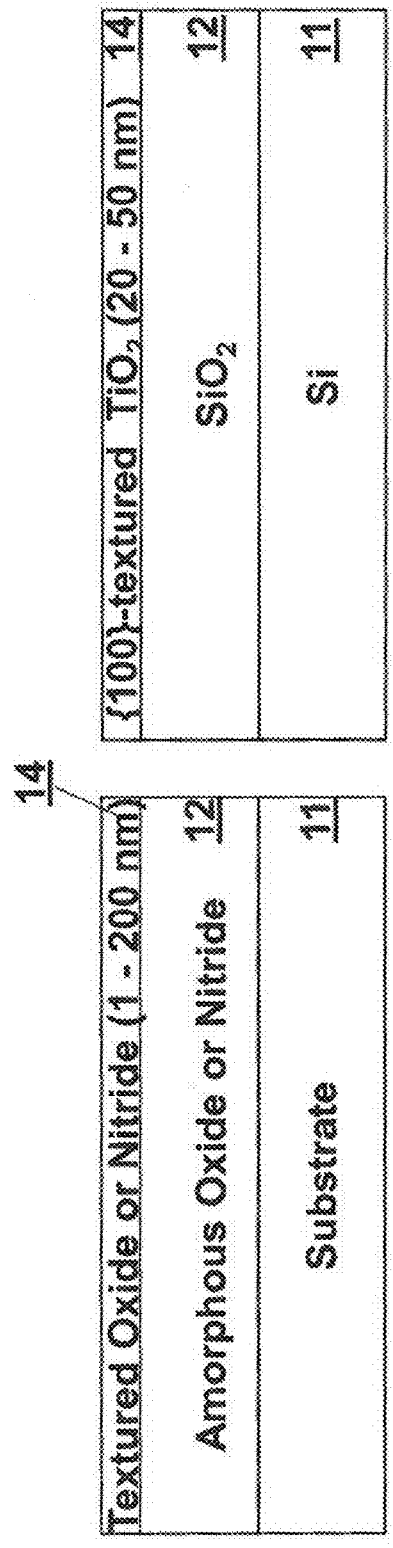

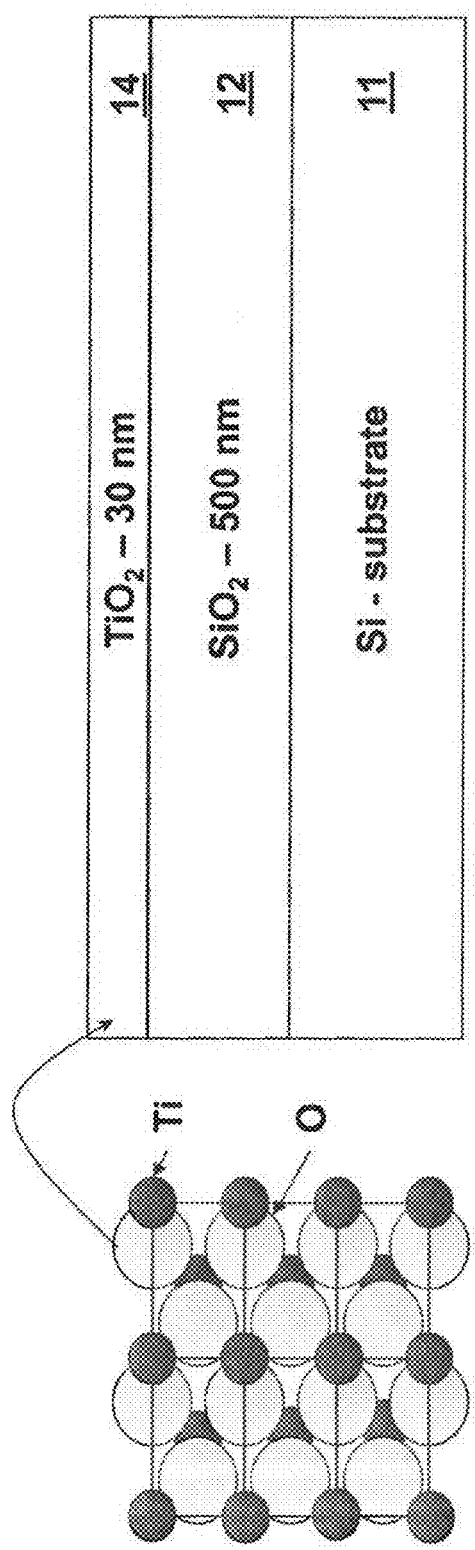
Fig. 27 Oxygenation Anneal & Structure
- 650 – 800 °C, 15 or 30 min, 10 SLM O₂
- Rutile TiO2
- 150 – 430 Å

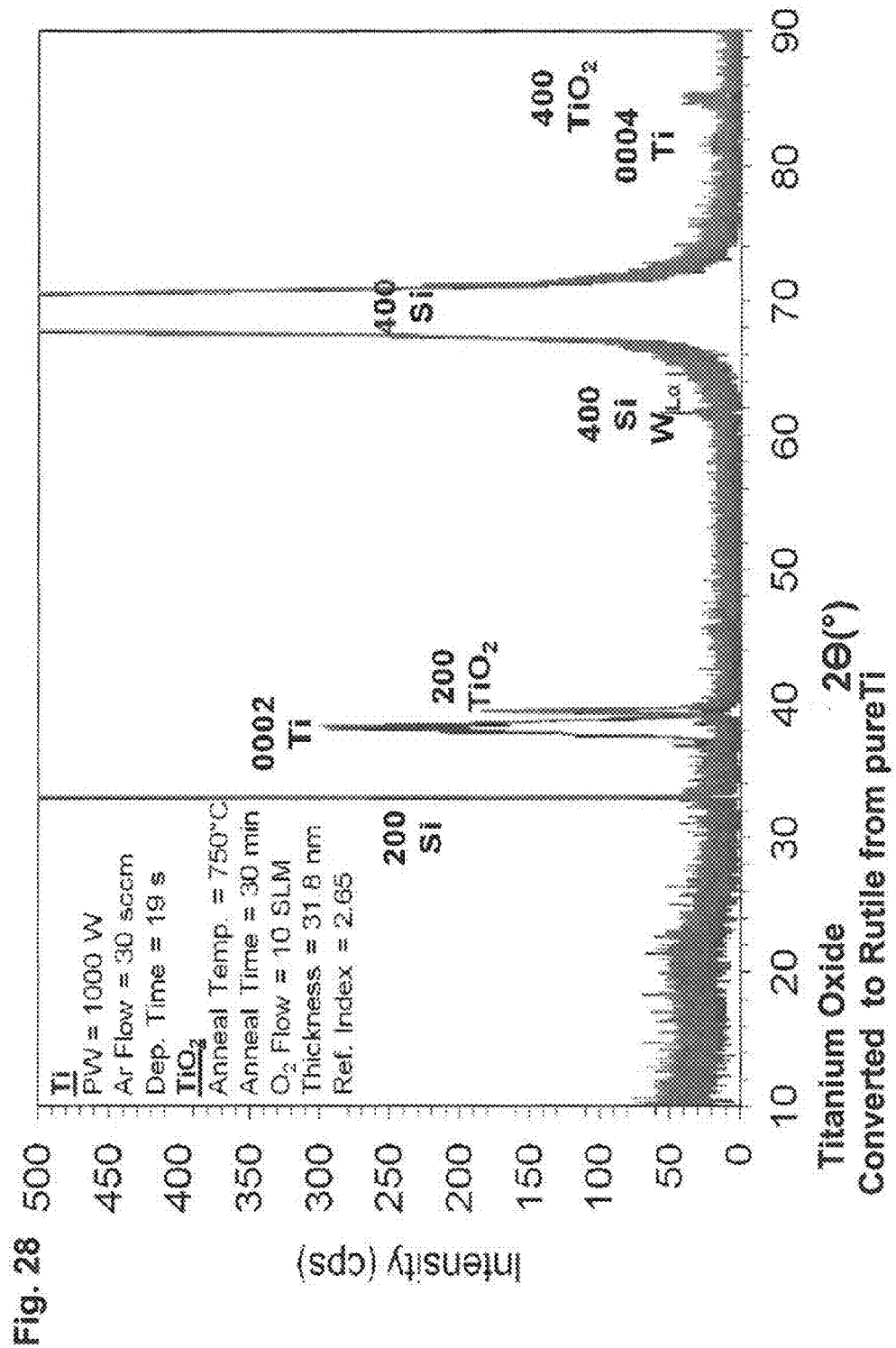

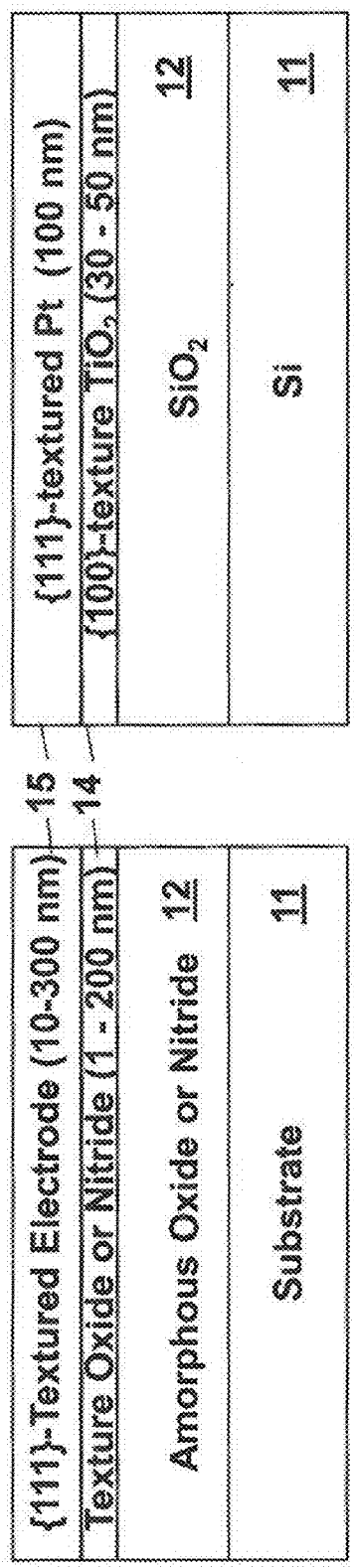
Fig. 29  Growth of {111}-stylo-epitaxy electrode layer.

Fig. 30A  Sputter-Deposited Platinum Epitaxy
- 300 s conditioning run
- 500°C, 0.5 kW, 30.5 sec wafer deposition, 50 sccm Ar 5×10$^{-3}$ mbar
- 1.25 Ohms/sq.
- Cubic
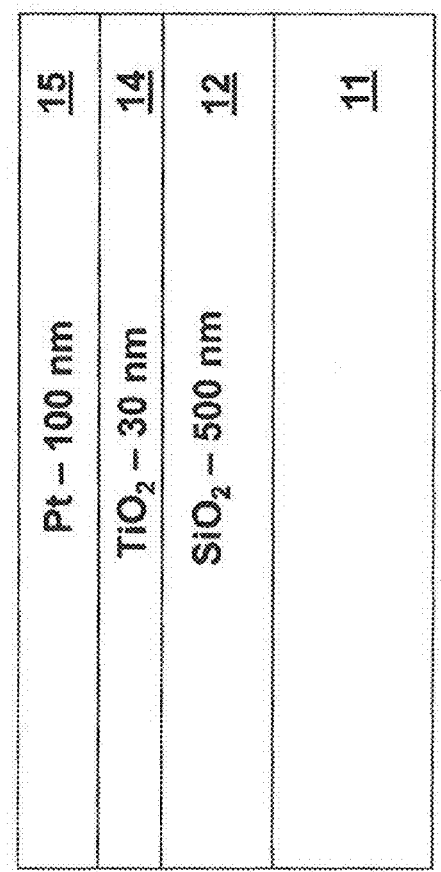
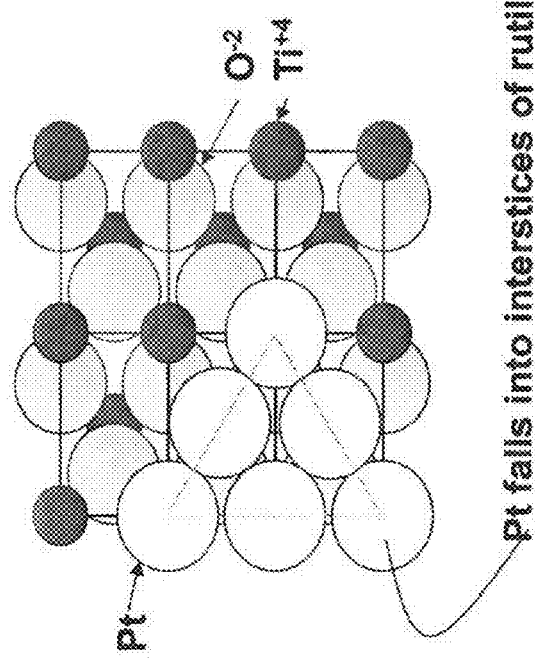

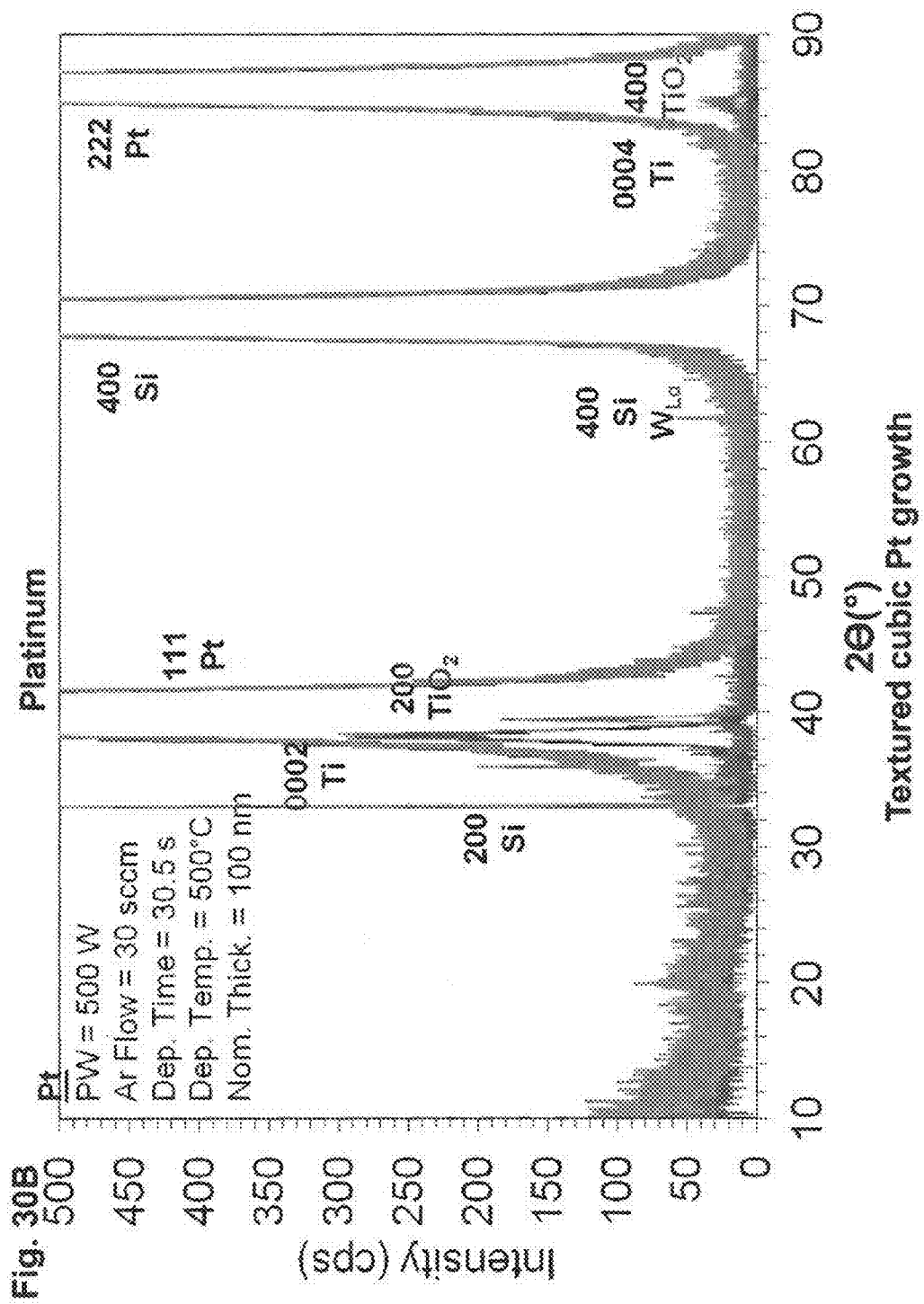

Fig. 32 Growth of {001}-stylo-epitaxy Perovskite Seed.

Fig. 34

Growth of {100}-stylo-epitaxy Perovskite Ferroelectric.

| {100}-textured PZT | |
| {100}-textured PbTiO$_3$ | |
| {111}-textured Pt (100 nm) | |
| {100}-texture TiO$_2$ (30 - 50 nm) | |
| SiO$_2$ | 12 |
| Si | 11 |

| {100}-textured Perovskite ferroelectric | 17 |
| {100}-textured Perovskite Seed | 16 |
| {111}-textured Electrode (10-300 nm) | 15 |
| Texture Oxide or Nitride (1 - 200 nm) | 14 |
| Amorphous Oxide or Nitride | 12 |
| Substrate | 11 |

Fig. 36 — Growth of {111}-stylo-epitaxy electrode layer.

STYLO-EPITAXIAL PIEZOELECTRIC AND FERROELECTRIC DEVICES AND METHOD OF MANUFACTURING

CROSS REFERENCE TO RELATED APPLICATIONS

This application is a continuation-in-part application of and claims priority to U.S. application Ser. No. 13/436,349 entitled "Stylo-Epitaxial Piezoelectric and Ferroelectric Devices and Method of Manufacturing," filed Mar. 30, 2012, which claims priority to Provisional Application No. 61/547,990 entitled "Stylo Epitaxial Piezoelectric and Ferroelectric Devices and Method of Manufacturing" and Provisional Application No. 61/547,879 entitled "Thermally Oxidized Seed Layers for the Production of {001} Textured Electrodes and PZT Capacitors," by Dr. Glen Fox, et al., both of which were filed on Oct. 17, 2011. All of the above applications are hereby incorporated by reference.

STATEMENT OF GOVERNMENT INTEREST

The embodiments herein may be manufactured, used, and/or licensed by or for the United States Government without the payment of royalties thereon.

BACKGROUND OF THE INVENTION

Microelectromechanical systems (MEMS) have been used in a wide range of applications; from pressure sensors and accelerometers to microphones and digital displays. In 2006, STMicroelectronics and Nintendo revolutionized the entire MEMS industry through the launch of the Nintendo Wii gaming console that uses 3-D MEMS accelerometers for motion control. Since then, MEMS devices have been used in almost all new technology from smart phones to tablet PCs. In 2010, the MEMS industry experienced a 25% growth with the top four MEMS suppliers, Texas Instruments, Hewlett-Packard, Robert Bosch, and STMicroelectronics, increasing MEMS sales by 37%.

A wide variety of the physical properties of materials, such as ferroelectricity, ferromagnetism, piezoelectricity, conductivity, and dielectric permittivity depend upon material anisotropy and are therefore strongly affected by crystallographic texture, as reported in M. D. Vaudin, et al., "Accuracy and Reproducibility of X-ray Texture Measurements on Thin Films," Mat. Res. Soc. Symp. Proc., Vol. 721, entitled "Magnetic and Electronic Films-Microstructure, Texture and Application to Data Storage," edited by P. W. DeHaven et al. (Mat. Res. Soc., Warrendale Pa., 2002) pp. 17-22. With the appropriate choice of thin film texture, device operating efficiency and reliability can be strongly affected. Therefore texture is one critical factor for thin film process control and is fundamental to device reproducibility Lead zirconate titanate ($Pb(Zr_xTi_{1-x})O_3$ or PZT) exhibits piezoelectric properties in thin films and is the most widely used piezoelectric bulk ceramic with ferroelectric properties. Examples of the use of thin films of PZT (used to create large force, large displacement actuators) include actuators for RF switches, relays and inkjet print heads.

To date, two approaches have been taken to produce lead zirconate titanate (PZT) thin film devices with the spontaneous polarization normal to plane of the film and thus normal to the planar capacitor device, i.e. {001}-orientation. It is noted that directions in crystal lattices are defined in terms of directions l, m, and n, known as the Miller indices. Indices {1,0,0}, {0,1,0} and {001} represent planes orthogonal (normal) to the l, m, and n directions, respectively. The crystallographic directions are lines linking nodes (atoms, ions or molecules) of a crystal. Similarly, the crystallographic planes are planes linking nodes. Some directions and planes have a higher density of nodes; these dense planes have an influence on the behavior of the crystal. The notation {001} denotes the set of all planes that are equivalent to (001) (as shown in FIG. 2) by the symmetry of the lattice. Heteroepitaxial growth makes use of a crystal substrate to initiate growth of an overlying crystalline material that has a different crystal structure than the substrate. Either a polar or a non-polar substrate may be used to initiate growth of a polar film. Further discussion of spontaneous polarization is found in FIG. 8 of U.S. Patent Application No. 2010/0006780 and U.S. Pat. No. 7,956,369.

The piezoelectric coefficient of PZT is inherently linked to its crystalline quality. The highest magnitude piezoelectric coefficients are observed at the PZT morphotropic phase boundary (MPB) (See FIG. 1), where the crystal structure changes abruptly between the tetragonal and rhombohedral symmetry. The MPB is located at $PbZr_{0.52}Ti_{0.48}O_3$, or PZT (52/48), and is the composition in which both the dielectric permittivity and piezoelectric coefficients reach a maximum. In thin film form, the composition and the crystalline texture must be controlled to achieve the maximum piezoelectric coefficients. For PZT (52/48), the highest coefficients are reported for a {001} textured PZT (52/48). The increased piezoelectric response and poling efficiency near to x=0.52 is due to the increased number of allowable domain states at the MPB. At this boundary, the 6 possible domain states from the tetragonal phase <100> and the 8 possible domain states from the rhombohedral phase <111> are equally favorable energetically, thereby allowing a maximum 14 possible domain states.

FIG. 3 shows the orientation of a polar material relative to the growth direction. One approach to producing PZT thin film devices with the spontaneous polarization normal to the plane of the film is to use a single crystal substrate and grow epitaxial layers of the bottom electrode and ferroelectric layer. The difficulty with this approach is that it places very strict requirements on the single crystal substrate, and the electrode must provide an epitaxial relationship with both the single crystal substrate and the ferroelectric film. The second approach to obtaining {001}-orientation is to use a seed layer and/or variations in process conditions to produce a {001}-textured PZT film whereby the PZT {001}-planes lie parallel to the substrate plane, but the relative orientation of the grains are randomly rotated about the substrate normal and there is no defined crystallographic relationship between the capacitor electrodes and the PZT.

Previous publications and patents do not appear to provide a complete description of the {001}-texture inasmuch as it is insufficient to just state independently just the percentage of {100}-textured grains or {001}-textured grains or angular distribution width of the textured grains. In order to fully define a texture and the crystallographic efficiency (or figure of merit) of the texture, the volume fraction of the {100}-oriented grains relative to the total volume of the PZT film should be defined. Of that volume fraction, then the volume fraction of the {001}-oriented grains must be defined. And finally, the misalignment distribution of the {001}-oriented grains relative to the substrate normal (which is also the electric field direction of the device) must be defined. When these crystallographic parameters are defined, a figure-of-merit for the material can be calculated.

U.S. Pat. No. 6,682,772, to Fox, et al, entitled "High temperature deposition of Pt/TiOx for bottom electrodes," hereby incorporated by reference, has been reported for a bottom electrode consisting of $TiO_2/\{111\}$-textured Pt which resulted in improved PZT ferroelectric capacitor electrical characteristics for FRAM applications.

SUMMARY OF THE INVENTION

A preferred embodiment of the present invention is directed to orientation control of lead zirconate titanate (PZT) thin films so as to achieve a high volume fraction and high degree of (001) crystallite orientation and improved piezoelectric properties. A high volume fraction and high degree of (001) crystallite orientation in the PZT can be achieved using a seed layer of $PbTiO_3$. The use of highly oriented $TiO_2$ seeded the growth of Pt with a high volume fraction and high degree of (111) crystallite orientation which in turn improved both the $PbTiO_3$ and PZT orientations. PZT (52/48) and (45/55) thin films with and without $PbTiO_3$ seed layers were deposited and examined via X-ray diffraction methods (XRD) as a function of annealing temperature. The $PbTiO_3$ seed layer provided significant improvement in the (001) orientation while suppressing the (111) orientation of the PZT. Improvements in the Lotgering0 factor (f) (defined as $f=(P-P_o)/(1-P_0)$, where $P=\Sigma I(001)/\Sigma I(hkl)$) were observed from the existing Ti/Pt/PZT process (f=0.66) to samples using the $PbTiO_3$ seed layer as a template, Ti/Pt/PT/PZT (f=0.87), and finally to films deposited onto the improved Pt electrodes, $TiO_2$/Pt/PT/PZT (f=0.96). Po is a standard intensity from the standard Powder Diffraction File for the peak(s) of the orientation of interest. The seminal reference for this analysis is F. K. Lotgering, J. Inorg. Nucl. Chem. Vol. 9, p. 113 (1959), hereby incorporated by reference. The dielectric constant values track accordingly varying from 863 (f=0.66) to 1010 (f=0.87) to 1343 (f=0.95).

A preferred embodiment of the present invention relates to the registration of the crystal structure of the perovskite ferroelectric phase and the crystal structure of the electrode phase (epitaxial perovskite/electrode crystalline interface) on a grain-by-grain basis. The term stylo-epitaxy refers to the grain-by-grain crystal registration during the epitaxy process. The term "stylo" means, in combination with epitaxy, column, pillar, and/or tubular formations.

In one preferred embodiment, the crystal structure of each ferroelectric grain is in registration with contacting electrode grains. In general, each ferroelectric grain is registered with one electrode grain. The ferroelectric grain could be in contact with multiple electrode grains if the electrode grains are separated by low angle grain boundaries, typically rotated by less than 5 degrees. The registration of the crystal structures allows optimization of the polarization and piezoelectric response of the device.

A preferred methodology of the present invention relates to a method of producing a {111}-textured Pt (platinum) or Ir (iridium) electrode with a high quality {111}-texture in combination with a $PbTiO_3$ seed layer that promotes {001}-textured growth of PZT for enhanced performance of ferroelectric and piezoelectric capacitor structures. The terminology texture, as used in the materials science, relates to the distribution of crystallographic orientations of a polycrystalline material. Orientations in a material which are fully random are said to have no texture. In the case of some preferred orientation, the material has a weak, moderate or strong texture, with the extent of the texture being dependent upon the percentage of crystals having the preferred orientation.

Each polycrystalline layer is grown epitaxially on a grain-by-grain basis to produce a stylo-epitaxial structure. An embodiment of the present invention comprises a method of forming {100}-textured $TiO_2$ rutile structure films and {111}-textured Pt electrode films. An embodiment of the present invention encompasses the use and method of producing a $PbTiO_3$ seed layer with {001}-texture when deposited on {111}-textured Pt. The {001}-textured $PbTiO_3$ seeds the growth of {001}-PZT. Applications of such structures include {001}-textured, stylo-epitaxy, capacitor structures in MEMS switches, inkjet printers, cantilever devices, diaphragm devices, and mechanical logic.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 2 is a diagrammatic illustration of crystal planes, planar orientations and crystal structures.

FIG. 3 shows the orientation of the c-axis of a crystal's structure (with c-axis being defined as perpendicular to the c-plane) relative to the growth plane, which in this example is the sample surface.

FIG. 4 is a diagrammatic illustration of the perovskite crystal structure.

FIG. 5A schematically illustrates a preferred embodiment wafer stack showing the various layers with a Ti/Pt bottom electrode.

FIG. 5B schematically illustrates a preferred embodiment wafer stack showing the various layers with a highly textured, stylo-epitaxial $TiO_2$/Pt electrode.

FIG. 6A is a TEM cross-section image showing the granular Pt layer in registration with the granular $TiO_2$ layer.

FIG. 6B is an illustration showing an enlargement of the regions shown in FIG. 6A.

FIG. 7A is a schematic block diagram of the chemical solution deposition process for control samples without a PbTiO$_3$ seed layer. Experiments examined the influence of Ti/Pt and TiO$_2$/Pt thins films used as the base electrode for the chemical solution deposited PZT thin film growth (compare FIG. 7A-B).

FIG. 7B is a schematic block diagram of the chemical solution deposition process for control samples with a PbTiO$_3$ seed layer.

FIG. 8A illustrates X-ray diffraction data for 2500 Å PbTiO$_3$ thin film deposited onto a Si/SiO$_2$/Ti/Pt substrate over a 2θ range from 10-60 degrees.

FIG. 8B illustrates X-ray diffraction data for 2500 Å PbTiO$_3$ thin film deposited onto a Si/SiO$_2$/Ti/Pt substrate over a 2θ range from 10-90 degrees.

FIG. 9C graphically illustrates X-ray diffraction data showing a comparison of XRD patterns using the different bottom electrodes and the use of PbTiO$_3$.

FIG. 10A graphically illustrates X-ray diffraction data of samples with and without the 700° C. annealed PbTiO$_3$ seed layer in the 2θ range of 10-40.

FIG. 10B illustrates X-ray diffraction data illustrating a comparison of PZT (52/48) PZT with and without 700° C. annealed PbTiO$_3$ seed layer in the 2θ range of 10-60.

FIG. 11A illustrates PZT 52/48 ferroelectric hysteresis comparison tests showing the control sample.

FIG. 12A is an illustration of optical profilometry 3-D images of fabricated cantilever arrays during optical profilometry tests to measure displacement in-plane showing a PZT(45/55) control sample on Ti/Pt electrode.

FIG. 12B is an illustration of optical profilometry 3-D images of fabricated cantilever arrays during optical profilometry tests to measure displacement in-plane showing a PZT(52/48) with PT seed on Ti/Pt electrode.

FIG. 13 graphically illustrates cantilever displacements at varying seed layer annealing temperature. The uppermost lines show the effect of the PbTiO$_3$ seed layer on PZT (52/48) sample (triangular points plotting 700° C. anneal and square points plotting 600° C. anneal) compared to the lower line representing a sample not having the PbTiO$_3$ seed layer (diamond points).

FIG. 14A is an illustration of X-ray diffraction data of Ti/Pt/PZT (52/48) with varying final temperatures.

FIG. 14B illustrates graphically XRD patterns of PZT (52/48) with PbTiO3 seed layer and the optimized bottom electrode, stylo-epitaxial TiO$_2$/Pt. The effects of different rapid ramp rates with 8, 10, 15% Pb-excess are examined.

FIG. 14C illustrates graphically XRD patterns of PZT (52/48) with PbTiO3 seed layer and the optimized bottom electrode, stylo-epitaxial TiO$_2$/Pt. The effects of different double ramp rates with 8, 10, 15% Pb-excess are examined.

FIG. 14D illustrates graphically XRD patterns showing comparison of the 10% Pb Excess RR and 8% Pb Excess DR XRD peaks at 001/100 and 110/111 peaks (2θ Range 18-25).

FIG. 14E illustrates graphically XRD patterns showing comparison of the 10% Pb Excess RR and 8% Pb Excess DR XRD peaks at 001/100 and 110/111 peaks (2θ Range 28-40).

FIG. 15 illustrates a comparison of XRD patterns for Ti and TiO$_2$-stylo-epitaxial bottom electrodes and with or without a PbTiO$_3$ seed layer.

FIG. 16 is an illustration of Xray diffraction data of a series of preferred embodiments with a PbTiO$_3$ seed layer using Rapid Ramp and Double Ramp with varying Pb excess in the PbTiO$_3$ solution.

FIG. 17A graphically illustrates a comparison of preferred embodiments utilizing the Double Ramp 8% Pb Excess versus Rapid Ramp 10% Pb Excess XRD peaks at 001/100 and 110/111 peaks shown for 2θ in the range of 20.5 to 23.5.

FIG. 17B is a continuation of 17A and graphically illustrates a comparison of the Double Ramp 8% Pb Excess and Rapid Ramp 10% Pb Excess XRD peaks at 001/100 and 110/111 peaks shown for 2θ in the range of 23.5 to 40.

FIG. 18A illustrates Lotgering factor comparison of Ti/Pt and stylo-epitaxial-TiO$_2$/Pt bottom electrodes with PbTiO$_3$ seed layers in the (001) orientation. TiO2/Pt/PbTiO3/PZT is stylo-epitaxial.

FIG. 18B illustrates Lotgering factor comparison of Ti/Pt and stylo-epitaxial-TiO$_2$/Pt bottom electrodes without PbTiO$_3$ seed layers in the (001) orientation.

FIG. 19A illustrates cantilever deflection data showing average displacements with Rapid Ramp with PbTiO$_3$ exhibiting largest deflections, almost 90% improvement over Double Ramp with PbTiO$_3$.

FIG. 19C illustrates cantilever deflection data showing cantilever displacements for PZT (52/48).

FIG. 19D illustrates cantilever displacements for PZT (52/48) with Seed Layer 600° C. Rapid Thermal Anneal (RTA).

FIG. 19E illustrates cantilever displacements for PZT (52/48) with Seed Layer 700° C. Rapid Thermal Anneal (RTA).

FIG. 20 illustrates preliminary cantilever deflection comparing % increase of cantilever deflection between Rapid Ramp and Double Ramp with PbTiO3 compared to Rapid Ramp annealing without PbTiO3.

FIG. 21 illustrates top view of Wyko Optical Profilometry image of cantilever array demonstrating extreme out of plane deflection.

FIG. 22 illustrates a Scanning Electron Microscopy (SEM) image of cantilever array demonstrating extreme out of plane deflection.

FIG. 23 is a schematic illustration of a cross-sectional view of a substrate 11 covered with an amorphous layer of material 12.

FIG. 24 is a cross-sectional illustration showing schematically the addition of layer 13.

FIG. 26 is a schematic illustration of a cross-sectional view of layers 11, 12 and 14 with the concept of thermal oxidation or nitridation used to form a textured oxide/nitride template.

FIG. 27 illustrates, as a preferred embodiment example, a TiO₂ layer 14 and a depiction of the atomic packing of the rutile TiO₂ structure as viewed along the [100]-direction.

FIG. 28 is an illustration of an X-ray diffraction pattern of a rutile structure {100}-textured TiO₂ film formed by thermal oxidation of the {0001}-textured Ti film for which the XRD pattern is also shown.

FIG. 29 is a cross-sectional illustration showing schematically the addition of {111} stylo-epitaxy electrode layer 15.

FIG. 30A illustrates, as a preferred embodiment example, sputter-deposited platinum stylo-epitaxial layer 15 and the registration of the Pt atoms in the (111) plane with the interstices of the TiO₂ rutile oxygen plane as viewed along the [100]-direction. The (111)-Pt and (100)-TiO₂ crystal structure registration occurs on a grain-by-grain basis.

FIG. 30B illustrates an XRD pattern for a {111} stylo-epitaxial platinum layer 15 on {100}-texture TiO₂.

FIG. 34 is a cross-sectional illustration showing schematically the addition of a {001} stylo-epitaxial, textured perovskite ferroelectric layer 17.

DETAILED DESCRIPTION OF PREFERRED EMBODIMENTS

Figure 1:
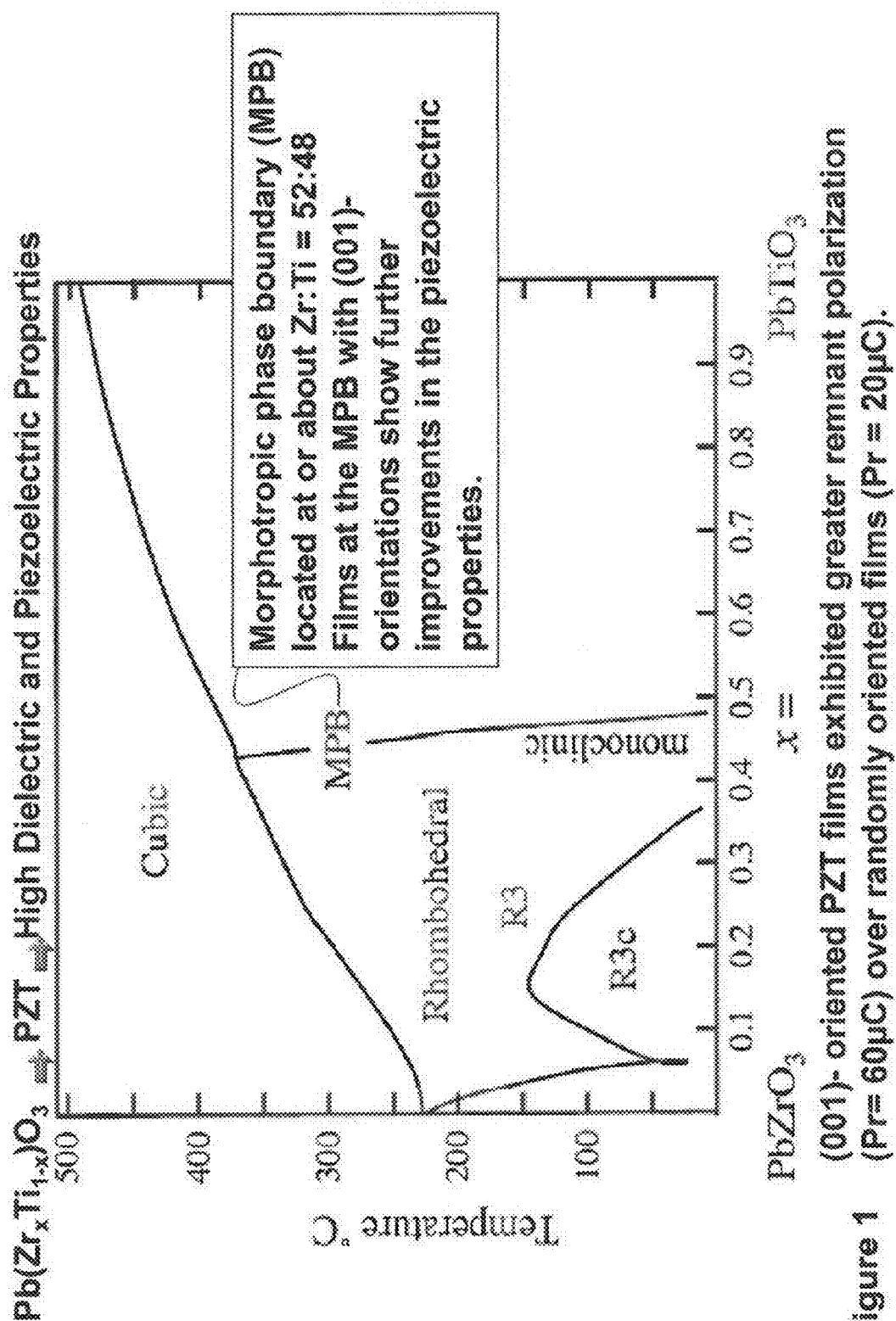
FIG. 1 is a graphical illustration of crystal structures as a function of the ratio of $PbZrO_3/PbTiO_3$, including Morphotropic phase boundary (MPB) located at or about Zr:Ti=52:48. Films in both the tetragonal region of the phase diagram with (001) orientation and films in the rhombohedral region of the phase diagram with (111) orientation show improvements in the piezoelectric properties. Films at the MPB with (001)-orientation show the most improvement in piezoelectric properties.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. The layers and/or regions illustrated in the figures are schematic in nature and their shapes are not intended to illustrate the precise shape of a region of a device and are not intended to limit the scope of the present invention. The layers are not drawn to relative scale. Moreover, variations from the shapes are to be expected. Thus, embodiments of the present invention should not be construed as limited to the particular shapes of regions illustrated herein but are to include deviations in shapes. For example, a region illustrated as a rectangle may have a variety of configurations without deviating from the present invention and/or may have tapered, rounded or curved features.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

A substance which has a natural charge separation in the absence of a field is called a polar material. As used herein, the terminology "polar" in conjunction with material relates to the orientations of the polar material. Specifically, FIG. 3 shows the orientation of the c-axis of a crystal's structure (with c-axis being defined as perpendicular to the c-plane) relative to the growth plane, which in this example is the sample surface. In the polar orientation example shown in FIG. 3, the c-axis is perpendicular to the growth plane.

A piezoelectric develops a voltage (or potential difference) across two of its faces when compressed (useful for sensor applications), or physically changes shape when an external electric field is applied (useful for actuator applications). The dielectric constant of PZT can range from approximately 300 to 3850 depending upon orientation and doping.

Lead zirconate titanate, $Pb(Zr_xTi_{(1-x)})O_3$, (also known as PZT) exhibits piezoelectric properties and is used to create large force, large displacement actuators and sensors. PZT is one of the most economical ceramics that exhibits a high piezoelectric coefficient, allowing for the use of lower voltages to achieve the same actuator performance metrics. It is highly desired to achieve highly {001} textured PZT (52/48). Proper control of the crystalline texture allows an increase in the piezoelectric stress constant as shown by N. Ledermann, et. al. "Textured, piezoelectric $Pb(Zr_x,Ti_{(1-x)})O_3$ thin films for MEMS: integration, deposition, and properties." Sensors and Actuators A 105, 162 (2003), with random order PZT (52/48) –e31,f of ~7 $C/m^2$ and (100) oriented PZT (52/48) exhibiting 12 $C/m^2$, close to 60%. These improvements will result in substantial improvements in device performance including lower actuation voltages, higher force actuation, and lower power consumption. Through the use of a chemical solution derived $PbTiO_3$ seed layer based on the work of Paul Muralt et. al. "Texture Control of $PbTiO_3$ and $Pb(Zr,Ti)O_3$ Thin Films with $TiO_2$ Seeding." Journal of Applied Physics Vol. 83, Issue 7, pp. 3835-3841 (1998), combined with optimal processing conditions for the solution chemistry, platinum (Pt) electrode texture, and rapid thermal annealing (RTA) conditions of the PZT films, PZT (52/48) thin films having a {001} texture in excess of 95% are achievable.

The piezoelectric coefficient of PZT is inherently linked to its crystalline structural quality. The highest magnitude piezoelectric coefficients are observed at the PZT morphotropic phase boundary (MPB), shown diagrammatically in FIG. 1, where the crystal structure changes abruptly between the tetragonal and rhombohedral symmetry (see FIG. 2). At the MPB, the dielectric permittivity and piezoelectric coefficients reach a maximum. The MPB is located approximately at $PbZr_{0.52}Ti_{0.48}O_3$, also known as PZT (52/48), composition, as shown in FIG. 1.

Highly beneficial results have been obtained from achieving highly {001} textured PZT (52/48). Proper control of the crystalline texture provides a 30-50% increase in the piezoelectric stress constant as shown by Ledermann et. al. with random order PZT (52/48) –e31,f of ~7 $C/m^2$ and (100) oriented PZT (52/48) exhibiting 12 $C/m^2$, close to 60%. These improvements result in substantial improvements in device performance including lower actuation voltages, higher force actuation, and lower power consumption. FIG. 5A schematically illustrates a preferred embodiment wafer stack 10 showing the various layers with a standard Ti/Pt bottom electrode. FIG. 5B schematically illustrates a preferred embodiment wafer stack 10A with a standard Ti/Pt bottom electrode.

Experiment/Calculations

Sample Preparation

As an example of a preferred embodiment preparation, a 100 mm diameter, (100) silicon (Si) wafer 11 is coated with 500 nm of thermally deposited silicon dioxide ($SiO_2$) thin film 12. Next, a bottom electrode 13 can be sputter deposited onto the silicon dioxide using a Unaxis Clusterline 200 deposition system. Initial testing involved a bottom electrode comprising a bi-layer of (200 Å) Ti/(850 Å) Pt (referred to hereon as Ti/Pt) where both metal layers may be sputter deposited at approximately 500° C. (see layers 13, 15 in FIG. 5A). Subsequent data involved improvements to this bottom electrode, the process is detailed in Potrepka, et. al., "Pt/TiO$_2$ Growth Templates for Enhances Enhanced PZT Films and MEMS Devices," MRS Proceedings Session S, (mrsf10-1299-s02-04), Vol. 1299, (2010) (hereby incorporated by reference) (see layers 14, 15 in FIG. 5B).

After the Ti deposition, an oxygen anneal was performed at approximately 750° C., which may be performed, for example, in a Bruce Technologies tube furnace, to convert the Ti to TiO$_2$. The TiO$_2$ (shown as 14 in FIG. 10A) acts as a seed layer for {111} Pt nucleation with a full width half maxima (FWHM) between 1.7°-2.3°. A 100 nm Pt film (labeled 15 in FIG. 5B) was deposited at 500° C. using the Unaxis Clusterline 200 deposition system. The highly {111} textured Pt provides a template for {111} textured PZT film growth (referred to herein as TiO$_2$/Pt). The Ti and the Pt may be deposited in separate dedicated process modules in the clusterline deposition system.

Chemical solution deposition (CSD) of the PbTiO$_3$ seed layer 16 and PZT (52/48) were used to deposit the piezoelectric thin films onto the metalized silicon substrates. CSD processing allows for stoichiometry control, reduced processing temperatures, and is relatively cost effective for development and mass production. The CSD solutions were prepared using a process modified from that originally described by K. D. Budd, S. K. Dey, & D. A. Payne. "Sol-Gel Processing of PbTi03, PbZr03, PZT, and PLZT Thin Films." Electrical Ceramics, Br. Ceram. Proc., 107-121, (1985) (hereby incorporated by reference).

A 30% lead (Pb)-excess PbTiO$_3$ (labeled as PT seed layer 16) was prepared by mixing Lead (III) Acetate Trihydrate from Puratronic with 2-Methoxyethanol (2-MOE) from Sigma Aldrich. It was then refluxed for 20 minutes at 120° C. with flowing nitrogen (N$_2$) in a Heidolph Laborata 4000 rotary evaporator. A vacuum distillation step was performed to remove impurities, lowering the pressure of the rotary evaporator to between 280-330 mbar, depending on humidity levels, until a white foam appears. Titanium (IV) n-Isopropoxide (70 weight % in n-propanol) from Alfa Aesar was mixed with 2-MOE and allowed to stir on a magnetic spinner while the Pb solution was refluxed and distilled. Once the Pb solution finished the vacuum distillation step, the Ti solution was combined with the Pb solution and was allowed to reflux for 210 minutes. A second vacuum distillation at 925 mbar was performed followed by a N$_2$ purge. The solution was transferred to a storage container where 4 volume % formamide was slowly added to the solution to act as a drying control agent. The final solution was stirred overnight using a magnetic stirrer.

For preparation of the PZT solution, a similar process may be used as that used to make PbTiO$_3$. The difference is the addition of the Zirconium (IV) n-propoxide precursor from Alfa Aesar to the Titanium (IV) n-Isopropoxide and 2-Methoxyethanol solution. This mixture was allowed to stir while the Pb solution was refluxed and distilled. Both solutions were then combined in the glovebox and the procedure described in the foregoing was followed.

Figure 6C:
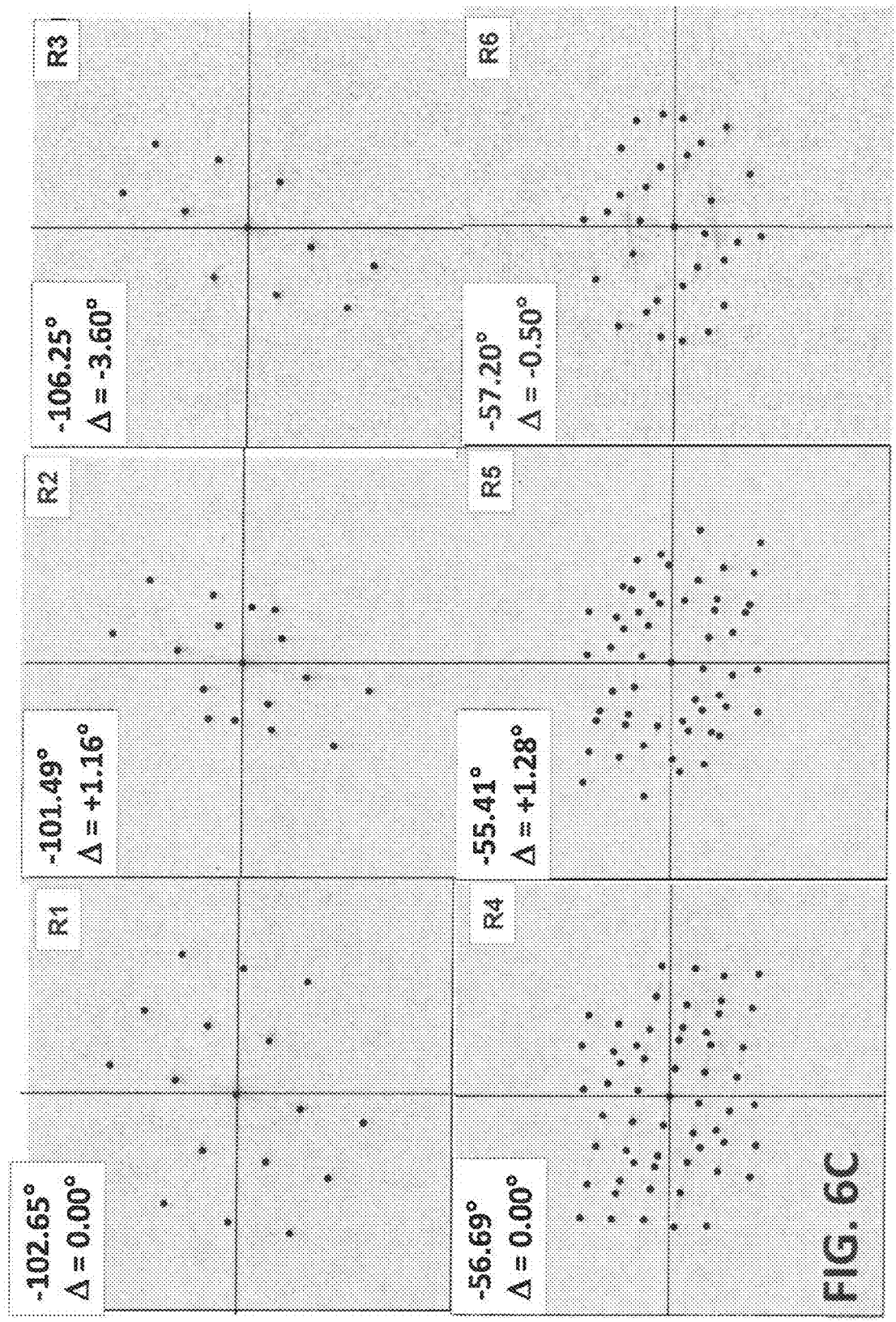
FIG. 6C is an illustration representing the Fast Fourier Transforms and relative angular rotations of the regions R1 to R6 of the FIG. 6B.
Figures 6D, 6E:
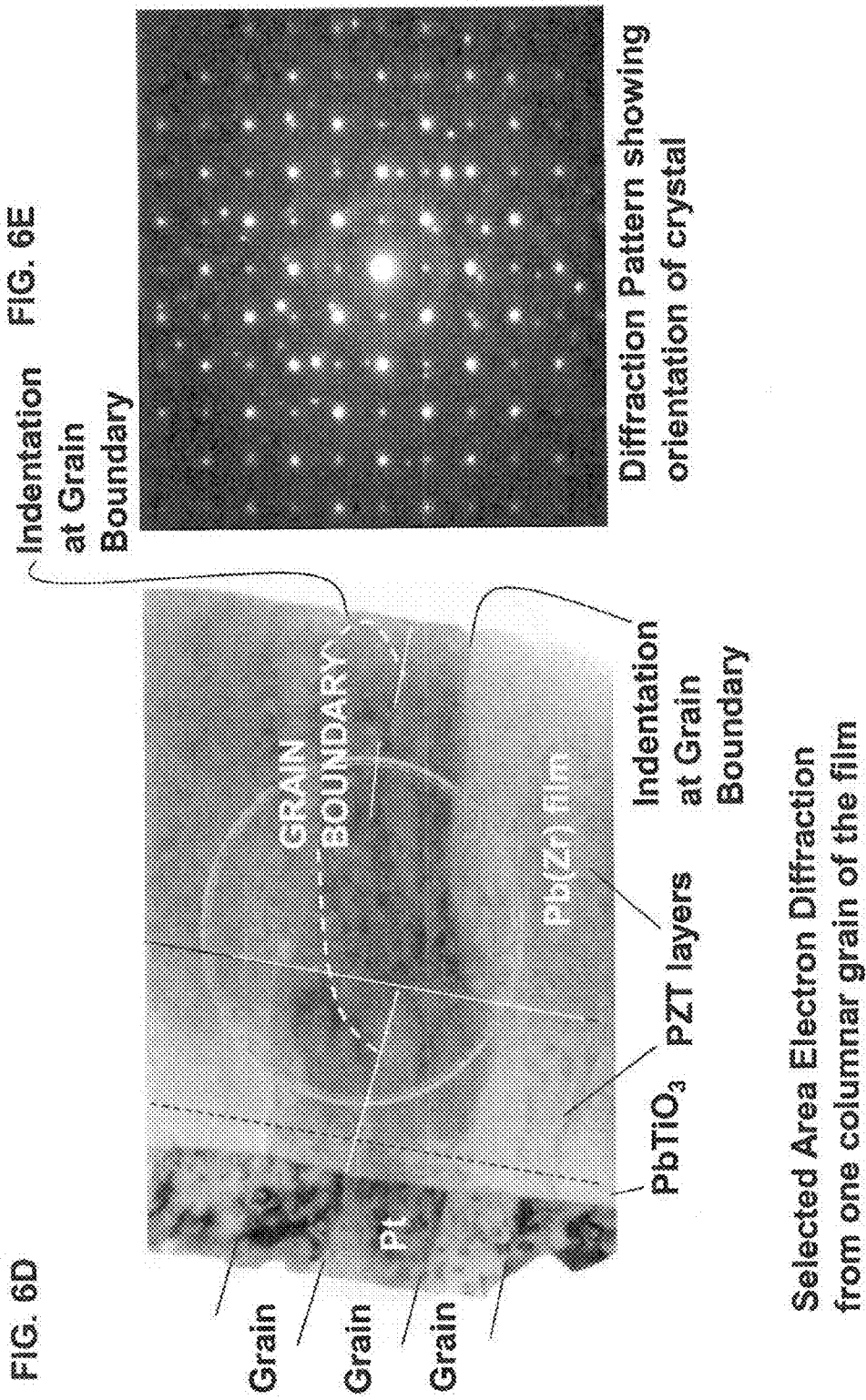
FIG. 6D is TEM cross-section image showing the granular PZT layer in registration with the granular $PbTiO_3$ layer in registration with the granular Pt layer in registration with the granular $TiO_2$ layer.
FIG. 6E is a selected area electron diffraction pattern of two (001)-oriented PZT grains separated by a low angle grain boundary resulting from a small angle rotation of one grain with respect to the other grain.
Figure 6F:
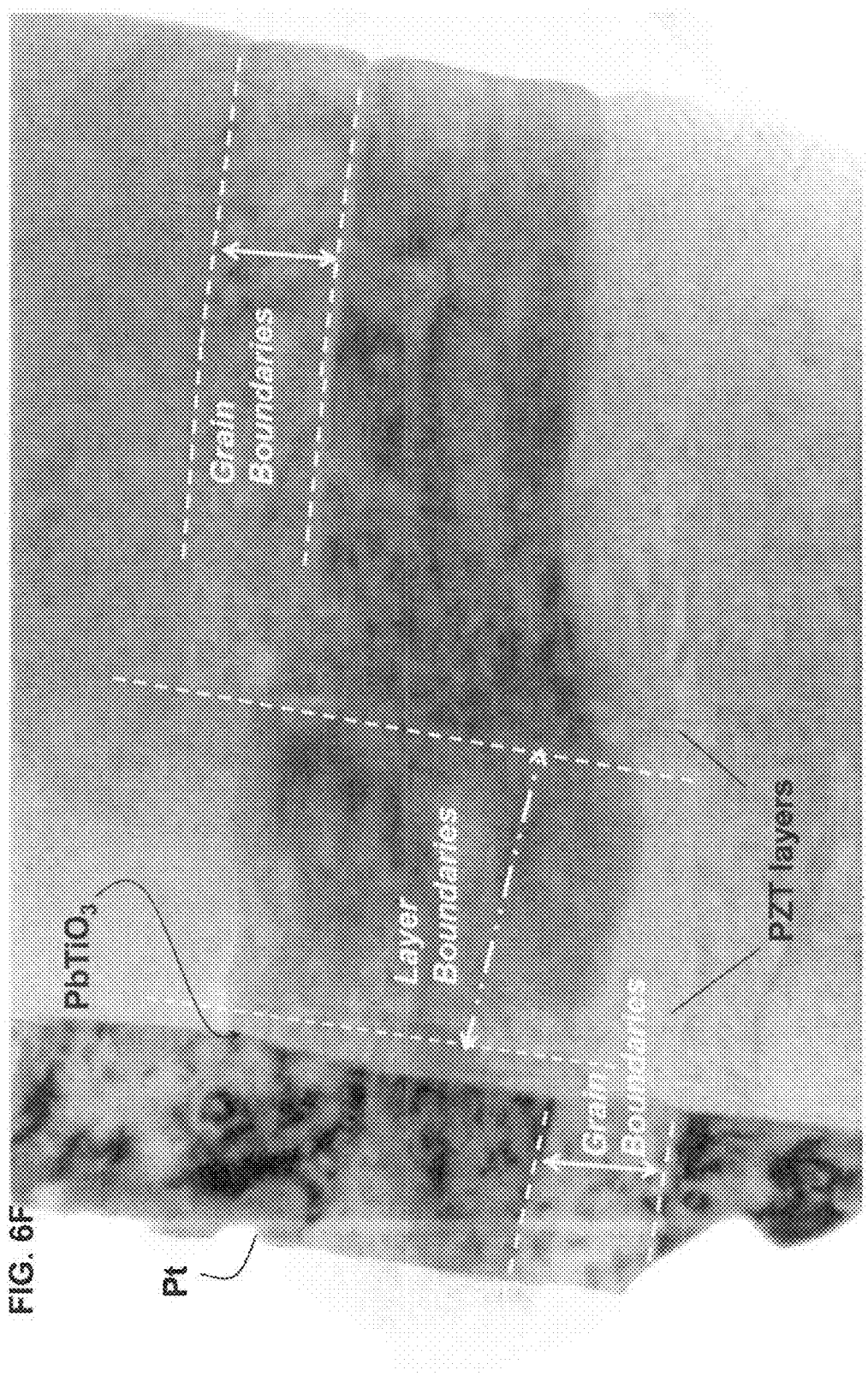
FIG. 6F is an enlarged view of FIG. 6C.
Figure 9A:
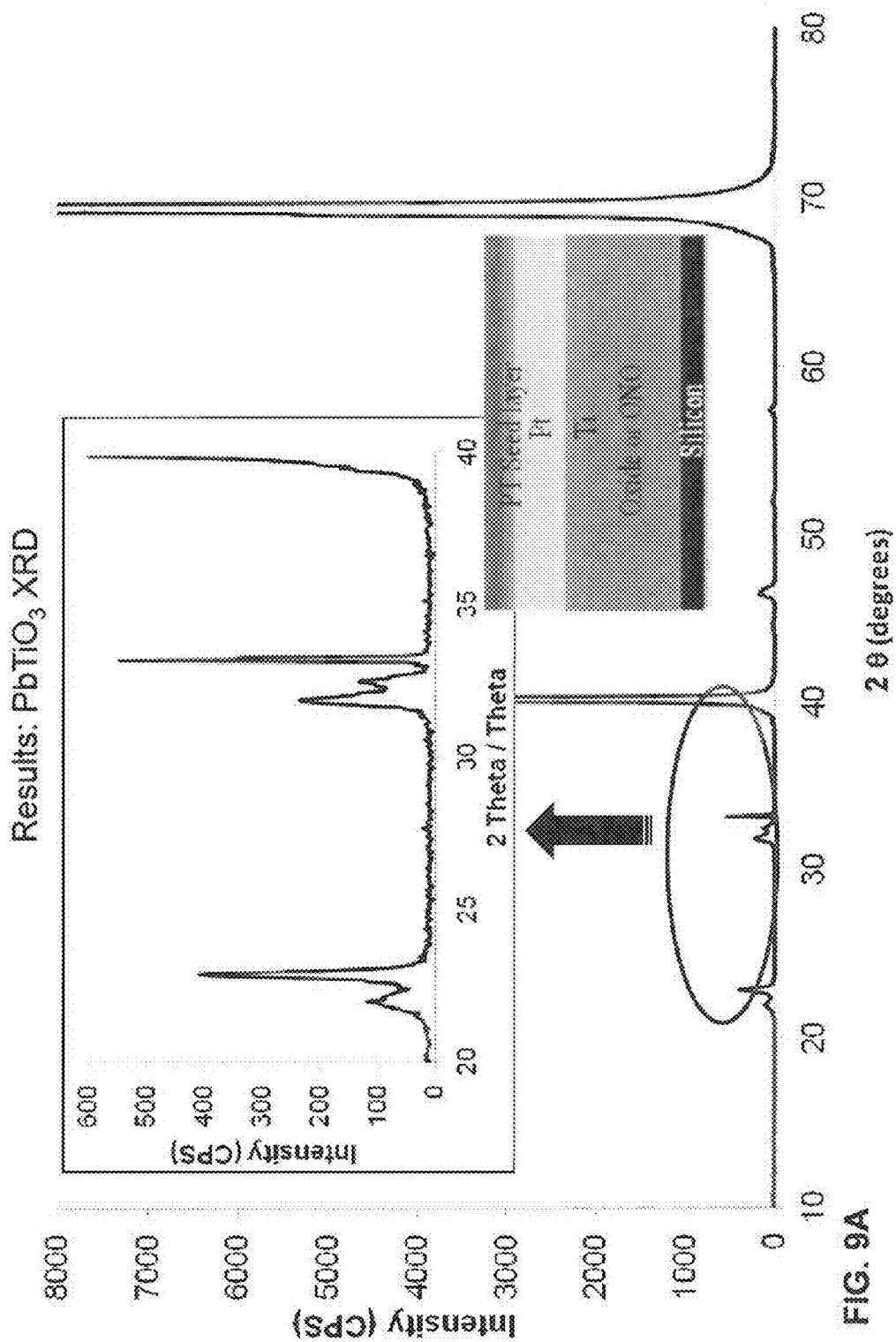
FIG. 9A illustrates X-ray diffraction data for PbTiO$_3$ further showing a magnified region in the range of 2θ/θ of 20-40.
Figure 9B:
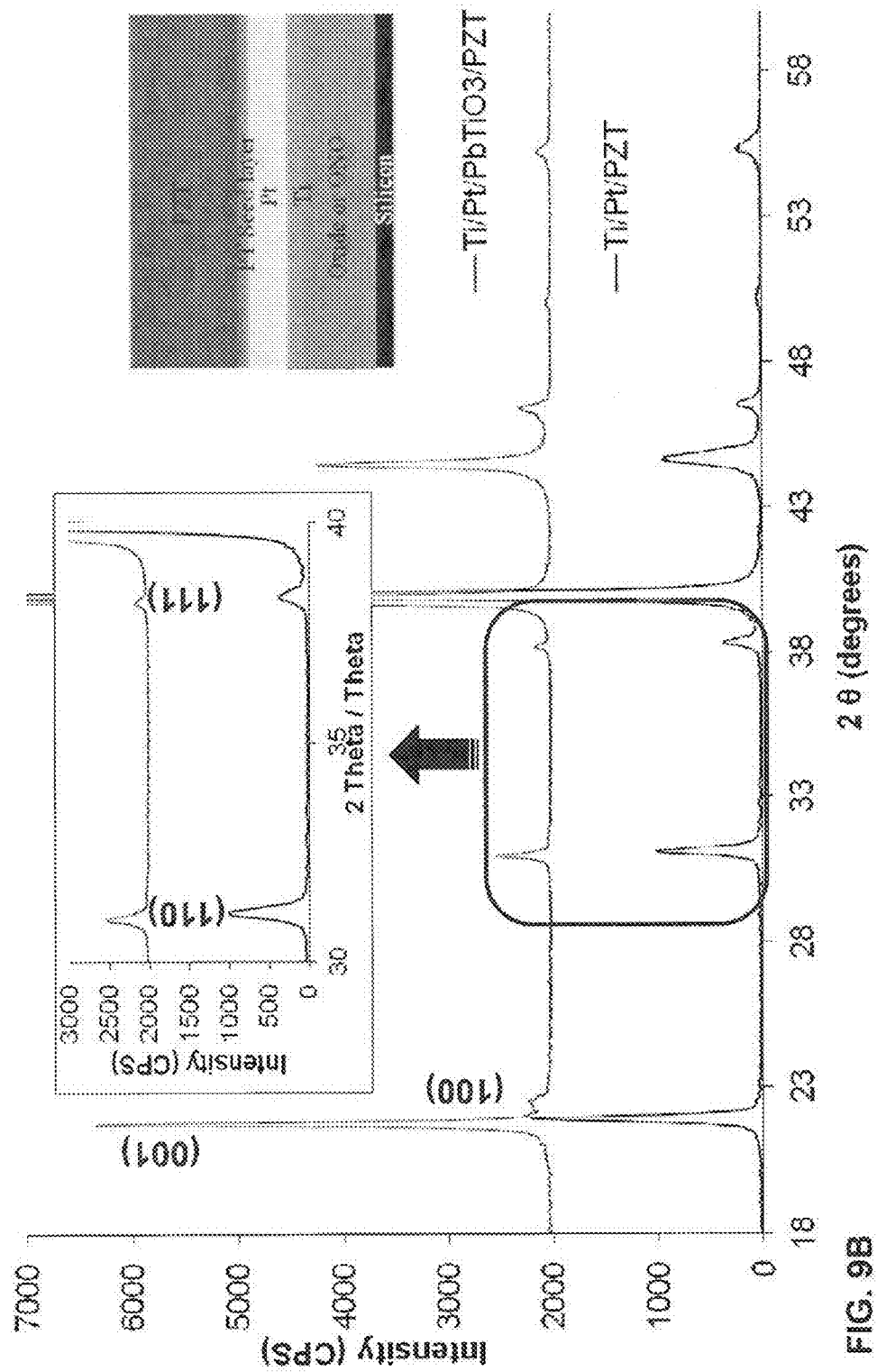
FIG. 9B illustrates X-ray diffraction data illustrating a comparison of PZT (52/48) with and without PbTiO$_3$.

The PbTiO$_3$ 16 and PZT 17 films were deposited via a chemical solution deposition process using combinations of liquid dispensing the solution, wafer spinning, pyrolysis, and annealing (see FIG. 6B). To promote {001}-textured PZT growth, a single PbTiO$_3$ seed layer, ~230 Å, was deposited on the Pt coated substrate. Using a 10 ml syringe filled with PbTiO$_3$ solution, the solution was dispensed through a 0.1 μm filter onto the entire surface of a stationary highly {111}-textured Pt coated substrate. The sample was spun with a Bidtec SP100 spin coater at a speed of 3000 rpm for 45 seconds. Next, a pyrolysis step was performed on a Wentworth Laboratories vacuum hot plate at 350° C. for 2 minutes to remove a majority of the organic species creating a film with mid-range order. After pyrolysis, a rapid thermal anneal (RTA) of 700° C. with a ramp of 4° C./sec was performed to complete the crystallization step. The same steps were repeated for the PZT (52/48) deposition (shown as layer 17) except a spin speed of 2500 rpm for 45 seconds was used to achieve a PZT thickness of ~600 Å per layer.

FIG. 7A illustrates the chemical solution deposition process for control samples without a PbTiO3 seed layer and FIG. 7B illustrates the test samples with the PbTiO$_3$ seed layer (16).

Results and Discussion

PbTiO$_3$ Tests Using a Ti/Pt Bottom Electrode—

The procedure to test the PbTiO$_3$ required two different solutions, one with acetic acid and one without. Other researchers have reported improved properties in PbTiO$_3$ solutions with an added 7 volume % acetic acid. The acetic acid acts as a catalyst during the fabrication of the PbTiO$_3$ solution and also compensates for the lead loss during thermal treatments.

Upon deposition of the PbTiO$_3$ solution, with or without the addition of acetic acid, the RTA conditions were examined. Temperatures of 600° C. and 700° C. with dwells of 60 seconds in an atmosphere of flowing O$_2$ with a rate of 5 sccm were studied to ensure full crystallization of the film. Following the PbTiO$_3$ layer crystallization step, 5000 Å of PZT (52/48) (labeled as 17 in FIG. 5B) was deposited using the same process described above (FIG. 7B).

The initial seed layer tests involved coating PZT (52/48) thin films onto 25 cm square substrates. After deposition, simple 500×500 μm square capacitors were fabricated to measure the electrical properties as a function of the different PbTiO$_3$ seed conditions tests. After examining the results, the two best PbTiO$_3$/PZT (52/48) conditions were chosen to fabricate cantilever arrays and thus determine the effective piezoelectric coefficient, $e_{31,eff}$, by measuring the quasi-static piezoelectric induced deformation of thin film cantilevers. Initially, the different processing conditions were characterized by examining the crystallographic structure of the PZT thin films by using x-ray diffraction (XRD) collected on a Rigaku0 Ultima III Diffractometer with Bragg-Brentano Optics.

X-ray crystallography is a method of determining the arrangement of atoms within a crystal, in which a beam of X-rays strikes a crystal and causes the beam of light to spread into many specific directions. From the angles and intensities of these diffracted beams, a crystallographer can produce a three-dimensional picture of the density of electrons within the crystal. X-ray diffraction results in an x-ray beam scattered off the planes of a crystal which creates an interference pattern. To measure an interference maximum, the angle of incidence must be equal to the angle of reflection and the difference in the beam's path from a source to an observer for neighboring planes has to be equal to an integer multiple of the wavelength, the path difference being:

$$2d\sin(\theta)=m\lambda \text{ for } m=1,2\ldots.$$

where d is the spacing between diffracting planes, θ is the incident angle, n is any integer, and is the wavelength of the beam. These specific directions appear as spots on the diffraction pattern called reflections. Thus, X-ray diffraction results from an electromagnetic wave (the X-ray) impinging on a regular array of scatterers (the repeating arrangement of atoms within the crystal). An x-ray diffraction scan is shown in FIG. 8A as a plot of scattering intensity vs. the scattering angle 2θ. The position of peaks appearing on the XRD scan is directly related to distance between crystal planes. The peak positions, intensities, widths and shapes all provide important information about the structure of the material. Integrated intensities of the diffraction peaks are used to reconstruct the electron density map within the unit cell in the crystal. Rocking curve measurements are made by doing a θ scan at a fixed 2θ angle, the width of which is proportional to the range of tilt of the individual crystallites in the film and is therefore used as a gauge of the quality of the film. Only crystallites having reflecting planes (h, k, l) parallel to the specimen surface will contribute to the reflected intensities. If the sample is truly random, each possible reflection from a given set of h, k, l planes will have an equal number of crystallites contributing to it. The sample may be rocked through the glancing angle theta in order to produce all possible reflections.

The XRD results revealed a mixed texture of (001) and random grain orientations in a 2500 Å PbTiO$_3$ thin film (FIG. 8A). The preferred seed layer preferably comprises solely (001) PbTiO$_3$ to achieve a pure (001) orientation in the PZT (52/48) film and this is an area of improvement for further investigation.

Even with the random orientation and mixed texturing in the PbTiO$_3$ layer, the resulting PZT XRD data shows significant improvement in {001} PZT (52/48) orientation. Lotgering factor (f) calculations (equation 1) were performed that demonstrated an improvement from f(001/100)=59.24% texturing to 86.67% (001/100) texturing with the PbTiO$_3$.

For the different growth conditions, very small changes in the polarization-voltage hysteresis loops were observed. Small subtle changes in the saturation polarization, remnant polarization, and coercive fields are attributed to sample variances and are within the assumed standard deviation for these measurements. In contrast, the dielectric properties for the different films shows more significant changes between the processing conditions. The two PbTiO$_3$ solutions that were selected for additional testing were the 700° C. and 600° C. annealed samples with acetic acid due to their higher dielectric constants of 1299 and 1354, respectively.

Figure 11B:
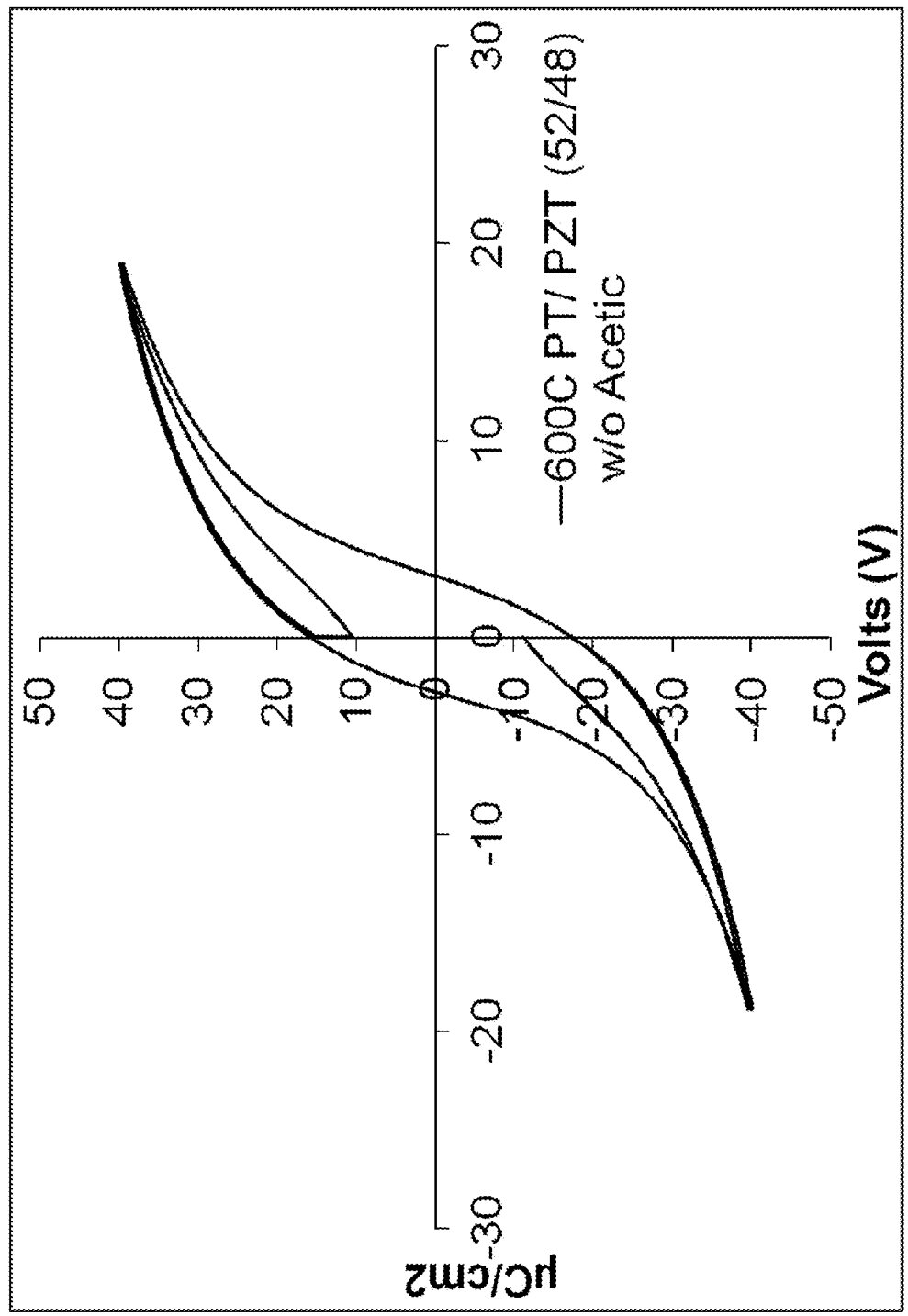
FIG. 11B illustrates PZT 52/48 ferroelectric hysteresis comparison tests showing the PbTiO$_3$ Seed with an Acetic Acid solution additive and processed with a 600° C. RTA.
Figure 11C:
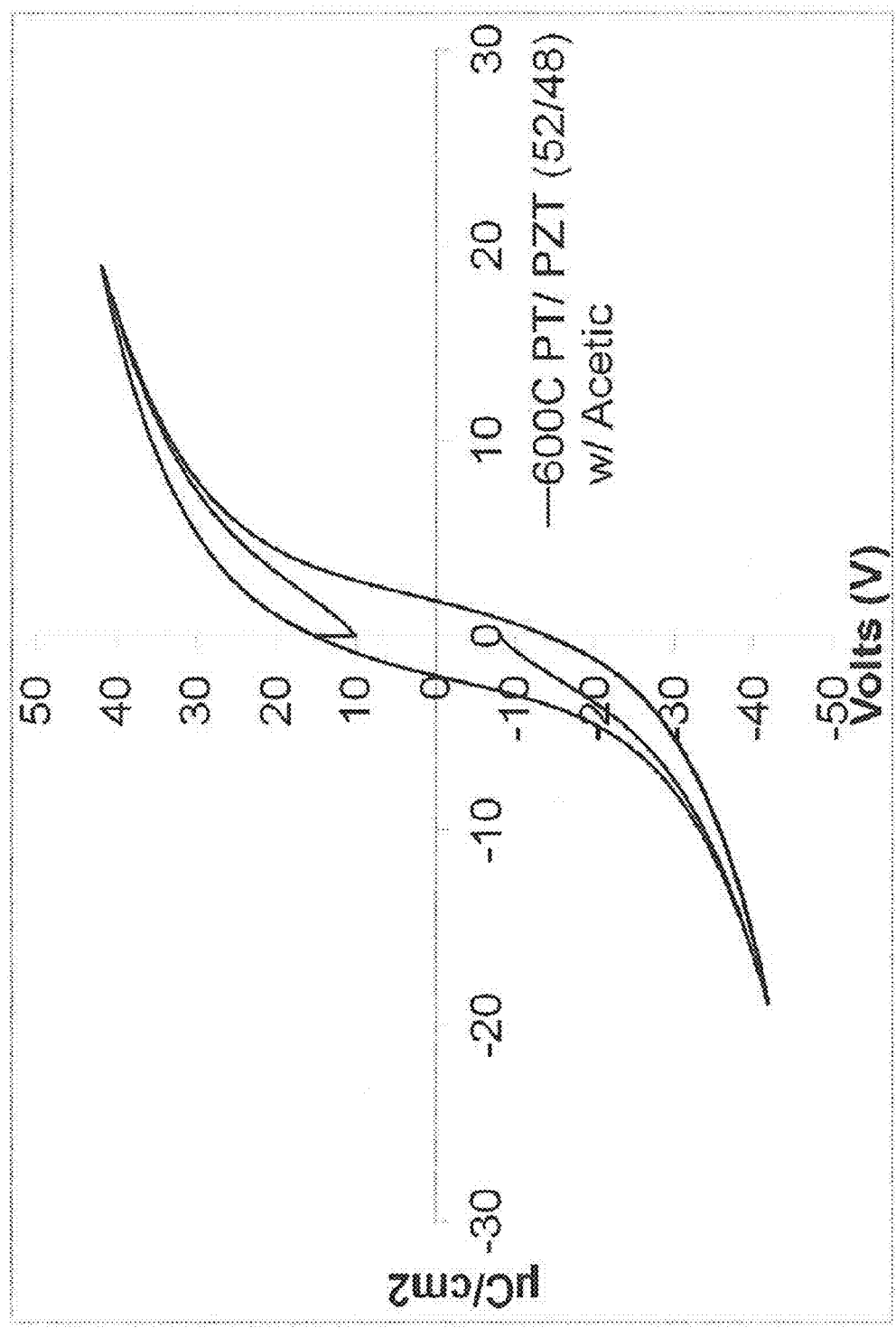
FIG. 11C illustrates PZT 52/48 ferroelectric hysteresis comparison tests showing the PbTiO$_3$ Seed, without an Acetic Acid solution additive, processed using a 600° C. RTA.
Figure 11D:
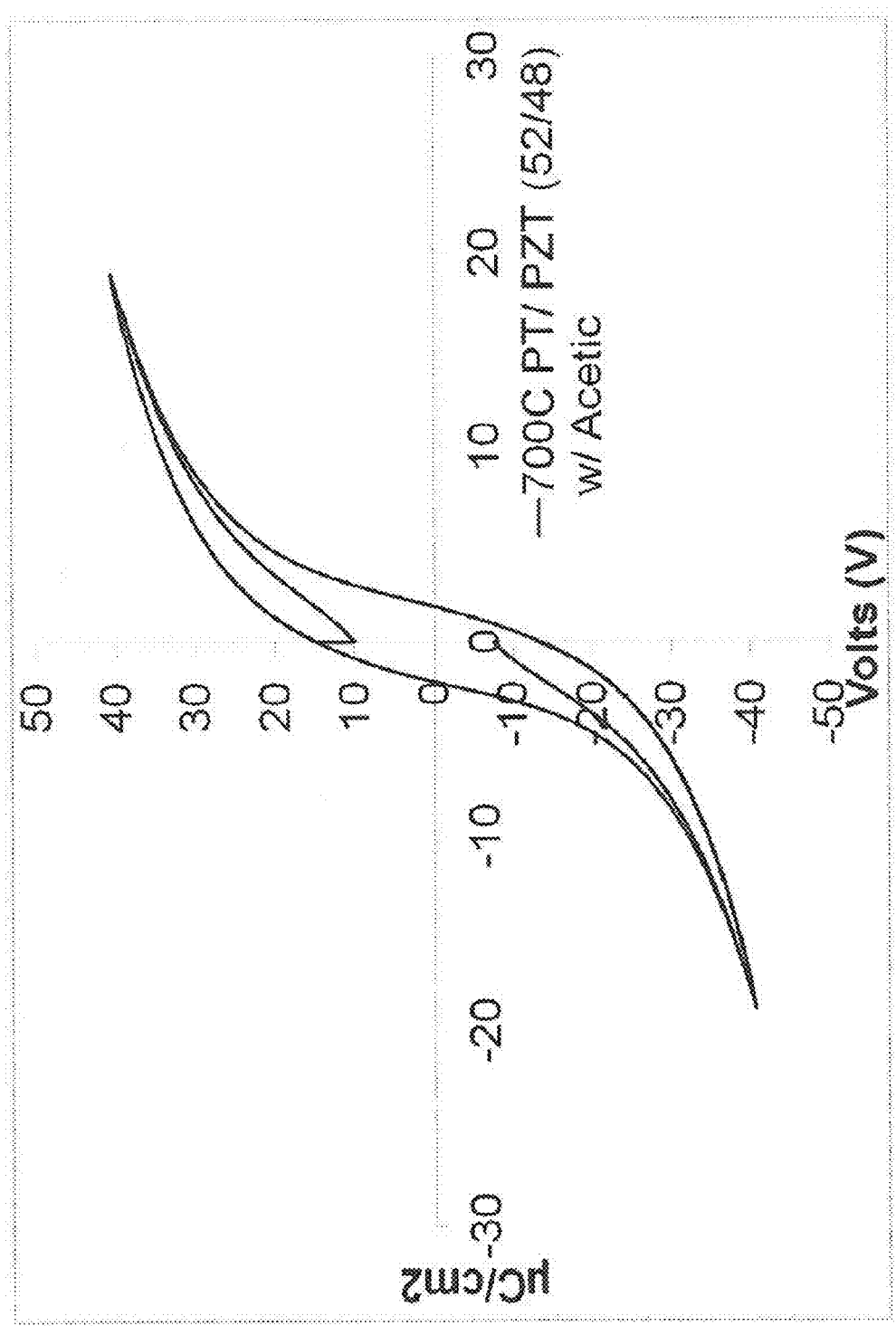
FIG. 11D illustrates PZT 52/48 ferroelectric hysteresis comparison tests showing the PbTiO$_3$ Seed with an Acetic Acid solution additive and processed with a 600° C. RTA.

FIG. 11A-D illustrate PZT 52/48 comparison test results. FIG. 11A is a control sample. FIG. 11B is a sample with a PbTiO$_3$ seed using acetic acid, 500° C. RTA. FIG. 11C is a sample with a PbTiO$_3$ seed without using acetic acid, 600° C. RTA. FIG. 11D is a sample with a PbTiO$_3$ seed using acetic acid, 600° C. RTA.

FIGS. 12 A and 12B illustrates optical profilometery 3-D images of fabricated cantilever arrays with 12A showing a PZT (45-55) control sample on Ti/Pt electrode and 12B showing PZT (52/48) with PbTiO$_3$ seed on Ti/Pt electrode. The change in texture with the use of the PbTiO$_3$ seed results in substantially larger positive (out of plane) static deformations when compared to similar structures without a PbTiO$_3$ seed.

TABLE 1

Cantilever displacement values (m) and the effective piezoelectric coefficient data ($e_{31,eff}$).

| Volts | Ti/Pt/PZT (52/48) | | Ti/Pt/ 600° C. PbTiO$_3$/PZT | | Ti/Pt/ 700° C. PbTiO$_3$/PZT | |
|---|---|---|---|---|---|---|
| (V) | Y (μm) | $e_{31,eff}$ | Y (μm) | $e_{31,eff}$ | Y (μm) | $e_{31,eff}$ |
| 20 | 15 | −4.4 | 32.3 | −8.9 | 33.8 | −9.3 |
| 10 | 12.6 | −7.4 | 24.8 | −13.7 | 21.4 | −11.8 |
| 5 | 8.7 | −10.2 | 14.9 | −16.5 | 15.6 | −18.2 |
| 2 | 6.3 | −18.4 | 11.8 | −32.7 | 12.1 | −33.3 |
| 0 | 2.7 | N/A | 7.9 | N/A | 7.5 | N/A |

After selecting the PbTiO$_3$ conditions, additional 100 mm wafers were processed with the abovementioned seed layer conditions to form cantilever arrays to measure the piezoelectric induced displacement from the three smallest cantilevers (83 μm, 107 μm, and 132 μm lengths, respectively). In previous studies, higher piezoelectric coefficients have been noted in PZT (45/55) compared to PZT (52/48) due to the random crystalline texture in the PZT thin film. FIGS. 12A and 12B illustrate fabricated cantilever arrays during optical profilometry tests to measure displacement (12A in-plane 12B out-of plane). Comparing cantilever displacement in samples with Ti/Pt/PZT (45/55) and Ti/Pt/PZT (52/48) without PbTiO$_3$ demonstrate this once again, since adding the seed layer to the PZT(52/48) yielded a near doubling of the displacement compared to the PZT (52/48) control sample, and a 20% improvement over the PZT (45/55) control sample. The greatest improvement was observed in the Ti/Pt/PbTiO$_3$ (with acetic acid)/PZT (52/48) that was annealed at 700° C. As a result, a 700° C. RTA was chosen for all subsequent experiments with the PbTiO$_3$ seed layer. One additional note is that although the cantilevers were prepared in similar techniques and the cross-sections were very similar, the static deformations of the samples with the seed layers were dramatically different from the control sample. The added texture component in the samples with the PbTiO$_3$ seed alters the overall stress gradient resulting in a shift from a negative (in-wafer) curvature to a positive (out-of-wafer) curvature. The change noted above can have a dramatic influence on the functionality of certain MEMS devices.

FIG. 13 graphically illustrates cantilever displacements showing the effect of the PbTiO$_3$ seed layer on PZT (52/48) (triangular points plotting 700° C. anneal and square points plotting 600° C. anneal) compared to not having the PbTiO$_3$ seed layer (diamond points).

The Lotgering factor (f) is defined as follows:

$$f = \frac{P - Po}{1 - Po}$$

where $P_O$ is the XRD intensity values based upon a standard $P_1$ is the XRD intensity values based upon a standard $I_{(001/100)}$ is the intensity of (001) and/or (100) peaks $\Sigma I_{(hkl)}$ is the sum of all PZT peaks

TABLE 2

Comparison of PZT (52/48) with (001)/(100) Lotgering Factors

| Annealing Temperature | Lotgering Factor (f) % |
|---|---|
| 680° C. | 66.87% |
| 700° C. | 54.79% |
| 720° C. | 10.97% |
| 740° C. | 64.86% |

PbTiO$_3$ Tests Using a Ti/Pt Bottom Electrode-PZT RTA Conditions

Changes in the RTA conditions will have a major impact on Pb-loss during thermal treatment that significantly affect PZT orientation. A study was performed with 9 samples of Ti/Pt/PZT and the final RTA temperature was varied by 20° C. between 580° C.-740° C. with a RTA ramp rate of 4° C./sec. At temperatures below 680° C., the pyrochlore phase is constantly present. The Pb-deficient pyrochlore phase reduces the piezoelectric properties of PZT thin films when present by pinning ferroelectric domain centers and opposes the dominating polarization[i]. The best orientations were observed at 700° C. and 720° C. For these two temperatures of interest, 700° C. shows a diminished (110) and larger (111) PZT peaks, whereas at 720° C. the reverse is observed.

FIG. 14A is an illustration of X-ray diffraction data of Ti/Pt/PZT (52/48) with varying final rapid thermal annealing (RTA) temperatures.

PbTiO$_3$ Tests Using a TiO$_2$/Pt Bottom Electrode

To further improve the PZT texture, the bottom electrode metallization was changed from Ti/Pt to TiO$_2$/Pt. The higher quality Pt results in significant improvements in the PZT orientation with the highly {111}-texture Pt. See, for example, Provisional Application No. 61/547,879 entitled "Thermally Oxidized Seed Layers for the Production of {001} Textured Electrodes and PZT Capacitors," by Dr. Glen Fox, et al., hereby incorporated by reference. Furthermore, as shown in FIG. 14A, the Lotgering factors (f) of (001/100) orientations on samples using a PbTiO$_3$ seed layer show significant improvements on the TiO$_2$/Pt electrodes. Overall, the {001} Lotgering factor can be increased to at least 90% using the combination of highly textured Pt electrodes and a PbTiO$_3$ seed layer. Further, improvements were shown with Ti/Pt/PZT, Ti/Pt/PbTiO$_3$/PZT, TiO$_2$/Pt/PZT, and TiO$_2$/Pt/PbTiO$_3$/PZT of f=59.24%, 86.67%, 10.33%, and 96.17%, respectively. The sample TiO$_2$/Pt/PZT showed a decrease in (001/100) orientation due to the highly (111) oriented Pt and the PZT templating off of the Pt. The f of (111) PZT orientations for the above samples were f(111)=8.07%, 14.62%, 50.38%, and 16.02%. This shows that the PbTiO$_3$ seed layer is playing a significant role in (001) orientation of PZT.

TABLE 3

Lotgering factors (f) of the varying thin films using PZT (52/48).

| Sample Layers | Lotgering Factor (f$_{(001)/(100)}$) % | Lotgering Factor (f$_{(111)}$) % |
|---|---|---|
| Ti/Pt/PZT | 59.24% | 8.07% |
| Ti/Pt/PbTiO$_3$/PZT | 86.67% | 14.62% |
| TiO$_2$/Pt/PZT | 10.33% | 50.38% |
| TiO$_2$/Pt/PbTiO$_3$/PZT | 96.17% | 16.02% |

FIG. 15 illustrates a comparison of XRD patterns using the different bottom electrodes and with or without a PbTiO$_3$ seed layer.

RTA Ramp Rate PZT with TiO$_2$/Pt Bottom Electrode Studies

With improved conditions for the PbTiO$_3$ and TiO$_2$/Pt identified, optimization of the thermal treatment of PZT was studied. It is known that slow RTA ramp rates of 4° C./sec can be performed as well as fast ramp rates of over 100° C./sec or even furnace annealing of the PZT to acquire high orientation control. The effect of fast ramp rates was studied as well as the effect of varying Pb-excess in PZT solutions. PZT films deposited from solutions with 8, 10, and 15% Pb-excess were analyzed under the following RTA ramp processes. The two RTA ramp processes selected were "Rapid Ramp" (RR) and "Double Ramp" (DR). In the rapid ramp process, the sample temperatures were ramped up and down as fast as possible using a A.G. Associates Heatpulse 610 RTA. For these experiments, the temperature ramp (up and down) was 199° C./sec with a dwell at 700° C. for 60 seconds. Similarly, in the double ramp process, the temperature ramp (up and down) was 199° C./sec with a dwell 1 at 550° C. for 2 minutes followed by a ramp and dwell 2 at 700° C. for 30 seconds. The anneal at 550° C. allows the PZT to crystallize at low temperature under conditions that result in reduced PbO evaporation from the sample surface but still provide the definition of the crystalline texture. The 700° C. portion of the anneal allows grain growth and removal of other growth defects. In both cases, the software control of the RTA was terminated once the samples cooled to 350° C. XRD data was gathered to determine the best orientation in PZT films under the conditions described.

TABLE 4

Different RTA processes studied.

| RTA Process | Ramp Rate Up | Hold Temp. and Time | Ramp Rate Down |
|---|---|---|---|
| Slow Ramp | 4° C./sec | 700° C. for 60 sec | 4° C./sec |
| Rapid Ramp (RR) | 199° C./sec | 700° C. for 60 sec | 199° C./sec |
| Double Ramp (DR) | 199° C./sec | 550° C. for 120 sec | Second Ramp Up |
|  | 199° C./sec | 700° C. for 30 sec | 199° C./sec |

FIG. 16 illustrates XRD patterns of PZT (52/48) with PbTiO$_3$ seed layer and the optimized bottom electrode. The effects of different ramp rates with 8, 10, 15% Pb-excess are illustrated.

Performing the rapid ramp and double ramp anneals on samples with the optimized bottom electrode and PbTiO$_3$ seed layer, it was determined that the 10% Pb-excess using a rapid ramp and 8% Pb-excess using a double ramp showed the highest (001) orientation and the greatest reductions in both the (110) and (111) PZT peaks. As illustrated in FIGS. 17A & B, Lotgering factors of the RR and DR were approximately f$_{(001)}$=94.8% and f$_{(001)}$=95.0%, respectively. Ultimately, the difference in (001/100) orientation between 8 and 10% Pb-excess DR annealed samples was very minimal (0.17%) and within the experimental variance and error. Comparing the Lotgering factor for various samples shows a substantial increase in (001) and (001/100) orientations in the PZT thin films (FIG. 18).

FIGS. 17A and B illustrate a comparison of the 10% Pb Excess RR and 8% Pb Excess DR XRD peaks at 001/100 and 110/111 peaks.

FIGS. 18A and 18B illustrate Lotgering factor comparison of Ti/Pt and TiO$_2$/Pt bottom electrodes with and without PbTiO$_3$ seed layers in the (001) orientation.

Similar to earlier experiments, electrical data was recorded on simple capacitors fabricated using wafers coated with PZT processed using the 10% Pb-excess DR and RR annealing conditions on the TiO$_2$/Pt bottom electrodes. From these 500×500 µm square capacitors, the dielectric constants were calculated for samples processed under both annealing conditions. As show in Table 7, the 10% Pb-excess under the DR conditions showed an approximately 13% higher dielectric constant compared to the RR conditions. The values in Table 7 are average values taken on 6 different capacitors on 8 samples (4 samples under the DR conditions and 4 under the RR conditions) to demonstrate reproducibility.

TABLE 7

Dielectric Constant Determination in 10%
Excess PZT (52/48) with PbTiO3 seed layer
52/48 Double Ramp w/Seed 10% Pb Excess 700C RTA

| Pr+ | Pr− | Thickness (µm) | Capacitance (nF) | tan δ | Dielectric Constant |
|---|---|---|---|---|---|
| 17.21 | 15.65 | 0.5 | 5.943 | 0.070 | 1343 |
| 16.87 | 15.37 | 0.5 | 5.27 | 0.066 | 1190 |

Figure 19B:
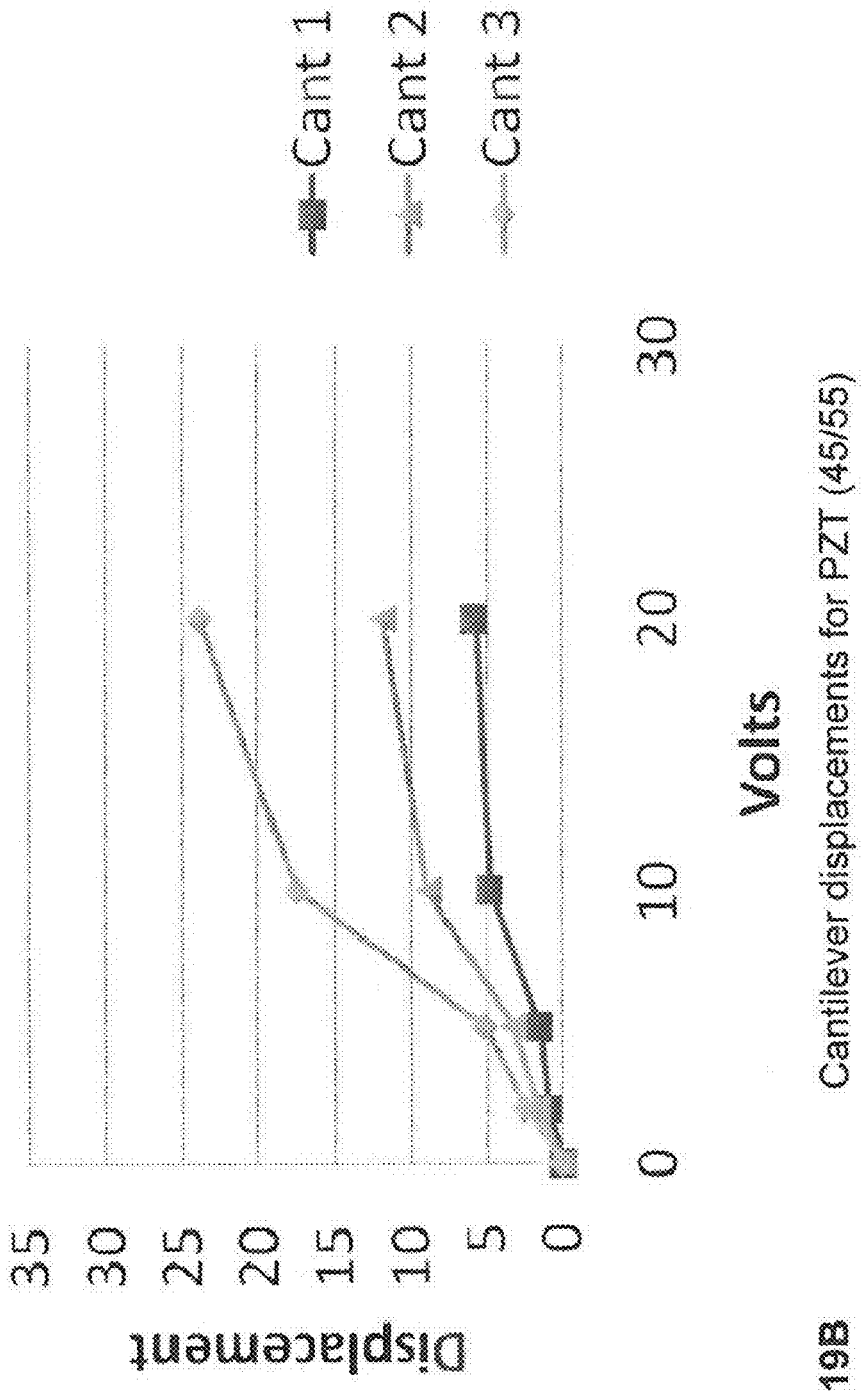
FIG. 19B illustrates cantilever deflection data showing cantilever displacements for PZT (45/55).

Initial cantilever displacement data revealed promising results in the efforts to achieve high displacement with lower actuation voltage devices. Comparing 10% Pb-excess PZT (52/48) under Double Ramp and Rapid Ramp annealing conditions with and without the PbTiO$_3$ seed layer, one can clearly see tremendous improvements from one another (FIGS. 19 and 20). FIG. 19A illustrates preliminary cantilever deflection data showing average displacements with RR with PbTiO3 exhibiting largest deflections, almost 90% improvement over DR with PbTiO3. FIG. 20 illustrates preliminary cantilever deflection comparing percent increase of cantilever deflection between Rapid Ramp and Double Ramp with PbTiO3 compared to Rapid Ramp annealing without PbTiO3. Although the Double Ramp samples showed improved dielectric constant, it was the Rapid Ramp with seed layer samples that showed the greatest deflection with 120% improvement over Rapid Ramp without the PbTiO$_3$ seed layer at 2 volts. The new cantilever lengths measured in these experiments were 27 µm long, and were deflected so far out of plane that taking optical profilometry measurements were difficult (FIG. 21).

FIGS. 21 and 22 illustrate Wyko Optical Profilometry imagery of cantilever array demonstrating extreme out of plane deflection.

In summation, the PbTiO$_3$ seed layer has shown substantial improvements in {001} texturing in PZT (52/48) thin films. Improvements in the quality of the bottom Pt allows for proper nucleation of the PZT thin films and further improves orientation by 12.7% compared to using the PbTiO$_3$ seed layer on a Ti/Pt electrode.

The Pb-excess study provided valuable data on the effects of Pb-excess on PZT orientations. At 15% Pb-excess concentrations, (111) orientations begin to resurface compared to 10% Pb-excess concentrations. This shows that after annealing 10% Pb-excess, the PZT (52/48) is at or near stoichiometry compared to previous solutions of 8% Pb-excess. With the 10% Pb-excess we are accounting for lead loss during thermal treatments but don't have an over abundance to allow of random order phase PZT nucleation to dominate which is consistent with research from R. Burmistrova et. al., "Effect of Lead Content on the Microstructure and Electrical Properties of Sol-Gel PZT Thin Films." Ferroelectrics 271.1 (2002): 51-56, hereby incorporated by reference.

The investigation of the annealing conditions of PZT (52/48) with the PbTiO$_3$ seed layer provided insight on preferred conditions for proper orientation control. The use of the fast ramp does not allow sufficient time for complete transformation of the PZT film. Instead, surface nucleation processes dominate film texture. The PbTiO$_3$ allows the PZT film to nucleate along the [001] direction which propagates through subsequent PZT layers. The improved Pt limits nucleation of (110) and (111) PZT thus allowing even greater 001/100 orientation in the film when combined with the PbTiO$_3$ seed layer.

Comparison studies of cantilever deflections using the optimized bottom electrode and PbTiO$_3$ seed layer in comparison to the non-textured Ti/Pt bottom electrode with and without PbTiO$_3$ seed layers are of interest. Using the pyrolysis conditions of PZT (52/48) raises an option to further suppress the (111) orientation in PZT. Between 300° C. and 500° C. the pyrolysis conditions of sol-gel PZT films greatly influences the (111) and (100) orientations. At temperatures above 400° C., (100) orientations are expected to dominate, whereas at temperatures below 400° C., (111) orientations are observed. In accordance with the principles of the present invention, a stylo-epitaxial structure produces a PZT capacitor structure with a high degree of remanant polarization normal to the substrate surface resulting in a maximum efficiency of polarization switching and piezoelectric coefficients. Stylo-epitaxy is defined as a polycrystalline columnar (stylo) microstructure that consists of epitaxial crystalline layers within each individual column or grain. Generally speaking, stylo-epitaxy crystallographic structure comprises a plurality of column-like structures or crystallites adjacent to each other, wherein each layer within a column-like structure or crystallite exhibits a specific epitaxial relationship to adjoining layers within the column-like structure. Although one embodiment of the stylo-epitaxial structure is presented, it can be generalized for application to other structures.

A preferred embodiment uses the combination of epitaxially related seed layers to produce a polycrystalline tetragonal PZT piezoelectric and ferroelectric capacitor element with well-controlled {001}-stylo-epitaxy. The preferred structure meets the following criteria:

The substrate can comprise of any material that is thermally stable in an oxygen containing environment up to at least 700° C. In an example, the substrate was (100)-oriented single crystal Si (11 in FIG. 23). Other examples for layer 11 include a ceramic such as Al$_2$O$_3$, ZrO$_2$, metal (such as Cu, Ni, stainless steel), or glass (SiO$_2$, etc.).

As illustrated in FIG. 23, the substrate is coated with an amorphous material 12 that does not crystallize when heated to at least 700° C. and has a relatively smooth surface roughness (excluding purposely formed topography) of ≤10 nm rms. For example, the amorphous coating 12 may be thermally grown SiO$_2$ with a thickness of approximately 500 nm. (See FIG. 23). Other examples for layer 12 include SiO$_2$, AlO$_x$, SiO$_2$/SiN$_x$/SiO$_2$ stacks, and layer 12 may be formed by any method compatible with the substrate.

As illustrated schematically in FIG. 24, a textured polycrystalline metal, {0001}-textured Ti (labeled as 13 in FIG. 24) may be, for example, sputter deposited by DC magnetron in Argon onto layer 12 with a thickness in the range of approximately 1 nm to 200 nm (20-50 nm shown in example on right side FIG. 24), to form a self-seeding layer with a volume fraction of oriented grains >90% (approximately) and a {0001}-textured tilt distribution FWHM of less than 7° (approximately). In a preferred embodiment the Ti misorientation distribution, as measured by RC-FWHM, was ≤5°. The Ti is the first layer in the stylo-epitaxy structure and provides a {0001}-textured base for each columnar or stylo-epitaxial grain. Other examples of polycrystalline textured materials suitable for use in place of the Ti layer 13 include polycrystalline textured metals such as Al, Ir, Mg, Co, Ni or Fe. Preferably, such metals must oxidize or form an oxide or a nitride, thermally (as referenced in FIG. 26), to form {100}-textured rutile or {0001} textured wurtzite films with a lattice match to the electrode metal.

Figure 25A:
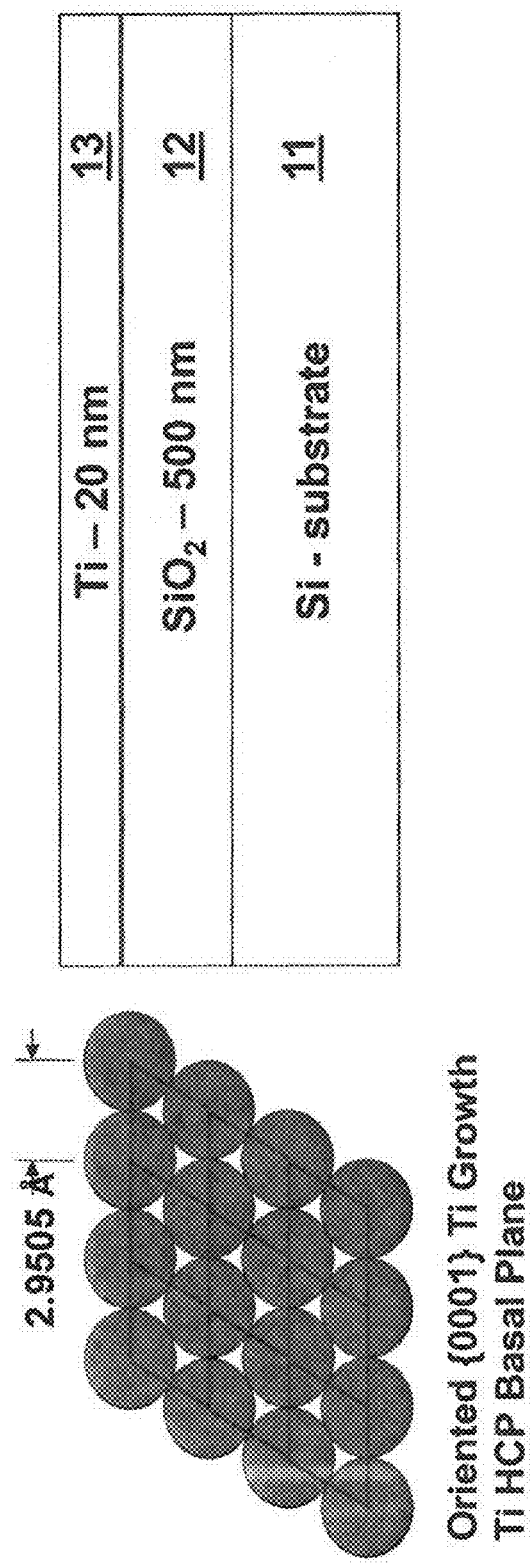
FIG. 25A is a cross-sectional illustration showing schematically the addition of a Ti layer 13 and showing the packing of Ti atoms in (0001) basal plane of Ti metal with the hexagonal close packed crystal structure.
Figure 25B:
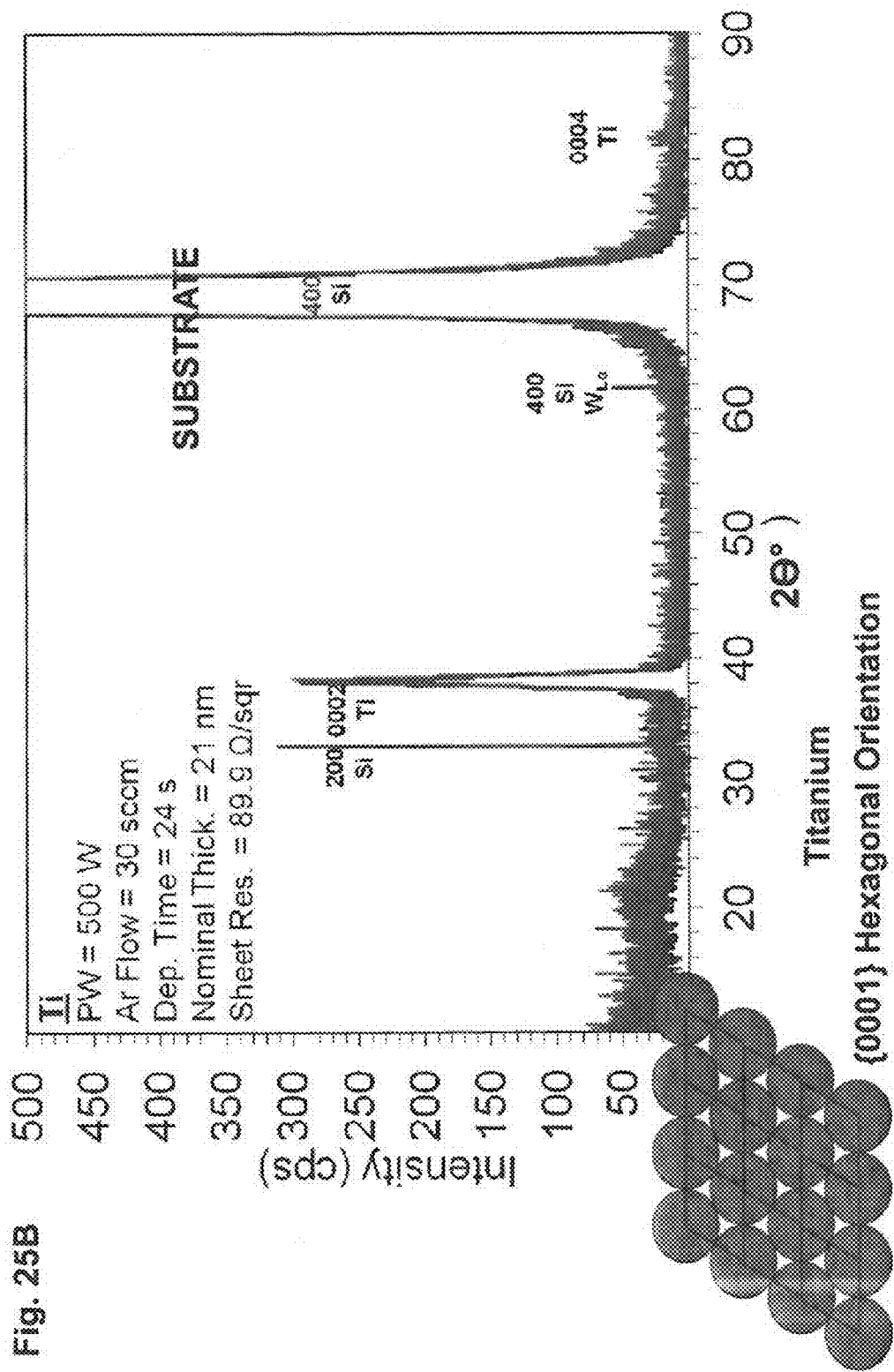
FIG. 25 B illustrates the titanium hexagonal close packed atoms in the (0001) plane and the XRD pattern that results from a Ti film with {0001}-crystallographic-texture.

As illustrated in FIG. 25A, the Ti layer 13 may be sputter deposited for {0001} Ti growth, with a hexagonal lattice structure with a separation between centers of Ti atoms of approximately 2.9505 angstroms.

Referring now to FIG. 26, the textured metal is thermally oxidized to form a textured nitride or oxide of the metal, for example {100}-textured rutile grown from {0001}-textured Ti, transforming from oriented Ti(0001) grains to oriented $TiO_2$ (100) grains. The volume fraction of oriented {100}$TiO_2$ grains is preferably >90% (approximately) and a {100}-textured tilt distribution FWHM is less than 7° (approximately). If oxidation of the Ti film is complete the {100}-textured $TiO_2$ layer becomes the initial layer in the stylo-epitaxial structure. In the alternative, thermal nitridation may be utilized for layer 14 formation. The {0001}-textured wurtzite templates include ZnO, AlN, BN, GaN, etc. The textured oxide/nitride is polycrystalline but {100}-rutile and {0001}-wurtzite planes lie in plane of the substrate (layer 11). In the case of $TiO_2$, the Ti is oxidized by annealing in flowing oxygen gas. The temperature is in the range of 100-1000° C. Oxidation forms $TiO_2$ (layer 14 in FIG. 27) with a rutile structure and {100}-texture with RC-FWHM ≤5°. Oxygen populates the film structure converting the hexagonal Ti lattice to rutile, as described in Hiratani, M., "Ultra-thin Titanium Oxide Film with a Rutile-type Structure," Appl. Surf. Science Vol. 207, pages 13-19 (2003), hereby incorporated by reference. FIG. 27 illustrates a depiction of the rutile $TiO_2$ structure having a layer 14 approximately 30 nm thick.

Figure 31:
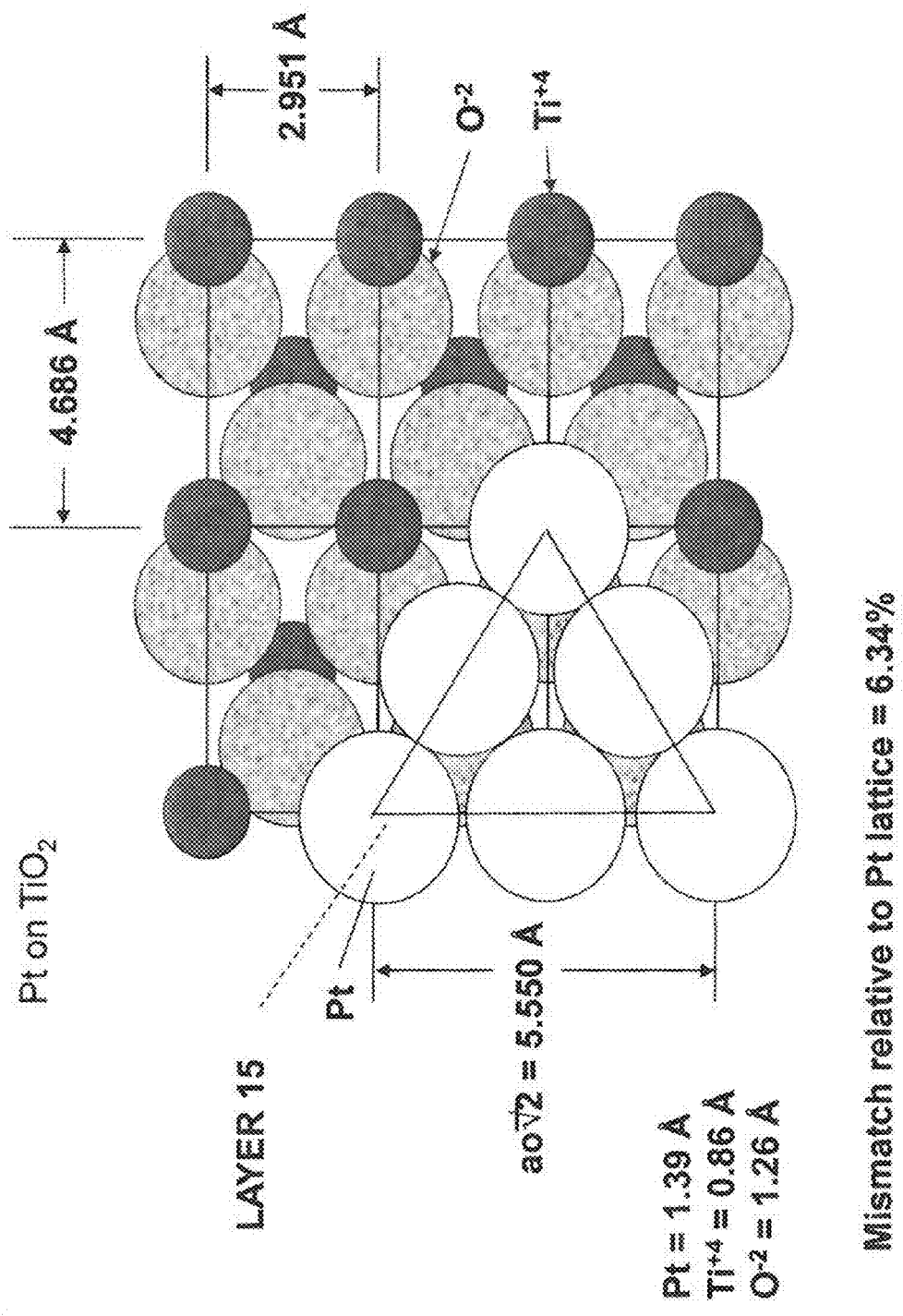
FIG. 31 schematically illustrates on the atomic scale the (111)-plane of the platinum layer 15 grown on the oxygen terminated (100)-plane of the TiO₂ layer 14.

Referring now to FIG. 29, an approximately 10 nm to 300 nm thick {111}-textured stylo-epitaxial electrode layer 15 is grown by sputter deposition on the $TiO_2$ layer. The electrode layer may be, for example, metals Pt, Ir, Ru, Pd, Au, Cu, Ni and other FCC metals. The metal is preferably polycrystalline and {111}-textured. In the case of platinum, the platinum may be sputter deposited by DC magnetron, with Tsub=500° C. The Pt has a face centered cubic (FCC) structure with {111}-texture and RC-FWHM ≤5°. Pt exhibits a volume fraction of {111}-oriented grains (preferably >90%) and a {111}-misalignment distribution FWHM of preferably ≤7°. The (100)$TiO_2$/(111)Pt stylo-epitaxial relationship is shown in FIG. 31. In FIG. 31, the (111)Pt is shown as sitting on the oxygen terminated $TiO_2$ plane.

Figure 33:
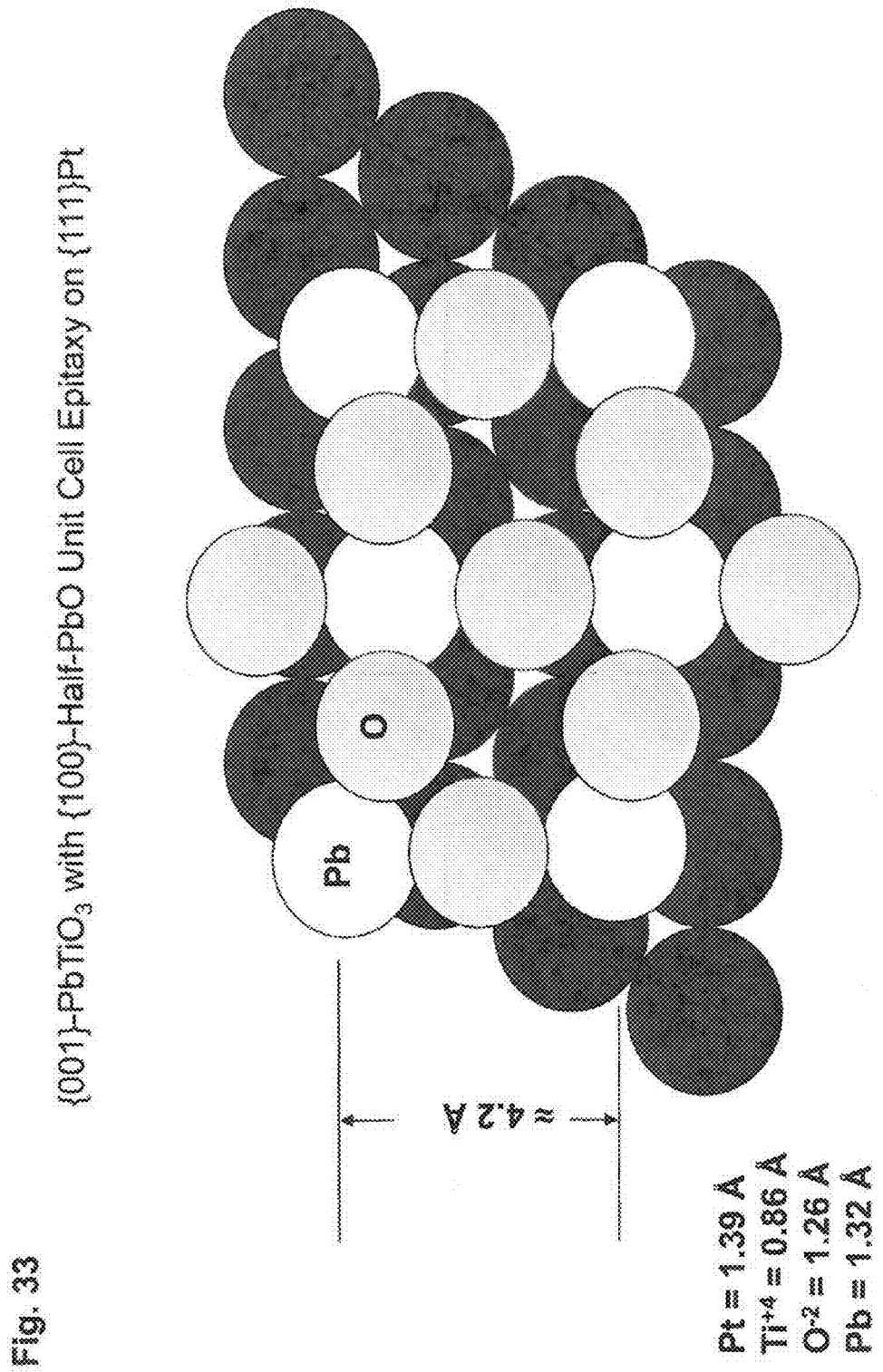
FIG. 33 is an illustration on the atomic scale of the registration of the Pb-terminated (001)-PbTiO₃ plane or the (100)-plane of a PbO half unit cell epitaxy on the (111) Pt plane.

Subsequently, an approximately 1 nm to 200 nm thick perovskite stylo-epitaxial layer, namely $PbTiO_3$, having a tetragonal distortion of >1.03 (approximately) and with 0-50% excess PbO is deposited and consists of a volume fraction of {001}-oriented grains of >90% (approximately) and tilt distribution of {001}-oriented grains FWHM ≤10 deg (approximately). The excess PbO is required in order to produce the stylo-epitaxial relationship. There are at least two ways of describing the expitaxial relationship between the $PbTiO_3$ and the Pt. The first method is (111)Pt/(001)PbO/(001)$PbTiO_3$(Ti/O-termination) (depicted in FIG. 33) where there is a half unit strained cell of tetragonal PbO followed by $PbTiO_3$ that terminates with the plain defined by the average position of the Ti-site and O-sites within the same plane. The half unit cell of PbO is Pb-terminated in contact with the (111)Pt and O-terminated in contact with the $PbTiO_3$. This approach explains how the PbO half unit cell acts as a conversion layer between the (111)Pt and (001)$PbTiO_3$ planes. The second approach is to assume an oxygen deficiency in the (001) Pb-termination of the $PbTiO_3$ unit cell, which gives the epitaxial relationship (111)Pt/(001) $PbTiO_3$ (oxygen deficient Pb-termination) as depicted in FIG. 33. Note that both approaches result in the same atomic arrangement at the interface.

An approximately 30 nm to 10 um $PbZr_{1-x}Ti_xO_3$ stylo-epitaxy layer with x=0.40 to 0.60 and with a PbO excess of 0 to 15% is deposited onto the $PbTiO_3$ layer and consists of a volume fraction of {001}-oriented grains of >90% (approximately) and tilt distribution of the {001}-oriented grains of FWHM ≤10° (approximately). The epitaxial relationship is (001)$PbTiO_3$/(001)PZT provided that the strain provides a good match of the $PbTiO_3$ and PZT lattices. If the lattice mismatch is too large, a fraction of the PZT grains will produce a (001)$PbTiO_3$/(100)PZT epitaxial relationship in order to reduce the strain energy of the structure. At this point in the structure, there are now 4 or 5 stylo-epitaxial layers, depending on complete or incomplete Ti oxidation, respectively, comprising each grain of the structure. The combination of homo- and hetero-epitaxial layers make a complete chain of epitaxial layers within each grain, but each columnar grain has an undefined rotation about axes normal to the epitaxial plane. (This analysis can be extended to the tetragonal/rhombohedral case.)

Figure 35:
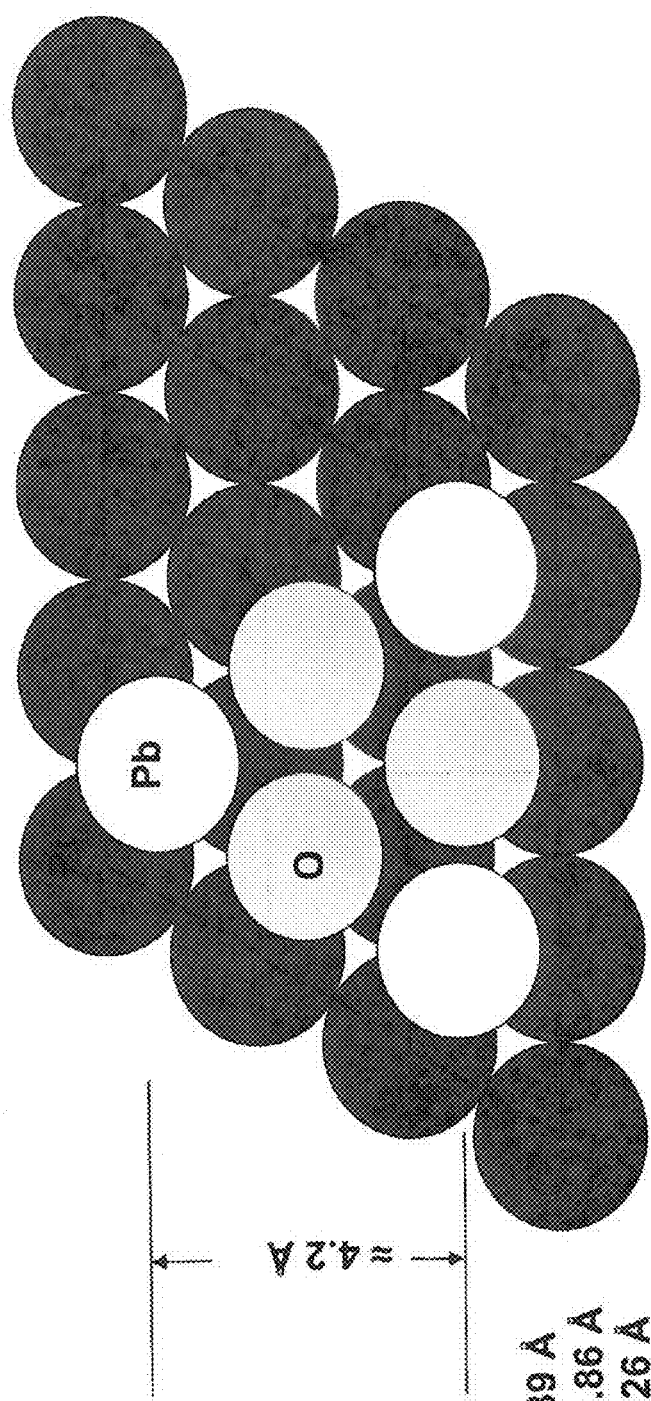
FIG. 35 is an illustration on the atomic scale of the registration of the PbO-terminated (111)-PZT plane epitaxy on the (111) Pt plane.
Figure 36:
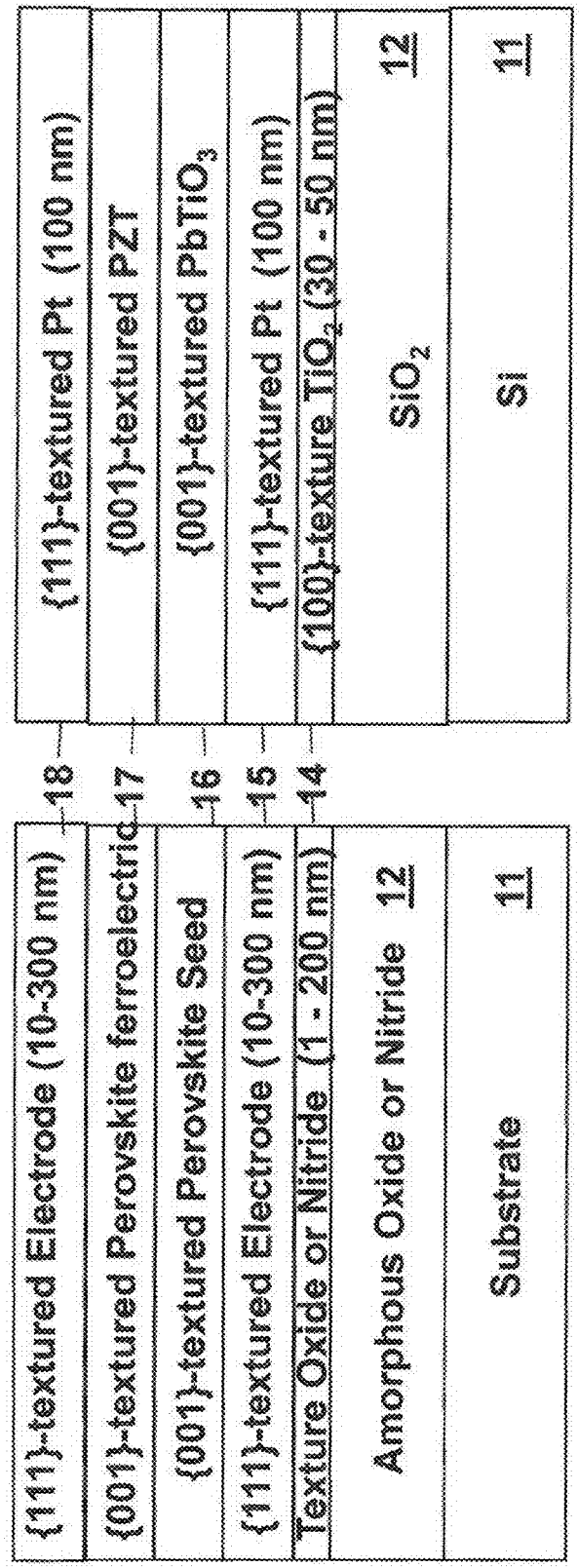
FIG. 36 is a cross-sectional illustration showing schematically the addition of {111}-stylo-epitaxy electrode layer 18 of a preferred embodiment.
Figure 37:
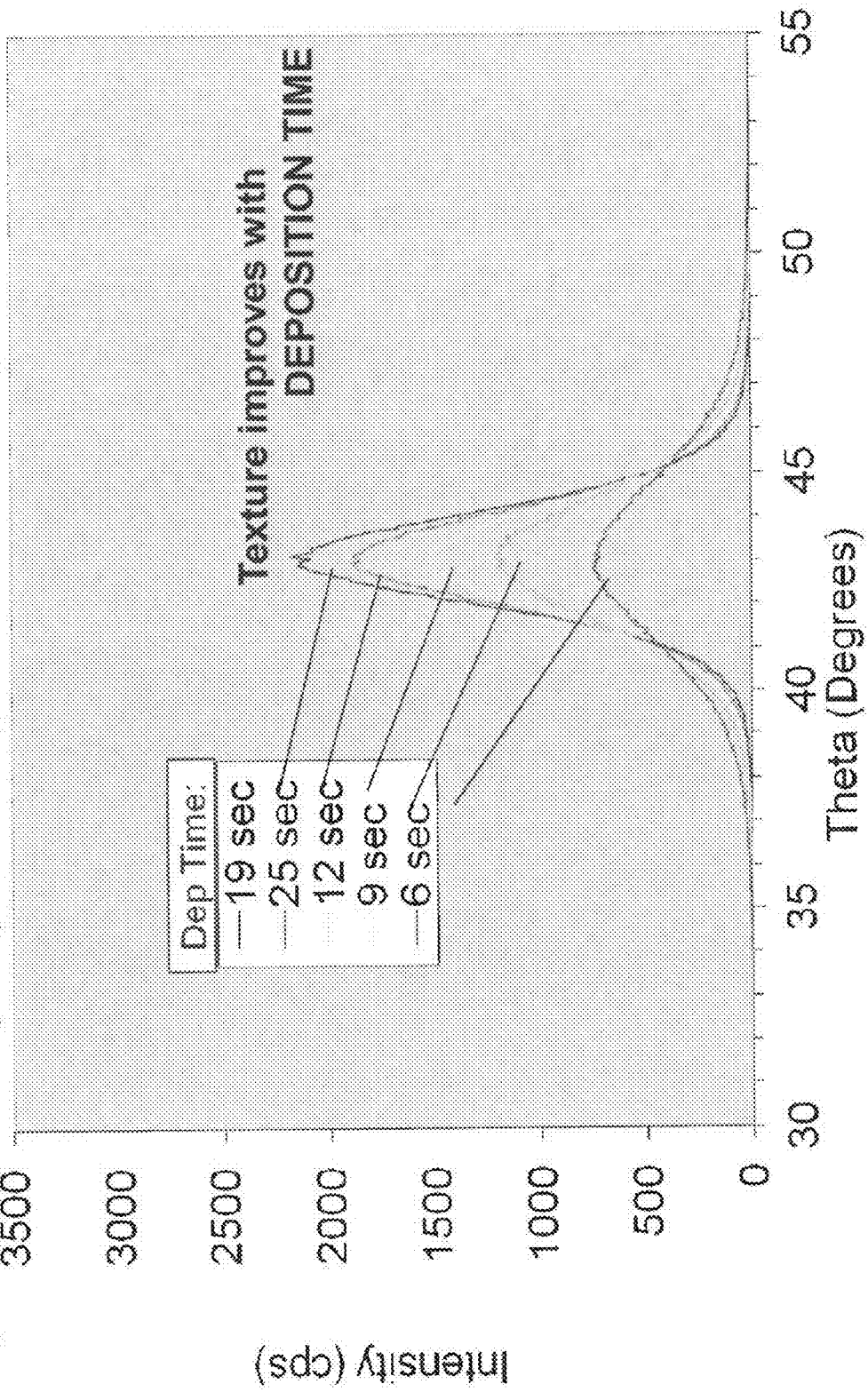
FIG. 37 is a graphical illustration showing Pt(222) rocking curves for Pt grown on {100}-textured TiO₂ of various thickness (1 kW TiO₂).
Figure 38:
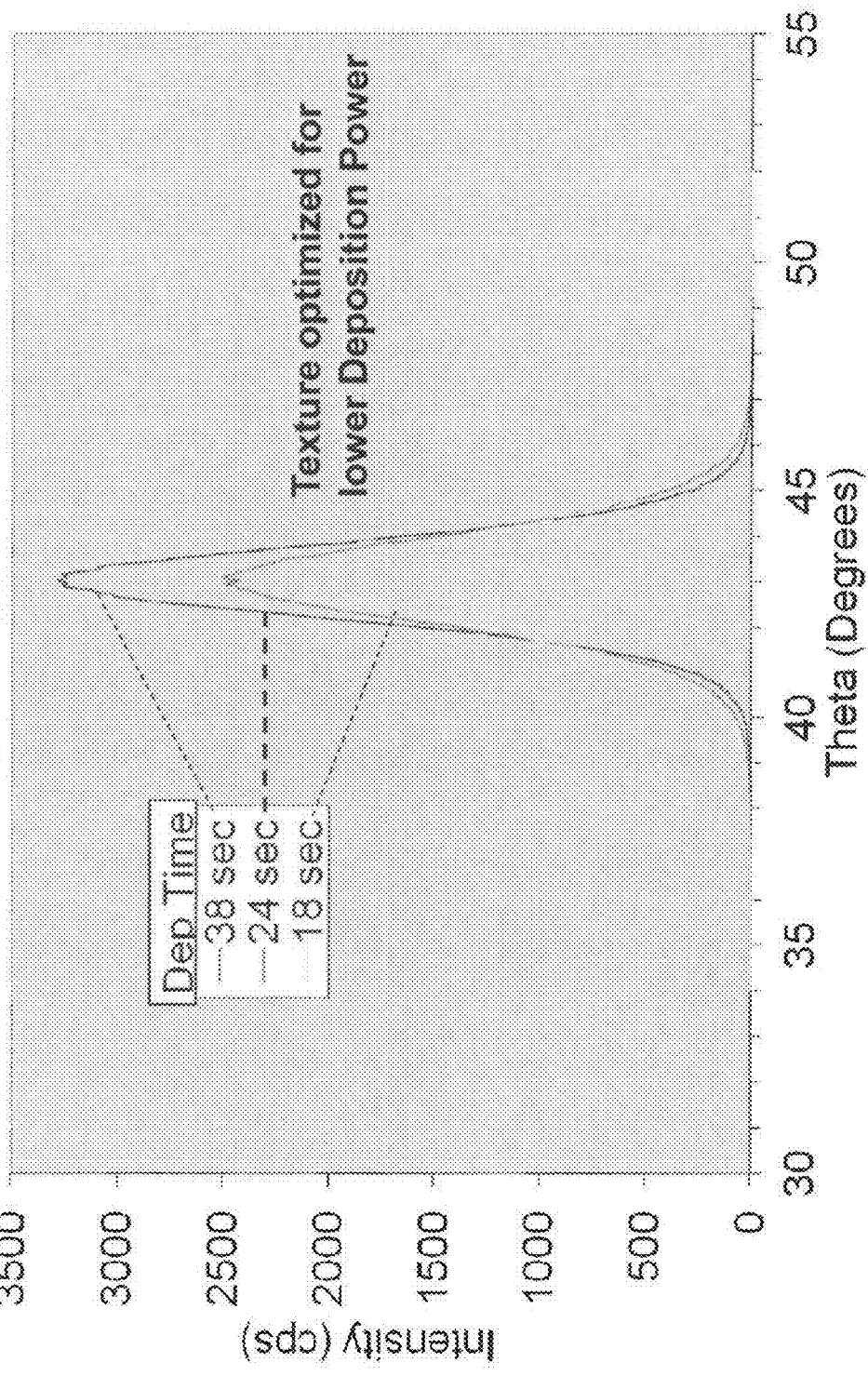
FIG. 38 is a graphical illustration showing Pt(222) rocking curves for Pt grown on {100}-textured TiO₂ of three different thicknesses (0.5 kW TiO₂).
Figure 39:
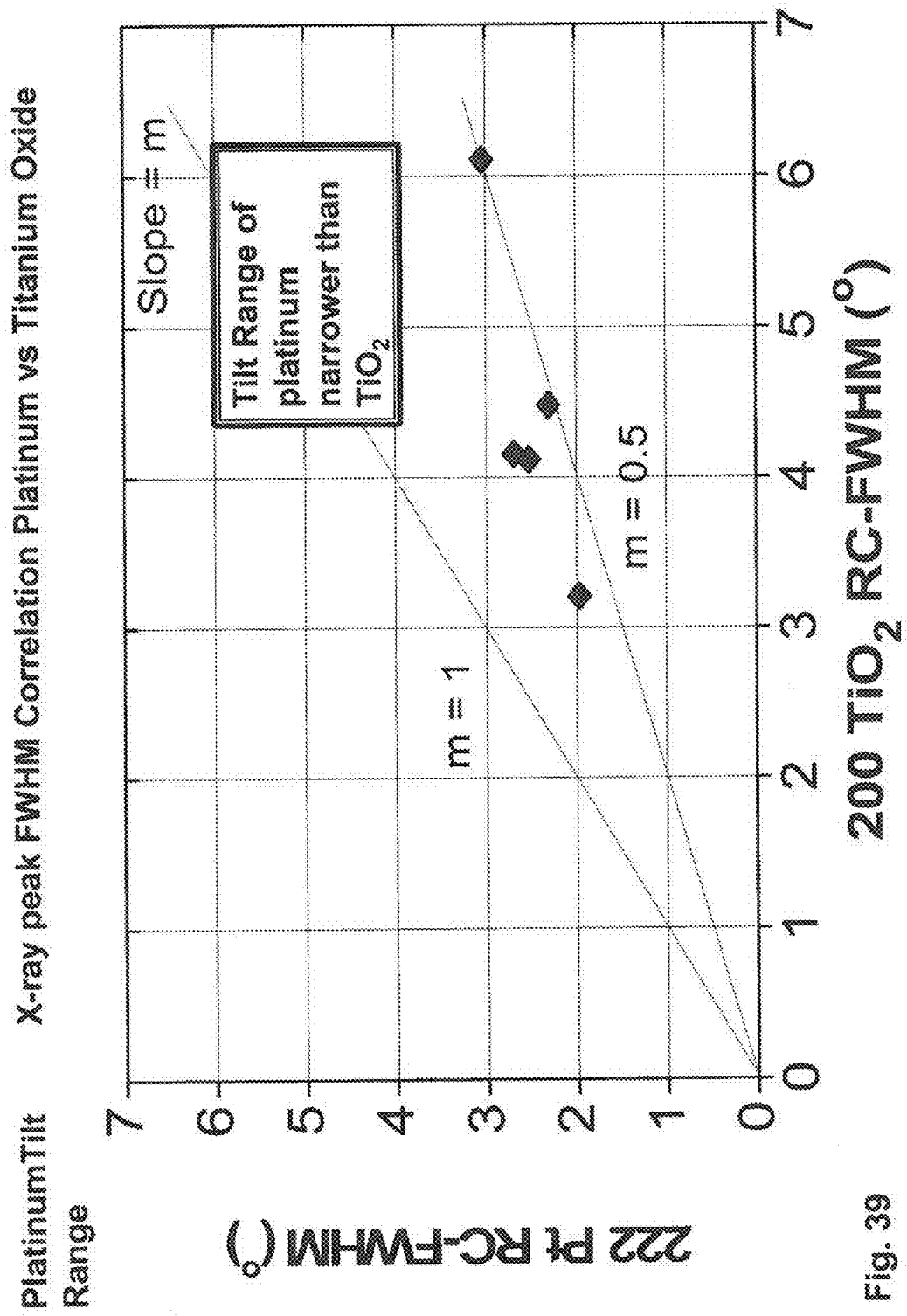
FIG. 39 illustrates graphically {100}-textured TiO₂ versus {111} stylo-epitaxial platinum crystallite tilt range and shows that the crystallite tilt range of platinum is proportional to the TiO₂ crystallite tilt range and has a proportionality factor of approximately 0.5.
Figure 40:
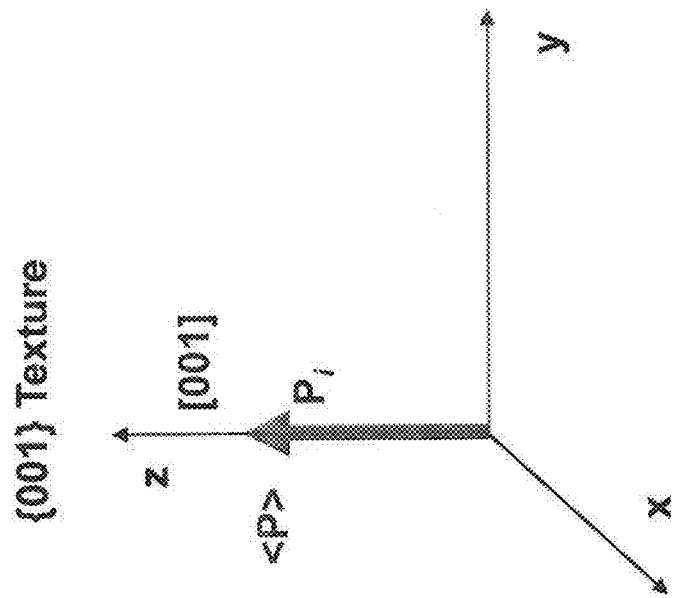
FIG. 40 is a diagrammatic illustration showing a PZT polar vector distribution when all PZT crystallites are oriented with the [001]-direction along the growth direction, z, wherein the net polarization is 100%. The growth plane is the xy plane.
Figure 42:
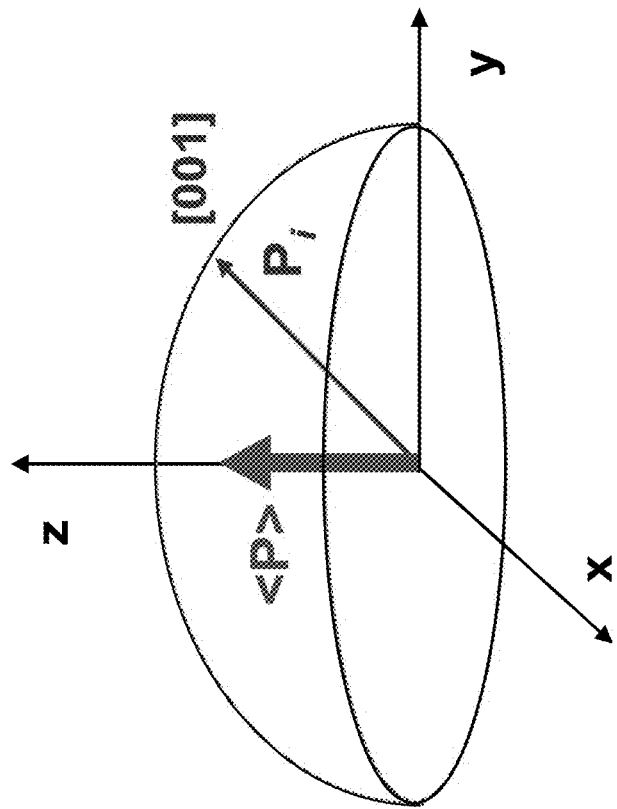
FIG. 42 is a diagrammatic illustration showing a PZT polar vector distribution in the case of the randomly, positively poled, PZT distributed orientations (within 180°); showing the vector $P_i$ illustrating the polarization within single grain limited to region within the hemisphere and the net polarization <P> being less than approximately 50% of the theoretical maximum as reflected by the following equation $$\frac{\langle Q_{sw}\rangle_{Rnd}}{\langle Q_{sw}\rangle_{[001]}} = \frac{2\int_0^{2\pi}\int_0^{\frac{\pi}{2}}\cos\phi\sin\phi\,d\phi\,d\theta}{\int_0^{2\pi}\int_0^{\pi}\cos(0°)\sin\phi\,d\phi\,d\theta} = \frac{2\pi}{4\pi} = 0.500$$
Figure 41:
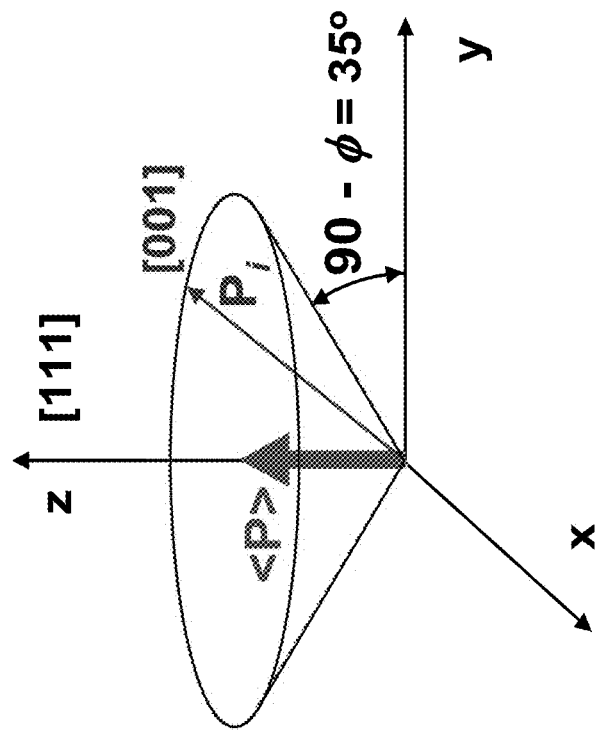
FIG. 41 is a diagrammatic illustration showing a PZT polar vector distribution for the case of positively poled [111] orientation; showing the net polarization <P> comprising the polarization average for all grains making up the capacitor or device and the vector $P_i$ illustrating the polarization within a single grain limited to the region within the cone with the net polarization being approximately 58% of the theoretical maximum as reflected by the following equation $$\frac{\langle Q_{sw}\rangle_{[111]}}{\langle Q_{sw}\rangle_{[001]}} = \frac{\int_0^{2\pi}\int_0^{\pi}\cos\left(\frac{54.7\pi}{180}\right)\sin\phi\,d\phi\,d\theta}{\int_0^{2\pi}\int_0^{\pi}\cos(0)\sin\phi\,d\phi\,d\theta} = \frac{4\pi\cos(54.7^D)}{4\pi} = 0.578$$

The final layer of the structure (which may form a capacitor) is an approximately 10 nm to 300 nm thick Pt top electrode, as shown in FIG. 36. Like the other Figures depicting the layers 11, 12, 13, 14, 15, 16, 17, and/or 18, the layers are schematic in nature and not drawn to relative scale. It is preferred that the top electrode 18 is a stylo-epitaxial layer, but it is not required. In this case, the Pt top electrode 18 was not formed as a stylo-epitaxial layer. If the Pt top electrode is formed as a stylo-epitaxial layer, the epitaxial relationship to the PZT depends on the termination of the PZT layer. With Pb-termination the Pt top electrode has the epitaxital relationship shown in FIG. 35. With Ti/O-termination, the epitaxial relationship is (001)PZT/(100)Pt. The stylo-epitaxial top electrode layer exhibits a volume fraction of crystallographically oriented grains >90% (approximately) and a stylo-epitaxial misalignment distribution FWHM of 10° (approximately).

In the preferred embodiment of FIG. 36, the PZT may be deposited by metalorganic solution spin-on or by another process, with Pyrolysis at 450° C. and crystallization at 700° C. The PZT has perovskite structure with {001}-texture RC-FWHM≤10° with volume of {001}/({001}±{100}>80%. With reference to the more general case (shown to the left in FIG. 36), the addition of a {111}-textured electrode, the layer 18 may be in the range of 10-300 nm thick and preferably comprise polycrystalline perovskite ferroelectric, such as perovskite ferroelectric {001}-textured with RC-FWHM≤10° with volume of {001}/({001}±{100}>80%. Other options for the formation of layer 18 included PZT, PMN-PT, etc.

The stylo-epitaxial structure can be generalized to include a wide range of materials. The substrate 11 can consist of any material that is thermally stable under the conditions used for processing the stylo-epitaxial structure. Thermally stable means that the material does not substantially oxidize or deform in a manner that does not allow the formation of the overlying amorphous layer and stylo-epitaxial structure. Substrate materials can include, but are not limited to, Si, Ge, GaAs, $Al_2O_3$, $ZrO_2$, MgO, spinel ($MgAl_2O_4$), Yttria Stabilized Zirconia (YSZ), $ZrO_2$ Cu, Ni, Ti, SOI, stainless steel, quartz, silicate glasses, low expansion glasses, AlN, SiC, $SiN_x$.

Optimally, the substrate 11 may be coated with an amorphous material that does not crystallize or deform plastically when exposed to the processing required to form the stylo-epitaxial structure and the amorphous coating has a surface roughness (excluding purposely formed topogaphy) of ≤10 nm rms. The amorphous coating 12 can include, but is not limited to, $SiO_2$, silicate glass, AlOx (1<x<2), SiNx (1<x<2), SiC, AlN, SiON, RuOx (1<x<2), ZrOx (1<x<2), and $MgAl_2O_4$.

A textured polycrystalline metal 13 (or 14) is deposited to form a self-seeding layer with a thickness of approximately 1 nm to 200 nm, volume fraction of oriented grains is preferably >90% (approximately) and a textured tilt distribution FWHM of preferably less than 7° (approximately). The textured metal is the first layer in the stylo-epitaxy structure and provides a textured base for each columnar or stylo-epitaxial grain. Metals can include, but are not limited to, Ti, Al, Mg, Ca, Cr, Fe, Ni, Sr, Ba, Zn, V, Mn, Ce, Co, Sn, Ru.

The textured metal is thermally oxidized, nitrided or fluoronated to form a textured compound 14 that grows epitaxially on the textured metal. Materials include $TiO_2$, $SnO_2$, MgO, CaO, SrO, FeO, ZnO, NiO, CeO, CoO, TiN, AlN, CrN, $CaF_2$. These crystallographically textured compound layers can also be deposited directly on the amorphous substrate coating provided that the orientation and misalignment specifications are met. The volume fraction of oriented oxide, nitride, or fluoride grains is >90% (approximately) and textured tilt distribution FWHM is less than approximately 7°. Oxidation or nitridation of the textured metal results in forming a crystalline structure that provides an epitaxial surface for growth of the subsequently deposited electrode layer and provides a base for the entire stylo-epitaxial structure. Example compounds and textures include {100}-textured rutile structure layer or {0001}-textured wurtzite structure. If oxidation or nitridation of the metal film is complete the textured compound layer becomes the initial layer in the stylo-epitaxial structure.

FIG. 30A illustrates the growth of {111} stylo-epitaxy electrode layer 15. The Pt falls into interstices of rutile structure as illustrated in FIG. 31 and as described further in U.S. Pat. No. 6,887,716, hereby incorporated by reference. FIG. 31 illustrates on the atomic scale the platinum layer 15 grown on the $TiO_2$ layer 14.

The stylo-epitaxial Pt electrode layer 15, approximately 10 nm to 300 nm thick, may be grown by sputter deposition or any other deposition technique that can result in stylo-epitaxial growth on the textured compound layer. Electrode materials include, but are not limited to Pt, Ir, Ru, Pd, Ni, Au, Cu, Ag. The stylo-epitaxial electrode layer exhibits a volume fraction of crystallographically oriented grains >90% (approximately) and a stylo-epitaxial misalignment distribution FWHM of ≤7° (approximately). Examples of electrode stylo-epitaxial structures include, but are not limited to (100)$TiO_2$/(111)Pt, (100)$TiO_2$/Ir, (100)MgO/(100)Pt, (0001) AlN/(111)Pt.

Figure 32:
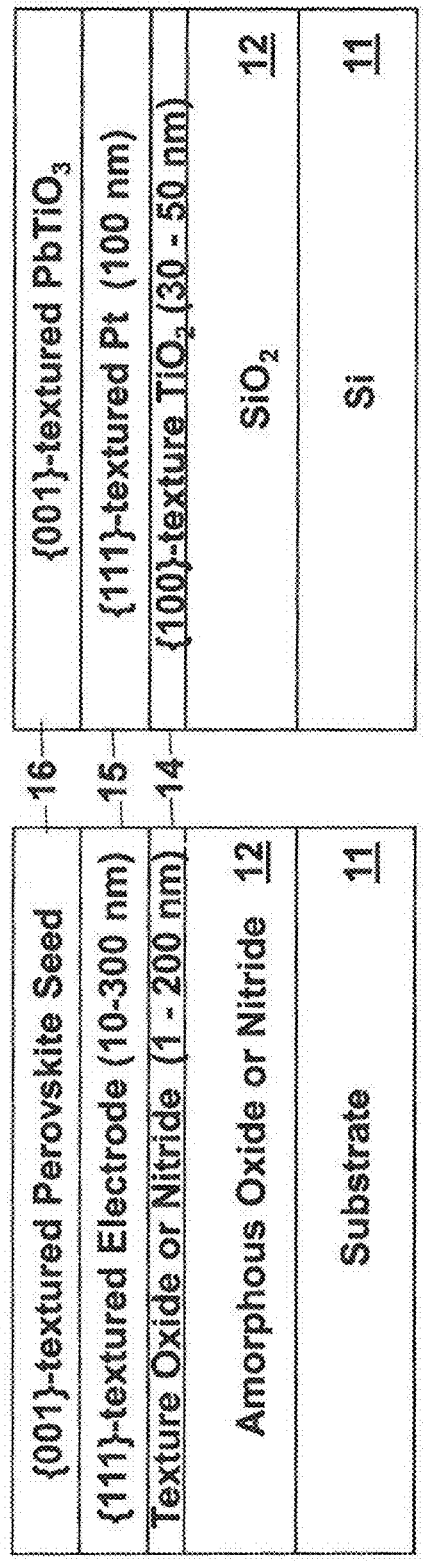
FIG. 32 is a cross-sectional illustration showing schematically the addition of a {001} stylo-epitaxy, textured layer 16 (perovskite seeded).

With reference to FIG. 32, a first perovskite $ABO_3$ stylo-epitaxial layer 16 having a tetragonal distortion of >1.03 and with 0 to 50% (molar) excess A-site is deposited with a thickness of approximately 1 nm to 200 nm and consists of a volume fraction of oriented grains of >90% (approximately) and tilt distribution of oriented grains FWHM ≤10 deg (approximately). The excess A-site is required in order to produce the stylo-epitaxial relationship with the underlying electrode and the subsequent $ABO_3$ stylo-epitaxial layer. Examples of this first $ABO_3$ stylo-epitaxial layer include, but are not limited to, $PbTiO_3$, $(PbLa)TiO_3$, $SrTiO_3$, $BaTiO_3$, $PbNiNbO_3$, $Pb(ZrTi)O_3$, $PbYbNbO_3$, $PbScTaO_3$. Illustrated in FIG. 32, layer 16 is a polycrystalline {001}-textured perovskite seed with RC-FWHM≤10° with c/a>1.03 (for example, $PbTiO_3$, etc.) and wherein the volume of {100}-textured grains is greater than 90%. The volume of {001}/({001}+{100})>80%. The thickness is 1 nm to 200 nm thick. Layer 16 comprises 0 to 50% (molar) A-site excess.

In the specific case of layer 16 comprising $PbTiO_3$, the PbTiO3 may be deposited by metalorganic solution spin-on or other process, with Pyrolysis at 450° C. and crystallization at 700° C. The PbTiO3 has perovskite structure with {100}-texture RC-FWHM≤10°. The volume of {100}-textured grains >90%, and volume of {001}/({001}±{100}) >80%.

It is important to note that the A-site species of this first perovskite stylo-epitaxial layer is predominantly the same as the A-site species in the subsequently deposited second perovskite layer. This first perovskite stylo-epitaxial layer can be deposited by any technique such as spin-on chemical solution deposition, rf sputter deposition or MOCVD. The layer can be crystallized by a post deposition anneal or by depositing onto a heated substrate. Examples of stylo-epitaxial structures processed to this point include (100) $TiO_2$/(111)Pt/(001)$PbTiO_3$, (100)$TiO_2$/(111)Pt/(001)PbN-i$NbO_3$.

As depicted in FIG. 34, a second approximately 30 nm to 10 um thick perovskite $ABO_3$ stylo-epitaxial layer 17 that has the desired ferroelectric and piezoelectric properties is deposited. This second perovskite stylo-epitaxial layer has a surface lattice match within 25%, 0 to 15% (molar) excess A-site and consists of a volume fraction of oriented grains of >90% (approximately) and tilt distribution of oriented grains FWHM≤10 deg (approximately). The polycrystalline perovskite ferroelectric may be for example, PZT, PMN-PT etc., and the perovskite ferroelectric {100}-textured with RC-FWHM≤10° with the volume of {100}-textured grains being >90%. The volume of {001}/({001}±{100}>80%. Examples of this second $ABO_3$ stylo-epitaxial layer include, but are not limited to, $(BaSr)TiO_3$, $Pb(MgNb)O_3$, PbN-i$NbO_3$, $Pb(ZrTi)O_3$ (PZT), $PbYbNbO_3$. This second perovskite stylo-epitaxial layer 17 can be deposited by any technique such as spin-on chemical solution deposition, rf sputter deposition or MOCVD. The layer can be crystallized by a post deposition anneal or by depositing onto a heated substrate. The following conditions are recommended for layer 17 (PZT): Pyrolysis at 450° C.; Crystallization at 700° C.; PZT has perovskite structure with {100}-texture RC-FWHM≤10°. volume of {100}-textured grains >90%.

Examples of stylo-epitaxial structures processed to this point include (100)$TiO_2$/(111)Pt/(001)$PbTiO_3$/(001) $PbZr_{0.52}Ti_{0.48}O_3$, (100)$TiO_2$/(111)Pt/(111)$PbZr_{0.4}Ti_{0.6}O_3$. It should be noted that the first perovskite stylo-epitaxial layer $PbTiO_3$ was not included in the second structure resulting in a (111)PZT stylo-epitaxial structure. It can be seen that the stylo-epitaxial approach can be extended to a range of perovskite orientations and can also be extended to include crystal structures other than perovskite. At this point the combination of homo- and hetero-epitaxial layers make a complete chain of epitaxial layers within each grain, but each columnar grain has an undefined rotation about axes normal to the epitaxial plane.

The structure (which may be, for example, a capacitor) preferably has an approximately 10 nm to 300 nm thick top electrode 18. It is preferred that the top electrode is a stylo-epitaxial layer, but it is not required. If the top electrode is formed as a stylo-epitaxial layer, the epitaxial relationship to the PZT depends on the termination of the PZT layer. With Ti/O-termination, one epitaxial relationship is (001)PZT/(100)Pt. Top stylo-epitaxial electrode materials include, but are not limited to Pt, Ir, Ru, Pd, Ni, Au, Cu, Ag, $IrO_2$, $RuO_2$, $LaSrCoO_3$, $SrRuO_3$, $LaNiO_3$, $InSnO_2$. The stylo-epitaxial electrode layer exhibits a volume fraction of crystallographically oriented grains >90% (approximately) and a stylo-epitaxial misalignment distribution FWHM of ≤10° (approximately). Examples of stylo-epitaxial structures processed to this point include $(100)TiO_2/(111)Pt/(001)PbTiO_3/(001)PbZr_{0.52}Ti_{0.48}O_3/(100)Pt$.

The stylo-epitaxial structure can be extended to include any combination of layers or repeat units and can further be extended to include a barrier layer that encapsulates the ferroelectric/piezoelectric stylo-epitaxial capacitor structure.

This stylo-epitaxy structure results in a property figure of merit, such as for $d_{33,film}$ of $$d_{33,film}=d_{33,ideal}(AV_{001}+BV_{100}+CV_{111}+DV_{Rnd})$$

$$d_{33,film}=d_{33,ideal}(AV_{001}+BV_{100}+CV_{111}+DV_{Rnd})$$

The value $d_{33,ideal}$ is the piezoelectric coefficient for an ideal single crystal with epitaxial electrode interfaces and V is the volume fraction of the 001, 100, 111, and randomly oriented grains of the PZT film. The coefficients of this equation can be divided into orientation components, denote by subscript 1, and interface components, denoted by subscript 2.

$$A=\alpha_1\alpha_2$$

$$B=\beta_1\beta_2$$

$$C=\gamma_1\gamma_2$$

$$D=\delta_1\delta_2$$

Since epitaxy is not achieved at the PZT/electrode interface for the randomly oriented PZT volume fraction, it is expected that $\delta_2<1$, but since measurements of the interface coefficients are not readily available and $V_{Rnd}$ is generally small (<20%) it will be assumed that $\delta_2=1$ is sufficiently accurate in the first approximation. For the common case of pinning of 90° domains, $\delta_1\approx0.46$ which gives D=0.46. The 001, 100 and 111 PZT/electrode interfaces are expected to be epitaxial in most cases and it will therefore be assumed that the interface coefficients $\alpha_2$, $\beta_2$, and $\gamma_2$ equal 1. The value of $\gamma_2\approx0.58$ for the common case of a symmetric tilt distribution of the 111 oriented grains; thus, C=0.58. Since we are assuming the case of pinned 90° domains, $\beta_1=0$ resulting in B=0. The final coefficient that needs to be determined is $\alpha_1$, which is determined by the tilt distribution of the {001} grains. In the case that all {001} grains are ideally aligned normal to the substrate, $\alpha_1=1$, But in real materials, the {001} domains are distributed over a range of angles close to the normal. Any tilt away from the normal reduces the value of $\alpha_1$. Summarizing, the figure of merit can be calculated to a good approximation by using the equation $$d_{33,film}=d_{33,ideal}(\alpha_1 V_{001}+0.58V_{111}+0.46V_{Rnd})$$

Note that the induced in-plane strain $x_3$ resulting from an in-plane electrical field $E_3$ is expressed by the piezoelectric effect: $x_3=d_{33}E_3$ where $d_{33}$ is the longitudinal piezoelectric coefficient of PZT. Further description can be found in Zhang, Q. Q, et al., "Lead Zirconate Titanate Films for d33 Mode Cantilever Actuators," Sensors and Actuators A 105 (2003) 91-97, hereby incorporated by reference.

Advantages

Stylo-epitaxy structures provide a means for controlling the crystallographic orientation of layers without placing demands for epitaxial requirements on the substrate. In effect, the substrate is decoupled from the electrode and PZT orientation and therefore, a wide range of substrates can be employed that would be excluded from use if a standard epitaxial approach were used. Unlike the {001}-textured PZT on Ti/Pt, stylo-epitaxy preserves the epitaxial relationship between the electrode and PZT layers on a grain-by-grain basis. This ensures that the highest efficiency and reliability of the PZT properties are obtained. Stylo-epitaxy also can allow the separation of {001}-orientation development from the use of seed layers such as $PbTiO_3$, thus allowing the use of a broader range of electrode materials and processing conditions.

The epitaxial interfaces of all layers within the structure (which may be for example a capacitor) provide enhanced, electrical and reliability performance including improved, switchable polarization, remanant polarization, piezoelectric coefficients, polarization retention, and polarization cycling endurance.

Stylo-epitaxy can be used to produce a variety of ferroelectric/piezoelectric crystal orientations with epitaxial electrode interfaces on the grain-by-grain level.

The stylo-epitaxial structures can be produced by chemical solution deposition (CSD), sputtering and Metalorganic vapor phase epitaxy (MOVPE), also known as organometallic vapor phase epitaxy (OMVPE) or metalorganic chemical vapor deposition (MOCVD), deposition methods. The crystallographic orientations within a columnar grain are always fixed relative to each other so the structure can be used to ensure both orientation and interface quality.

The use of stylo-epitaxy allows the production of capacitor devices with a higher volume fraction of oriented grains and a smaller misalignment distribution than would be achieved by relying on previously reported texturing methods.

Potential Uses

A stylo-epitaxial structure and process as described herein for the fabrication of ferroelectric/piezoelectric {001}-oriented PZT devices (such as capacitors) may be used, inter alia, in piezoelectric MEMS, FRAM and related integrated devices. The stylo-epitaxial structure relies on a series of hetero- and homo-epitaxial relationships between thin films to generate stylo-epitaxial structures with epitaxy on a grain-by-grain basis through the entire device thickness or a majority of the layers composing the device.

Potential uses include, but are not limited to:

1) Thin film piezoelectric actuators in PZT MEMS.
2) Thin film piezoelectric sensor in PZT MEMS.
3) Non-volatile ferroelectric random access memories (FRAM).
4) Resistive memories that use conductive oxides, such as $TiO_2$, NiO, etc.
5) Electrodes for biological and medical applications. Electrodes with different textures will likely have different activities and interactions with bio-molecules and structures.
6) Solar cells.

Indicies used herein relate to Miller indices that are used in accordance with a crystallography notation system for planes and directions in crystal (Bravais) lattices. A family of lattice planes is determined by three integers h, k, and l (the Miller indices). They are written (hkl), and each index denotes a plane orthogonal to a direction (h, k, l) in the basis of the reciprocal lattice vectors. By convention, negative integers are written with a bar, as in $\bar{3}$ for −3. The integers are usually written in lowest terms, i.e. their greatest common divisor should be 1. Miller index 100 represents a plane orthogonal to direction h; index 010 represents a plane orthogonal to direction k, and index 001 represents a plane orthogonal to l. There are also several related notations: the notation {hkl} denotes the set of all planes that are equivalent to (hkl) by the symmetry of the lattice. In the context of crystal directions (not planes), the corresponding notations are [hkl], with square instead of round brackets, denotes a direction in the basis of the direct lattice vectors instead of the reciprocal lattice; and similarly, the notation ⟨hkl⟩ denotes the set of all directions that are equivalent to [hkl] by symmetry. Further information can be obtained in Wikipedia.

As used herein the terminology "register" in relation to a crystallographic structure means, with respect to two adjacent granular layers, the grains in a first granular layer are in registration with and contacting grains in the adjacent layer. For example, in a preferred embodiment, each ferroelectric grain is in registration with one electrode grain.

The terminology perovskite structure is any material with the same type of crystal structure as calcium titanium oxide (CaTiO$_3$), known as the perovskite structure, or XIIA2+VIB4+X2−3 with the oxygen in the face centers. The general chemical formula for perovskite compounds is ABX$_3$, where 'A' and 'B' are two cations of very different sizes, and X is an anion that bonds to both. The 'A' atoms are larger than the 'B' atoms. The ideal cubic-symmetry structure has the B cation in 6-fold coordination, surrounded by an octahedron of anions, and the A cation in 12-fold cuboctahedral coordination. The relative ion size requirements for stability of the cubic structure are quite stringent, so slight buckling and distortion can produce several lower-symmetry distorted versions, in which the coordination numbers of A cations, B cations or both are reduced.

As used herein, Piezoelectric coefficient or Piezoelectric Modulus, also known as d$_{33}$, quantifies the volume change when a piezoelectric material is subject to an electric field, or the polarization on application of a stress:

$$d = \frac{P}{\sigma}$$

where P is polarization, and σ is the stress.

As used herein, texture measurements refer to measurements used to determine the orientation distribution of crystalline grains in a polycrystalline sample. A material is termed textured if the grains are aligned in a preferred orientation along certain lattice planes.

As used herein epitaxy refers to the deposition of a crystalline overlayer on a crystalline substrate, where the overlayer is in registry with the substrate at a preferred orientation of the overlayer with respect to the substrate for epitaxial growth. The overlayer is called an epitaxial film or epitaxial layer. Epitaxial deposition of a layer on a substrate matches the crystalline order of the substrate.

As used herein the terminology "growth plane" refers to the epitaxial growth planes. Growth planes and their crystallographic axes may be expressed as, for example, [112] (111) X/[1100] (0001) Y, where X and Y are crystal materials and the (111) and (0001) are faces and the brackets [ ] indicate crystallographic axes. For example, the perovskite crystal orientation having a {001} orientation means that the {001} planes of the perovskite crystal lie parallel to the growth plane.

As used herein, the term "stylo" means, in combination with epitaxy, "column," "pillar," "tube," or column-like crystal growth as shown for example in FIGS. 6A and 6B.

As used herein the terms columns or column-like structures refer to the column-like structures grown on top of granular regions. The column-like structures and granular regions are substantially coextensive.

As used herein the terminology thin film is a layer of material ranging from fractions of a nanometer (monolayer) to several micrometers in thickness.

As used herein the terminology "rutile" refers to a mineral composed primarily of the preferred polymorph of titanium dioxide, TiO$_2$. Rutile is the most common natural form of TiO$_2$.

As used herein the terminology "perovskite" means is the crystal structure, as depicted in FIG. 4, of any material with the same or substantially the same type of crystal structure as calcium titanium oxide (CaTiO$_3$), known as the perovskite structure.

As used herein, the expression full width at half maximum (FWHM) is an expression of the extent of a function, given by the difference between the two extreme values of the independent variable at which the dependent variable is equal to half of its maximum value.

As used herein the terminology "crystallites" refer to small, microscopic crystals that, held together through highly defective boundaries, constitute a polycrystalline solid. Crystallites are also referred to as grains.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A ferroelectric device comprising:
   a substrate;
   a textured layer;
   a first electrode comprising a thin layer of metallic material having a crystal lattice structure divided into granular regions;
   a seed layer; the seed layer being epitaxially deposited so as to form a column-like structure on top of the granular regions of the first electrode;
   at least one ferroelectric material layer exhibiting spontaneous polarization epitaxially deposited on the seed layer; the ferroelectric material layer, the seed layer, and first electrode each having granular regions in which column-like structures produce a high degree of polarization normal to the growth plane.

2. The device of claim 1 wherein the ferroelectric device is a piezoelectric device further comprising a second electrode positioned on the ferroelectric material layer, the second electrode having a thickness in the range of approximately 10 nm to 500 nm and wherein the second electrode comprises one or more of Pt, Ir, Ru, Pd, Ni, Au, Cu, Ag, IrO$_2$, RuO$_2$, LaSrCoO$_3$, SrRuO$_3$, LaNiO$_3$, InSnO$_2$.

3. The device of claim 1 wherein the maintaining of the crystal planes within column-like structure of the ferroelectric material provide optimum spontaneous polarization perpendicular to the growth plane and wherein the granular regions of the seed layer, ferroelectric layer and first electrode are in registration such that the columns in the ferroelectric layer extend from the granular regions of the seed layer, and the granular regions of the seed layer extend from the granular regions of first electrode, and wherein the crystallographic planes within the granular regions and the column-like structures are substantially planar to the growth plane with a tilt of less than or equal to approximately 10 degrees from the growth plane, and wherein the crystal orientation within the ferroelectric material layer is predominately {001}.

4. The device of claim 1 wherein each of the ferroelectric material and seed layers have a textured perovskite crystal structure, and wherein the column-like structures have diameters that vary from 1 nm to 10 um with a preference in the range of 10 nm to 500 nm and wherein the length of the columns vary from 1 nm to 500 um with a preference in the range of 10 nm to 10 um.

5. The device of claim 1 wherein the substrate comprises one or more of silicon, Ge, GaAs, $Al_2O_3$, $ZrO_2$, MgO, spinel ($MgAl_2O_4$), Yttria Stabilized Zirconia (YSZ), $ZrO_2$, Cu, Ni, Ti, SOI, stainless steel, quartz, silicate glasses, low expansion glasses, AlN, SiC, $SiN_x$, $Al_2O_3$, $ZrO_2$, metal, such as Cu, Ni, stainless steel, or $SiO_2$, and wherein the substrate further comprises an amorphous coating that does not have a crystal form and provides the base for the growth of Pt crystals; the amorphous coating comprising an amorphous oxide or an amorphous nitride selected from the group of $SiO_2$, $AlO_x$, or $SiO_2/SiN_x/SiO_2$ stacks, silicate glass, $AlO_x$ (1<x<2), $SiN_x$ (1<x<2), SiC, AlN, SiON, $RuO_x$ (1<x<2), $ZrO_x$ (1<x<2), $MgAl_2O_4$.

6. The device of claim 4 wherein the textured layer is deposited onto an amorphous coating, the textured layer having a thickness in the range of 1 to 200 nm, preferably 30 to 50 nm, wherein the textured material is formed from one or more of Ti, Al, Ir, Ru, Mg, Ca, Cr, Fe, Ni, Sr, Ba, Zn, V, Mn, Ce, Co, or Sn, wherein the metals oxidize, fluorinate or form a nitride to form a {100} textured rutile or {0001} textured wurtzite film for a lattice match to the first electrode.

7. The device of claim 4 wherein the textured layer is formed from one of the group of $TiO_2$, $SnO_2$, MgO, CaO, SrO, FeO, ZnO, NiO, CeO, CoO, TiN, AlN, CrN, BN, GaN, $CaF_2$, and wherein in the case of {100} rutile and the case of {0001} wurtzite, the planes lie in the growth plane.

8. The device of claim 4 wherein the textured layer is approximately 1 nm to 300 nm thick and wherein the texture layer is the result of an oxidation anneal and forms a rutile structure which facilitates the formation of a granular structure.

9. The device of claim 4 wherein the first electrode layer has a thickness in the range of 10 to 500 nm, preferably within the range of 30 to 100 nm, and wherein the crystal structure is formed by sputter deposited epitaxy, and wherein the electrode layer material comprises one or more of Pt, Ir, Ru, Pd, Au, Ag, Cu, and preferably has a face-centered-cubic crystal structure and is {111} textured.

10. The device of claim 1 wherein the seed layer is one of a textured oxide having perovskite structure and a thickness in the range of 1 to 200 nm, preferably 20 to 50 nm.

11. The device of claim 1 wherein the seed layer is $PbTiO_3$ and one of rapid ramp and double ramp anneals are performed on each of the $PbTiO_3$ seed layer and the electrode layer, and wherein the $PbTiO_3$ seed layer is formed with excess Pb in the range of between approximately 0% to 20%.

12. The device of claim 1 wherein the seed layer comprises $PbTiO_3$ with excess Pb in the range of between approximately 0% to 20%, and wherein the seed layer is formed by chemical solution deposition, spinning for a predetermined period of time, pyrolizing at a temperature ranging from approximately 300° C. to 450° C., and rapid thermally annealing at a temperature in the range of approximately 600° C. to 700° C.

13. The device of claim 1 wherein the seed layer comprises one of $PbTiO_3$, $(PbLa)TiO_3$, $SrTiO_3$, $BaTiO_3$, $PbNiNbO_3$, $Pb(Zr_xTi_{1-x})O_3$ (0≤x≤1.0), $PbYbNbO_3$, $PbScTaO_3$, and wherein the seed layer is a polycrystalline {001}-textured perovskite seed with RC-FWHM≤10° and wherein the volume of {100}-textured grains is greater than 90% and the volume of {001}/({001}+{100})>80%.

14. The device of claim 1 wherein the at least one ferroelectric layer comprises $Pb(Zr_x Ti_{1-x})O_3$, wherein x is less than or equal to one and wherein the ferroelectric layer comprises a perovskite crystal orientation having a {001} orientation and wherein the {001} planes lie parallel to the growth plane.

15. The device of claim 1 wherein the textured layer comprises titanium deposited at room temperature that is oxygen annealed at a temperature ranging from approximately 600° C. to 800° C., preferably 750° C., to convert the Ti to $TiO_2$, the $TiO_2$ acting as a seed layer for {111} Pt nucleation with a full width half maxima (FWHM) between 1.7°-2.3°.

16. The device of claim 15 wherein the first electrode comprises an approximately 50 nm to 500 nm Pt film deposited at around 500° C. using a sputter deposition process with a substrate heater to produce highly {111} textured Pt providing a $TiO_2$/Pt template for {111} textured PZT film growth.

17. A method of making a piezoelectric device comprising:
providing a substrate;
coating the substrate with an amorphous coating;
growing a crystalline textured layer on the amorphous coating; the textured growth resulting in granular regions;
epitaxially growing a first electrode comprising a thin layer of metallic material having a crystal lattice structure divided into granular regions; the granular regions of the textured layer and the first electrode being in registration;
epitaxially growing a seed layer; the seed layer being epitaxially deposited so as to form a column-like structure on top of the granular regions of the first electrode and textured layer;
epitaxially growing at least one ferroelectric material layer exhibiting spontaneous polarization on the seed layer; the ferroelectric material layer, the seed layer, and first electrode each having granular regions in registration with the preceding granular region; the ferroelectric material growth resulting in a high degree of polarization normal to the growth plane.

18. The method of claim 17 further comprising growing a second electrode on the ferroelectric material layer, the second electrode having a thickness in the range of approximately 10 nm to 500 nm and wherein the second electrode comprises one or more of Pt, Ir, Ru, Pd, Ni, Au, Cu, Ag, $IrO_2$, $RuO_2$, $LaSrCoO_3$, $SrRuO_3$, $LaNiO_3$, $In_xSn_{1-x}O_2$ (0≤x≤1.0).

19. The method of claim 17 wherein the step of epitaxially growing at least one ferroelectric layer comprises maintaining the crystal planes within column-like structure of the ferroelectric material substantially parallel to the growth plane to provide optimum spontaneous polarization perpendicular to the growth plane and wherein the granular regions of the seed layer, at least one ferroelectric layer and first electrode are in registration such that the columns in the ferroelectric layer extend from the granular regions of the seed layer, and the granular regions of the seed layer extend from the granular regions of first electrode, and wherein the crystallographic planes within the granular regions and the column-like structures are substantially planar to the growth plane with a tilt of less than or equal to approximately 10 degrees from the growth plane, and wherein the crystal orientation within the ferroelectric material layer is predominately {001}.

20. A ferroelectric device comprising:
a substrate;
a textured layer;
    a first electrode comprising a thin layer of metallic material having a crystal lattice structure divided into granular regions;
    at least one PZT layer exhibiting spontaneous polarization epitaxially deposited on the first electrode and resulting in a PZT stylo-epitaxy;
    the ferroelectric material layer, and first electrode each having granular regions in which column-like structures form; the granular regions of the ferroelectric material producing a high degree of polarization normal to the growth plane.

21. The device of claim 20 wherein epitaxial depositing of the at least one PZT layer on the first electrode results in a {111} PZT stylo-epitaxy.

22. The device of claim 20 wherein epitaxial depositing of the at least one PZT layer on the first electrode results in a {001} PZT stylo-epitaxy.

* * * * *